United States Patent
Thomas et al.

(10) Patent No.: US 12,165,069 B1
(45) Date of Patent: Dec. 10, 2024

(54) COMPILER FOR OPTIMIZING NUMBER OF CORES USED TO IMPLEMENT NEURAL NETWORK

(71) Applicant: Perceive Corporation, San Jose, CA (US)

(72) Inventors: Brian Thomas, Vancouver (CA); Steven L. Teig, Menlo Park, CA (US)

(73) Assignee: Amazon Technologies, Inc., Seattle, WA (US)

( * ) Notice: Subject to any disclaimer, the term of this patent is extended or adjusted under 35 U.S.C. 154(b) by 1163 days.

(21) Appl. No.: 16/525,445

(22) Filed: Jul. 29, 2019

Related U.S. Application Data

(60) Provisional application No. 62/866,599, filed on Jun. 25, 2019, provisional application No. 62/851,082, filed on May 21, 2019.

(51) Int. Cl.
  *G06N 3/10* (2006.01)
  *G06N 3/04* (2023.01)

(52) U.S. Cl.
  CPC ............. *G06N 3/105* (2013.01); *G06N 3/04* (2013.01)

(58) Field of Classification Search
  None
  See application file for complete search history.

(56) References Cited

U.S. PATENT DOCUMENTS

| | | |
|---|---|---|
| 5,956,703 A | 9/1999 | Turner et al. |
| 8,468,109 B2 * | 6/2013 | Moussa .................. G06N 3/084 706/31 |

(Continued)

FOREIGN PATENT DOCUMENTS

| | | |
|---|---|---|
| CN | 108876698 A | 11/2018 |
| CN | 108280514 B | 10/2020 |

(Continued)

OTHER PUBLICATIONS

Dua, "A mixed-integer programming approach for optimal configuration of artificial neural networks", ElSevier, (2010). (Year: 2010).*
Chen, Tianqi, et al., "TVM: End-to-End Optimization Stack for Deep Learning," Feb. 12, 2018, 19 pages, arXiv:1802.04799v1, Computing Research Repository (CoRR)—Cornell University, Ithaca, NY, USA.

(Continued)

*Primary Examiner* — Alexey Shmatov
*Assistant Examiner* — Beatriz Ramirez Bravo
(74) *Attorney, Agent, or Firm* — K&L Gates LLP

(57) ABSTRACT

Some embodiments provide a compiler for optimizing the implementation of a machine-trained network (e.g., a neural network) on an integrated circuit (IC). The compiler of some embodiments receives a specification of a machine-trained network including multiple layers of computation nodes and generates a graph representing options for implementing the machine-trained network in the IC. In some embodiments, the graph includes nodes representing options for implementing each layer of the machine-trained network and edges between nodes for different layers representing different implementations that are compatible. In some embodiments, the graph is populated according to rules relating to memory use and the numbers of cores necessary to implement a particular layer of the machine trained network such that nodes for a particular layer, in some embodiments, represent fewer than all the possible groupings of sets of clusters.

20 Claims, 34 Drawing Sheets

(56) References Cited

U.S. PATENT DOCUMENTS

| | | |
|---|---|---|
| 9,710,265 B1 | 7/2017 | Temam et al. |
| 9,858,636 B1 | 1/2018 | Lim et al. |
| 10,445,638 B1 | 10/2019 | Amirineni et al. |
| 10,489,478 B2 | 11/2019 | Lim et al. |
| 10,515,303 B2 | 12/2019 | Lie et al. |
| 10,657,438 B2 | 5/2020 | Lie et al. |
| 10,732,943 B2 | 8/2020 | Sun et al. |
| 10,740,434 B1 | 8/2020 | Duong et al. |
| 10,768,856 B1 | 9/2020 | Diamant et al. |
| 10,796,198 B2 | 10/2020 | Franca-Neto |
| 10,817,042 B2 | 10/2020 | Desai et al. |
| 10,853,738 B1 | 12/2020 | Dockendorf et al. |
| 11,023,360 B2 | 6/2021 | Gu et al. |
| 11,132,619 B1 | 9/2021 | Casas et al. |
| 11,138,292 B1 | 10/2021 | Nair et al. |
| 11,423,289 B2 | 8/2022 | Judd et al. |
| 11,468,145 B1 | 10/2022 | Duong et al. |
| 11,615,322 B1 | 3/2023 | Thomas et al. |
| 11,625,585 B1 | 4/2023 | Thomas et al. |
| 11,977,916 B2 | 5/2024 | Kim |
| 2004/0078403 A1 | 4/2004 | Scheuermann et al. |
| 2016/0239706 A1* | 8/2016 | Dijkman .............. G06V 10/454 |
| 2016/0342893 A1 | 11/2016 | Ross et al. |
| 2017/0011006 A1 | 1/2017 | Saber et al. |
| 2017/0011288 A1 | 1/2017 | Brothers et al. |
| 2017/0323196 A1 | 11/2017 | Gibson et al. |
| 2018/0032856 A1* | 2/2018 | Alvarez-Icaza ........ G06N 3/049 |
| 2018/0046458 A1 | 2/2018 | Kuramoto |
| 2018/0046900 A1 | 2/2018 | Dally et al. |
| 2018/0046905 A1 | 2/2018 | Li et al. |
| 2018/0046916 A1 | 2/2018 | Dally et al. |
| 2018/0101763 A1 | 4/2018 | Barnard et al. |
| 2018/0107918 A1* | 4/2018 | Amir ..................... G06N 3/063 |
| 2018/0121196 A1 | 5/2018 | Temam et al. |
| 2018/0121796 A1 | 5/2018 | Deisher et al. |
| 2018/0164866 A1 | 6/2018 | Turakhia et al. |
| 2018/0181406 A1 | 6/2018 | Kuramoto |
| 2018/0189229 A1 | 7/2018 | Desoli et al. |
| 2018/0189638 A1 | 7/2018 | Nurvitadhi et al. |
| 2018/0197068 A1 | 7/2018 | Narayanaswami et al. |
| 2018/0218518 A1 | 8/2018 | Yan et al. |
| 2018/0246855 A1 | 8/2018 | Redfern et al. |
| 2018/0285719 A1 | 10/2018 | Baum et al. |
| 2018/0285727 A1 | 10/2018 | Baum et al. |
| 2018/0285731 A1 | 10/2018 | Heifets et al. |
| 2018/0285736 A1 | 10/2018 | Baum et al. |
| 2018/0293057 A1 | 10/2018 | Sun et al. |
| 2018/0293490 A1 | 10/2018 | Ma et al. |
| 2018/0293493 A1 | 10/2018 | Kalamkar et al. |
| 2018/0293691 A1 | 10/2018 | Nurvitadhi et al. |
| 2018/0300600 A1 | 10/2018 | Ma et al. |
| 2018/0307494 A1 | 10/2018 | Ould-Ahmed-Vall et al. |
| 2018/0307980 A1 | 10/2018 | Barik et al. |
| 2018/0307985 A1 | 10/2018 | Appu et al. |
| 2018/0308202 A1 | 10/2018 | Appu et al. |
| 2018/0314492 A1 | 11/2018 | Fais et al. |
| 2018/0314941 A1 | 11/2018 | Lie et al. |
| 2018/0315158 A1 | 11/2018 | Nurvitadhi et al. |
| 2018/0322386 A1 | 11/2018 | Sridharan et al. |
| 2018/0322387 A1 | 11/2018 | Sridharan et al. |
| 2018/0365794 A1 | 12/2018 | Lee et al. |
| 2018/0373975 A1 | 12/2018 | Yu et al. |
| 2019/0026078 A1 | 1/2019 | Bannon et al. |
| 2019/0026237 A1 | 1/2019 | Talpes et al. |
| 2019/0026249 A1 | 1/2019 | Talpes et al. |
| 2019/0026625 A1* | 1/2019 | Vorenkamp .............. G06N 3/08 |
| 2019/0041961 A1 | 2/2019 | Desai et al. |
| 2019/0042948 A1 | 2/2019 | Lee et al. |
| 2019/0057036 A1* | 2/2019 | Mathuriya ................ G06F 8/41 |
| 2019/0073585 A1 | 3/2019 | Pu et al. |
| 2019/0095776 A1 | 3/2019 | Kfir et al. |
| 2019/0114499 A1 | 4/2019 | Delaye et al. |
| 2019/0130265 A1 | 5/2019 | Ling et al. |
| 2019/0138891 A1 | 5/2019 | Kim et al. |
| 2019/0147338 A1 | 5/2019 | Pau et al. |
| 2019/0156180 A1 | 5/2019 | Nomura et al. |
| 2019/0171927 A1 | 6/2019 | Diril et al. |
| 2019/0179635 A1 | 6/2019 | Jiao et al. |
| 2019/0180167 A1 | 6/2019 | Huang et al. |
| 2019/0187983 A1 | 6/2019 | Ovsiannikov et al. |
| 2019/0196970 A1 | 6/2019 | Han et al. |
| 2019/0205094 A1 | 7/2019 | Diril et al. |
| 2019/0205358 A1* | 7/2019 | Diril ....................... G06F 17/16 |
| 2019/0205736 A1 | 7/2019 | Bleiweiss et al. |
| 2019/0205739 A1* | 7/2019 | Liu ..................... G06F 9/30083 |
| 2019/0205740 A1 | 7/2019 | Judd et al. |
| 2019/0205780 A1 | 7/2019 | Sakaguchi |
| 2019/0228274 A1 | 7/2019 | Georgiadis et al. |
| 2019/0236437 A1 | 8/2019 | Shin et al. |
| 2019/0236445 A1 | 8/2019 | Das et al. |
| 2019/0266479 A1 | 8/2019 | Singh et al. |
| 2019/0286989 A1* | 9/2019 | Wang ........................ G06F 8/20 |
| 2019/0294413 A1 | 9/2019 | Vantrease et al. |
| 2019/0294959 A1 | 9/2019 | Vantrease et al. |
| 2019/0294968 A1 | 9/2019 | Vantrease et al. |
| 2019/0303741 A1 | 10/2019 | Appuswamy et al. |
| 2019/0303749 A1 | 10/2019 | Appuswamy et al. |
| 2019/0303750 A1 | 10/2019 | Kumar et al. |
| 2019/0325296 A1 | 10/2019 | Fowers et al. |
| 2019/0325309 A1 | 10/2019 | Flamant |
| 2019/0325314 A1 | 10/2019 | Bourges-Sevenier et al. |
| 2019/0332925 A1* | 10/2019 | Modha ................... G06N 3/063 |
| 2019/0340500 A1 | 11/2019 | Olmschenk |
| 2019/0347559 A1 | 11/2019 | Kang et al. |
| 2019/0385046 A1 | 12/2019 | Cassidy et al. |
| 2020/0005131 A1 | 1/2020 | Nakahara et al. |
| 2020/0042856 A1* | 2/2020 | Datta ...................... G06N 3/063 |
| 2020/0042859 A1* | 2/2020 | Mappouras ............ G06N 3/084 |
| 2020/0089506 A1 | 3/2020 | Power et al. |
| 2020/0134461 A1* | 4/2020 | Chai ....................... G06N 3/088 |
| 2020/0143226 A1 | 5/2020 | Georgiadis |
| 2020/0151088 A1 | 5/2020 | Gu et al. |
| 2020/0151572 A1 | 5/2020 | Gurumurthi |
| 2020/0210838 A1 | 7/2020 | Lo et al. |
| 2020/0234114 A1 | 7/2020 | Rakshit et al. |
| 2020/0301668 A1 | 9/2020 | Li |
| 2020/0364545 A1 | 11/2020 | Shattil |
| 2020/0380344 A1 | 12/2020 | Lie et al. |
| 2021/0110236 A1 | 4/2021 | Shibata |
| 2021/0173787 A1 | 6/2021 | Nagy et al. |
| 2021/0232897 A1 | 7/2021 | Bichler et al. |
| 2021/0241082 A1 | 8/2021 | Nagy et al. |
| 2022/0004854 A1 | 1/2022 | Lee et al. |
| 2022/0121914 A1 | 4/2022 | Huang et al. |
| 2022/0335562 A1 | 10/2022 | Surti et al. |

FOREIGN PATENT DOCUMENTS

| | | |
|---|---|---|
| GB | 2568086 A | 5/2019 |
| WO | 2020044527 A1 | 3/2020 |

OTHER PUBLICATIONS

Sen, Sanchari, et al., "Sparce: Sparsity aware General Purpose Core Extensions to Accelerate Deep Neural Networks," Nov. 29, 2017, 13 pages, arXiv:1711.06315v2, Computer Research Repository (CoRR)—Cornell University, Ithaca, NY, USA.

Andri, Renzo, et al., "YodaNN: An Architecture for Ultra-Low Power Binary-Weight CNN Acceleration," IEEE Transactions on Computer-Aided Design of Integrated Circuits and Systems, Mar. 14, 2017, 14 pages, IEEE, New York, NY, USA.

Ardakani, Arash, et al., "Sparsely-Connected Neural Networks: Towards Efficient VLSI Implementation of Deep Neural Networks," Proceedings of the 5th International Conference on Learning Representations (ICLR 2017), Apr. 24-26, 2017, 14 pages, ICLR, Toulon, France.

Bagherinezhad, Hessam, et al., "LCNN: Look-up Based Convolutional Neural Network," Proceedings of 2017 IEEE Conference on Computer Vision and Pattern Recognition (CVPR 2017), Jul. 21-26, 2017, 10 pages, IEEE, Honolulu, HI, USA.

Bang, Suyoung, et al., "A 288 μW Programmable Deep-Learning Processor with 270KB On-Chip Weight Storage Using Non-

(56) References Cited

OTHER PUBLICATIONS

Uniform Memory Hierarchy for Mobile Intelligence," Proceedings of 2017 IEEE International Solid-State Circuits Conference (ISSCC 2017), Feb. 5-7, 2017, 3 pages, IEEE, San Francisco, CA, USA.
Bong, Kyeongryeol, et al., "A 0.62mW Ultra-Low-Power Convolutional-Neural-Network Face-Recognition Processor and a CIS Integrated with Always-On Haar-Like Face Detector," Proceedings of 2017 IEEE International Solid-State Circuits Conference (ISSCC 2017), Feb. 5-7, 2017, 3 pages, IEEE, San Francisco, CA, USA.
Chen, Yu-Hsin, et al., "Eyeriss: A Spatial Architecture for Energy-Efficient Dataflow for Convolutional Neural Networks," Proceedings of 2016 ACM/IEEE 43rd Annual International Symposium on Computer Architecture (ISCA 2016), Jun. 18-22, 2016, 13 pages, IEEE, Seoul, South Korea.
Chen, Yu-Hsin, et al., "Using Dataflow to Optimize Energy Efficiency of Deep Neural Network Accelerators," IEEE Micro, Jun. 14, 2017, 10 pages, vol. 37, Issue 3, IEEE, New York, NY, USA.
Cho, Minsik, et al., "MEC: Memory-Efficient Convolution for Deep Neural Network," Jun. 21, 2017, 10 pages, arXiv:1706.06873v1, Computer Research Repository (CoRR)—Cornell University, Ithaca, NY, USA.
Courbariaux, Matthieu, et al., "Binarized Neural Networks: Training Neural Networks with Weights and Activations Constrained to +1 or −1," Mar. 17, 2016, 11 pages, arXiv:1602.02830v3, Computing Research Repository (CoRR)—Cornell University, Ithaca, NY, USA.
Courbariaux, Matthieu, et al., "BinaryConnect: Training Deep Neural Networks with Binary Weights during Propagations," Proceedings of the 28th International Conference on Neural Information Processing Systems (NIPS 15), Dec. 7-12, 2015, 9 pages, MIT Press, Montreal, Canada.
Emer, Joel, et al., "Hardware Architectures for Deep Neural Networks," CICS/MTL Tutorial, Mar. 27, 2017, 258 pages, Massachusetts Institute of Technology, Cambridge, MA, USA, retrieved from http://www.rle.mit.edu/eems/wp-content/uploads/2017/03/Tutorial-on-DNN-CICS-MTL.pdf.
Fu, Yao, et al., "Embedded Vision with INT8 Optimization on Xilinx Devices," WP490 (v1.0.1), Apr. 19, 2017, 15 pages, Xilinx, Inc., San Jose, CA, USA.
Gao, Mingyu, et al., "Tetris: Scalable and Efficient Neural Network Acceleration with 3D Memory," Proceedings of the 22nd International Conference on Architectural Support for Programming Languages and Operating Systems (ASPLOS '17), Apr. 8-12, 2017, 14 pages, ACM, Xi'an, China.
Guo, Yiwen, et al., "Network Sketching: Exploring Binary Structure in Deep CNNs," 2017 IEEE Conference on Computer Vision and Pattern Recognition (CVPR 2017), Jul. 21-26, 2017, 9 pages, IEEE, Honolulu, HI.
Hanlon, Jamie, "Why is so Much Memory Needed for Deep Neural Networks?," Jan. 31, 2017, 6 pages, Graphcore, Bristol, United Kingdom, retrieved from https://www.graphcore.ai/posts/why-is-so-much-memory-needed-for-deep-neural-networks.
He, Zhezhi, et al., "Optimize Deep Convolutional Neural Network with Ternarized Weights and High Accuracy," Jul. 20, 2018, 8 pages, arXiv:1807.07948v1, Computing Research Repository (CoRR)—Cornell University, Ithaca, NY, USA.
Hegde, Kartik, et al., "UCNN: Exploiting Computational Reuse in Deep Neural Networks via Weight Repetition," Proceedings of the 45th Annual International Symposium on Computer Architecture (ISCA '18), Jun. 2-6, 2018, 14 pages, IEEE Press, Los Angeles, CA, USA.
Horowitz, Mark, "Computing's Energy Problem (and what can we do about it)," 2014 IEEE International Solid-State Circuits Conference (ISSCC 2014), Feb. 9-13, 2014, 5 pages, IEEE, San Francisco, CA, USA.
Huan, Yuxiang, et al., "A Low-Power Accelerator for Deep Neural Networks with Enlarged Near-Zero Sparsity," May 22, 2017, 5 pages, arXiv:1705.08009v1, Computer Research Repository (CoRR)—Cornell University, Ithaca, NY, USA.

Jeon, Dongsuk, et al., "A 23-mW Face Recognition Processor with Mostly-Read 5T Memory in 40-nm CMOS," IEEE Journal on Solid-State Circuits, Jun. 2017, 15 pages, vol. 52, No. 6, IEEE, New York, NY, USA.
Jouppi, Norman, P., et al., "In-Datacenter Performance Analysis of a Tensor Processing Unit," Proceedings of the 44th Annual International Symposium on Computer Architecture (ISCA '17), Jun. 24-28, 2017, 17 pages, ACM, Toronto, ON, Canada.
Judd, Patrick, et al., "Cnvlutin2: Ineffectual-Activation-and-Weight-Free Deep Neural Network Computing," Apr. 29, 2017, 6 pages, arXiv:1705.00125v1, Computer Research Repository (CoRR)—Cornell University, Ithaca, NY, USA.
Leng, Cong, et al., "Extremely Low Bit Neural Network: Squeeze the Last Bit Out with ADMM," Proceedings of 32nd AAAI Conference on Artificial Intelligence (AAAI-18), Feb. 2-7, 2018, 16 pages, Association for the Advancement of Artificial Intelligence, New Orleans, LA, USA.
Li, Fengfu, et al., "Ternary Weight Networks," May 16, 2016, 9 pages, arXiv:1605.04711v1, Computing Research Repository (CoRR)—Cornell University, Ithaca, NY, USA.
Merolla, Paul, et al., "Deep Neural Networks are Robust to Weight Binarization and Other Non-linear Distortions," Jun. 7, 2016, 10 pages, arXiv:1606.01981v1, Computing Research Repository (CoRR)—Cornell University, Ithaca, NY, USA.
Moons, Bert, et al., "Envision: A 0.26-to-10TOPS/W Subword-Parallel Dynamic-Voltage-Accuracy-Frequency-Scalable Convolutional Neural Network Processor in 28nm FDSOI," Proceedings of 2017 IEEE International Solid-State Circuits Conference (ISSCC 2017), Feb. 5-7, 2017, 3 pages, IEEE, San Francisco, CA, USA.
Moshovos, Andreas, et al., "Exploiting Typical Values to Accelerate Deep Learning," Computer, May 24, 2018, 13 pages, vol. 51—Issue 5, IEEE Computer Society, Washington, D.C.
Non-Published Commonly Owned U.S. Appl. No. 16/525,449, filed Jul. 29, 2019, 106 pages, Perceive Corporation.
Non-Published Commonly Owned U.S. Appl. No. 16/525,456, filed Jul. 29, 2019, 106 pages, Perceive Corporation.
Non-Published Commonly Owned U.S. Appl. No. 16/525,460, filed Jul. 29, 2019, 104 pages, Perceive Corporation.
Non-Published Commonly Owned U.S. Appl. No. 16/525,466, filed Jul. 29, 2019, 105 pages, Perceive Corporation.
Non-Published Commonly Owned U.S. Appl. No. 16/525,469, filed Jul. 29, 2019, 105 pages, Perceive Corporation.
Park, Jongsoo, et al., "Faster CNNs with Direct Sparse Convolutions and Guided Pruning," Jul. 28, 2017, 12 pages, arXiv:1608.01409v5, Computer Research Repository (CoRR)—Cornell University, Ithaca, NY, USA.
Pedram, Ardavan, et al., "Dark Memory and Accelerator-Rich System Optimization in the Dark Silicon Era," Apr. 27, 2016, 8 pages, arXiv:1602.04183v3, Computer Research Repository (CoRR)—Cornell University, Ithaca, NY, USA.
Rastegari, Mohammad, et al., "XNOR-Net: ImageNet Classification Using Binary Convolutional Neural Networks," Proceedings of 2016 European Conference on Computer Vision (ECCV '16), Oct. 8-16, 2016, 17 pages, Lecture Notes in Computer Science, vol. 9908, Springer, Cham, Amsterdam, Netherlands.
Ren, Mengye, et al., "SBNet: Sparse Blocks Network for Fast Inference," Jan. 7, 2018, 10 pages, arXiv:1801.02108v1, Computer Research Repository (CoRR)—Cornell University, Ithaca, NY, USA.
Rutenbar, Rob A., et al., "Hardware Inference Accelerators for Machine Learning," 2016 IEEE International Test Conference (ITC), Nov. 15-17, 2016, 39 pages, IEEE, Fort Worth, TX, USA.
Shayer, Oran, et al., "Learning Discrete Weights Using the Local Reparameterization Trick," Proceedings of 6th International Conference on Learning Representations (ICLR 2018), Apr. 30-May 3, 2018, 12 pages, ICLR, Vancouver, BC, Canada.
Shin, Dongjoo, et al., "DNPU: An 8.1TOPS/W Reconfigurable CNN-RNN Processor for General-Purpose Deep Neural Networks," Proceedings of 2017 IEEE International Solid-State Circuits Conference (ISSCC 2017), Feb. 5-7, 2017, 3 pages, IEEE, San Francisco, CA, USA.
Sim, Jaehyeong, et al., "A 1.42TOPS/W Deep Convolutional Neural Network Recognition Processor for Intelligent IoE Systems," Pro-

(56) References Cited

OTHER PUBLICATIONS ceedings of 2016 IEEE International Solid-State Circuits Conference (ISSCC 2016), Jan. 31-Feb. 4, 2016, 3 pages, IEEE, San Francisco, CA, USA.

Sze, Vivienne, et al., "Efficient Processing of Deep Neural Networks: A Tutorial and Survey," Aug. 13, 2017, 32 pages, arXiv:1703.09039v2, Computer Research Repository (CoRR)—Cornell University, Ithaca, NY, USA.

Wang, Min, et al., "Factorized Convolutional Neural Networks," 2017 IEEE International Conference on Computer Vision Workshops (ICCVW '17), Oct. 22-29, 2017, 9 pages, IEEE, Venice, Italy.

Wen, Wei, et al., "Learning Structured Sparsity in Deep Neural Networks," Oct. 18, 2016, 10 pages, arXiv:1608.03665v4, Computer Research Repository (CoRR)—Cornell University, Ithaca, NY, USA.

Yang, Tien-Ju, et al., "Designing Energy-Efficient Convolutional Neural Networks using Energy-Aware Pruning," Apr. 18, 2017, 9 pages, arXiv:1611.05128v4, Computer Research Repository (CoRR)—Cornell University, Ithaca, NY, USA.

Yang, Xuan, et al., "DNN Dataflow Choice Is Overrated," Sep. 10, 2018, 13 pages, arXiv:1809.04070v1, Computer Research Repository (CoRR)—Cornell University, Ithaca, NY, USA.

Zhang, Shijin, et al., "Cambricon-X: An Accelerator for Sparse Neural Networks," 2016 49th Annual IEEE/ACM International Symposium on Microarchitecture (MICRO '16), Oct. 15-19, 2016, 12 pages, IEEE, Taipei, Taiwan.

Zhu, Chenzhuo, et al., "Trained Ternary Quantization," Dec. 4, 2016, 9 pages, arXiv:1612.01064v1, Computing Research Repository (CoRR)—Cornell University, Ithaca, NY, USA.

Achterhold, Jan, et al., "Variational Network Quantization," Proceedings of 6th International Conference on Learning Representations (ICLR 2018), Apr. 30-May 3, 2018, 18 pages, ICLR, Vancouver, BC, Canada.

Chen, Tianqi, et al., "TVM: An Automated End-to-End Optimizing Compiler for Deep Learning," Proceedings of the 13th USENIX Symposium on Operating Systems Design and Implementation (OSDI '18), Oct. 8-10, 2018, 17 pages, USENIX Association, Carlsbad, CA, US.

Ardakani, Arash, et al., "An Architecture to Accelerate Convolution in Deep Neural Networks," IEEE Transactions on Circuits and Systems I: Regular Papers, Oct. 17, 2017, 14 pages, vol. 65, No. 4, IEEE.

Wang, Peiqi, et al., "SNrram: An Efficient Sparse Neural Network Computation Architecture Based on Resistive Random-Access Memory," DAC '18, Jun. 24-29, 2018, 7 pages, ACM, San Francisco, CA, USA.

Abtahi, Tahmid, et al., "Accelerating Convolutional Neural Network With FFT on Embedded Hardware," IEEE Transactions on Very Large Scale Integration (VLSI) Systems, Sep. 2018, 14 pages, vol. 26, No. 9, IEEE.

Han, Song, "Efficient Methods and Hardware for Deep Learning," Sep. 217, 125 pages, Stanford University, Palo Alto, CA, USA.

He, Yang, et al., "Soft Filter Pruning for Accelerating Deep Convolutional Neural Networks," Aug. 21, 2018, 8 pages, retrieved from https://arxiv.org/abs/1808.06866.

Hu, Yiming, et al., "A Novel Channel Pruning Method for Deep Neural Network Compression," May 29, 2018, 10 pages, retrieved from https://arxiv.org/abs/1805.11394.

Liu, Shaoli, et al., "Cambricon: An Instruction Set Architecture for Neural Networks," 2016 ACM/IEEE 43rd Annual International Symposium on Computer Architecture, Jun. 18-22, 2016, 13 pages, IEEE, Seoul, South Korea.

Molchanov, Pavlo, et al., "Pruning Convolutional Neural Networks for Resource Efficient Inference," Jun. 8, 2017, 17 pages, retrieved from https://arxiv.org/abs/1611.06440.

\* cited by examiner 2301 (Layer 2 execution)

2302 (Layer 3 execution)

2303 (Layer 4 execution)

*Figure 27*

| PDPCC | Default assignment of Channels 2710 | Rearranged Assignment of Channels 2720 |
|---|---|---|
| Core 1 | 0-15 | 0-8, 12-18 |
| Core 2 | 16-31 | 9-11, 19-31 |
| Core 3 | 32-47 | 32-47 |
| Core 4 | 48-63 | 48-63 |

COMPILER FOR OPTIMIZING NUMBER OF CORES USED TO IMPLEMENT NEURAL NETWORK

BACKGROUND

When generating configuration data for implementing a trained neural network on an integrated circuit there are many options for implementing each layer of the neural network. Many of these possible configuration options introduce significant latency or power consumption compared to other options. In some case this may be due to having to run additional clock cycles to perform calculations or by maintaining power to unnecessary components. A compiler is needed that can generate optimized configurations that take advantage of time- and power-saving features of an integrated circuit for implementing a machine-trained network (e.g., a neural network).

BRIEF SUMMARY

Some embodiments provide a compiler for optimizing the implementation of a machine-trained network (e.g., a neural network) on an integrated circuit (IC). Before discussing the compiler, some details of an IC for which the compiler performs the optimization are discussed.

The IC of some embodiments includes a set of input processing circuits, a neural network computation fabric (also referred to as a neural network inference circuit) that can be configured to apply a neural network to a set of input values, and a microprocessor (e.g., for controlling the input processing circuits and configuring the neural network computation fabric). The neural network computation fabric of some embodiments includes (i) a set of cores that compute dot products of input values and corresponding weight values and (ii) a channel that aggregates these dot products and performs post-processing operations (as well as performs other operations), in order to compute the outputs of neural network computation nodes.

In some embodiments, at startup of the IC, the microprocessor loads neural network configuration data (e.g., weight values, scale and bias parameters, etc.) from off-chip storage and generates instructions for the neural network computation fabric to write the neural network parameters to memory. In addition, microprocessor loads the neural network program instructions for the computation fabric to its own memory. These instructions are applied by the computation fabric to input data (e.g., images, audio clips, etc.) in order to execute the neural network. The instructions include, e.g., the memory locations to which input values are written, configuration data specifying how to compute specific neural network nodes, etc. Upon receiving input data (e.g., from a sensor on a device that incorporates the IC), the microprocessor provides neural network program instructions to the computation fabric. Once the final output of the neural network is computed, the fabric provides this output back to the microprocessor, so that the microprocessor (or other circuitry on the device) can evaluate this output and perform any actions based on the output.

The microprocessor executes a controller, in some embodiments, that provides the neural network instructions to the computation fabric. Some embodiments provide these instructions to the computation fabric incrementally. For instance, in some embodiments, the system controller on the microprocessor initially loads the instructions for the first layer (or a first portion of the first layer) of the neural network, then waits for a signal from the fabric indicating that these instructions have been completed. Once the first portion of the network is completed by the fabric, the system controller provides the fabric with the instructions for the second portion (either a second portion of the first layer, or the second layer of the network), and so on until the network has been fully executed.

As mentioned, the neural network computation fabric includes numerous cores as well as a global channel that connects the cores, with the various data processing circuits configured by the hierarchical set of control circuits. These data processing circuits operate to compute neural network operations in an efficient, low-power manner, according to the configuration data provided by the control circuits.

A typical neural network operates in layers, with each layer including numerous nodes. Examples of neural networks include feed-forward neural networks, regulatory feedback networks, radial basis function networks, recurrent networks, etc. In convolutional neural networks (a type of feed-forward network), a majority of the layers include computation nodes with both a linear function followed by a non-linear activation function (applied to the result of the linear function). The linear function is a dot product of input values (either the initial inputs based on the input data for the first layer, or outputs of the previous layer for subsequent layers) and predetermined (trained) weight values, along with bias (addition) and scale (multiplication) terms, which are also predetermined based on training. As such, for convolutional neural networks, the dot products are the primary computation that uses the most circuit resources.

The neural network computation circuit of some embodiments computes numerous neural network nodes simultaneously, with the computation for one node spread across multiple cores (and subsequently the global channel). That is, each of several cores of the computation fabric computes a partial dot product from a subset of the input values and weight values for the node. In some embodiments, a set of input values are used as the input to multiple nodes in a layer, so a core simultaneously computes the dot products of these input values with multiple sets of weight values. Similarly, a set of weight values (referred to as a filter, or filter slice when that filter is divided across multiple cores) are used as the weights for numerous nodes with different sets of input values, so in some embodiments the cores load sets of weight values once and then compute dot products of these weight values with numerous different sets of input values.

For a dot product computed across more than one core, these multiple cores compute partial dot products and provide these partial dot products to the global channel. In the simplest case, all of the partial dot products for a given computation node are computed in the same clock cycle and provided at the same time to the global channel. In some cases, however (e.g., for dot products with a very large number of terms), each core computes more than one partial dot product, requiring multiple clock cycles. Based on configuration data specifying which outputs from the cores are to be added together (and whether multiple partial dot products are required from the same core), the global channel aggregates these partial dot products to compute the complete dot product for each node, then applies various post-processing functions (e.g., the bias, scale, and non-linear activation functions) to compute the output of each node.

In some embodiments, each segment of the global channel includes (in addition to the cluster controllers) a dot product bus, a set of post-processing circuits, and an output bus. The dot product bus, in some embodiments, includes a number of independent dot product bus lanes that each receives partial dot products from the cores, aggregates these dot products together, and provides the aggregated dot products to the post-processing circuits. In some embodiments, configuration data from the cluster controllers specifies to which post-processing unit each aggregated dot product is sent. Each lane of the dot product bus spans all of the channel segments, each of which aggregates the partial dot products from its own cores. These aggregated values are then aggregated together by additional circuits of the dot product bus lane, and configuration data specifies whether to pass the aggregated dot products in one direction of the segment or the other, or whether that segment is the final aggregator for the dot product (in which case that aggregated dot product is provided to a post-processing unit in that segment).

In some embodiments, each segment includes the same number of post-processing units as dot product bus lanes, with each post-processing unit receiving the output of a different dot product bus lane as its primary input. The post-processing units, as mentioned, perform the non-dot product functions of the neural network nodes. For a typical computation node of a convolutional (or fully-connected) layer, this includes a bias factor, a scaling factor, and a non-linear activation function. In some embodiments, the outputs of the linear function are quantized or truncated to a particular number of bits (e.g., 4 bits). Using a small, fixed number of bits for the outputs of each computation node allows for (i) power and resource savings by enabling smaller computations and (ii) certainty in the scheduling of computations (i.e., by knowing that all input values will be within a particular range) that enables further power and resource savings in design.

The output bus carries the computation node outputs from the post-processing units back to the cores, to be stored in the memory of the core and used as inputs for the next layer of neural network computation nodes. In some embodiments, the output values may be computed by post-processing units in one cluster but carried to a core in another cluster to be stored. For efficiency, the compiler of some embodiments (a software program that generates the configuration data for enabling the IC to execute a particular neural network) attempts to optimize the location of the post-processing unit for each computation node output relative to the cores used to compute the constituent partial dot products for that computation node and the destination core for the output value.

As mentioned, the cores compute partial dot products in parallel that are provided to the dot product bus of the local channel segment. In some embodiments, the cores include memory that stores the weight values and input values, an input buffer into which input values are loaded for the partial dot product computations, a set of weight value buffers into which weight values are loaded for the partial dot product computations, a controller or set of controller circuits for loading the input values and weight values from memory into the respective buffers, and a set of partial dot product computation circuits. In some embodiments, the memory comprises multiple memory units among which the weight values and input (e.g., activation) values are stored. For example, a first memory unit may store weights for first and second layers, a second memory unit may store inputs for a first layer, and a third memory unit may store the output of the first layer as the input for a second layer.

In some embodiments, the number of partial dot product computation circuits in each core is equal to (i) the number of weight value buffers in the core (or half of the number of weight value buffers, if primary and secondary buffers are used), (ii) the number of independent lanes of the dot product bus, and (iii) the number of post-processing units of each segment of the global channel. Thus, for a typical neural network computation node, the partial dot products computed by the partial dot product computation circuits having a particular index are aggregated by the dot product bus lane with the same index and that aggregated dot product is provided for post-processing to one of the post-processing units with the same index (i.e., the post-processing unit with that index in one of the channel segments).

As mentioned, each core includes one input value buffer and numerous weight value buffers in some embodiments. In convolutional neural networks, a set of input values are used as the inputs to a number of different nodes, and each layer has numerous different filters (sets of weight values). For parallelization within the cores, such a set of input values are loaded into the input value buffers of the cores used to compute the dot product for a node (by computing partial dot products that are then aggregated), while the weight values for each of these different nodes are loaded into the weight value buffers (for a node computed across multiple cores, the weight values for a given node are loaded into the weight value buffers with the same index in each of the cores). The partial dot product computation circuits corresponding to these weight value buffers then simultaneously compute the partial dot product computations for the loaded input values.

In some embodiments, the weight values for each layer of the network are ternary values (e.g., each weight is either zero, a positive value, or the negation of the positive value), with at least a fixed percentage (e.g., 75%) of the weight values being zero. Using ternary weight values allows for the weights to be treated as $\{0, 1, -1\}$ (with a potential multiplication by the actual positive weight value in the post-processor), such that the multiplication of each input value by its weight value can be handled with a simple circuit that avoids actual multiplier circuits. The remainder of the partial dot product computation in a core can then be computed with an adder tree. The sparsity requirement allows for some embodiments to reduce the size of the partial dot product computation circuits by mapping each of a first number (e.g., 144) input values to a second number (e.g., 36) of dot product inputs, such that each input value with a non-zero corresponding weight value is mapped to a different one of the dot product inputs.

Specifically, in some embodiments, the partial dot product computation circuits include at least two sets of wires for each input value, with each of the sets of wires for a given input value providing that input value to two different dot product inputs. With a guarantee of at least 75% weight sparsity (i.e., at least 75% of the weight values for any set of input values are zero), the number of dot product inputs is set at 25% (or slightly more than 25%, for redundancy) of the number of input values provided to the circuit. In some embodiments, the weight sparsity is guaranteed by the training algorithm used to train the weights to perform a specific purpose, and the neural network computation circuit is adaptable for any set of weights that meets the guarantee. In some cases, individual partial dot product computations will not meet the sparsity requirement, and solutions for handling these situations are described in related U.S. patent application Ser. No. 16/212,643, filed Dec. 6, 2018, now issued as U.S. Pat. No. 11,250,326, which is incorporated herein by reference.

The compiler, in some embodiments, is a software application that is responsible for receiving a trained neural network and converting that network into instructions for loading the weight values onto the neural network computation circuit and instructions for the circuit to execute. The compiler assigns each layer to a particular number of cores, assigns the different filter slices to different weight value buffer/partial dot product computation circuit/dot product bus lane/post-processing unit indices, specifies which segment will perform post-processing on each output value, etc. Because the computations of a previously-trained network are not dynamic (that is, the computations performed are not dependent on the results of previous computations), the entire execution of a network can be statically scheduled by the compiler.

The compiler of some embodiments receives a specification of a machine-trained network including multiple layers of computation nodes and generates a graph representing options for implementing the machine-trained network in the IC. In some embodiments, the graph includes nodes representing options for implementing each layer of the machine-trained network and edges between nodes for different layers representing different implementations that are compatible. In some embodiments, each node represents an implementation using a certain set of clusters (and cores of the clusters). In some embodiments, the graph is populated according to rules relating to memory use and the numbers of cores necessary to implement a particular layer of the machine trained network such that nodes for a particular layer, in some embodiments, represent fewer than all the possible groupings of sets of clusters (e.g., only having nodes corresponding to using 2 or more clusters, or nodes corresponding to using only one cluster). Similarly, graphs for some machine-trained networks include nodes of a first layer that do not have edges connected to every node of a subsequent layer (e.g., a node representing using two clusters for a first layer may not connect to a node of a next layer that uses the same two clusters if reading and writing operations cannot be performed simultaneously).

The compiler, as part of generating the graph, in some embodiments, determines whether any set of channels contains no non-zero values (i.e., contains only zero values). For sets of channels that include no non-zero values, some embodiments perform a zero channel removal operation to remove all-zero channels wherever possible. In some embodiments, zero channel removal operations include removing input channels, removing output channels, forward propagation, and backward propagation of channels and constants. Reducing the number of channels and outputs results in conservation of power, as removal of the all-zero channels reduces the amount of calculation circuitry used for a given layer.

The generated graph is then used to select at least one optimized path through the graph. Configuration data including instructions for loading the weight values onto the neural network computation circuit and instructions for the circuit to execute are generated based on the at least one optimized path through the graph. In some embodiments, the compiler selects multiple paths through the graph that represent optimizations for different characteristics (e.g., speed, power consumption, memory use, or power consumption while maintaining a certain speed). Values associated with each edge and node of the graph are used in some embodiments to perform the optimization. In some embodiments, the optimization is performed by casting the optimization problem as a mixed integer problem.

In addition to optimizing the number of clusters and cores used to implement a machine-trained network, a compiler of some embodiments, also optimizes memory storage. In some embodiments, memory storage is optimized such that input and output layers of a single layer are not stored in a same memory unit. Such an optimization, in some embodiments, avoids attempting to read and write from a same memory unit within a core in a single clock cycle. In some embodiments, each core stores data for each layer at a same memory location (i.e., a same memory unit and a same location in the memory unit).

In some embodiments, the compiler also generates instructions for gating operations. Gating operations, in some embodiments, include gating at multiple levels (e.g., gating of clusters, cores, or memory units). Gating operations conserve power in some embodiments by gating signals so that they do not reach the gated element or so that they are not propagated within the gated element. In some embodiments, a clock signal is gated such that a register that transmits data on a rising (or falling) edge of a clock signal is not triggered.

The compiler of some embodiments is also responsible for generating instructions relating to shutting down (and waking up) memory units of cores. In some embodiments, the memory units to shutdown are determined by the compiler based on the data that is stored or will be stored in the particular memory units. For example, a memory unit that stores input data for a first layer of the machine-trained network and will not be used for a specific period of time (e.g., a threshold number of (1) clock cycles or (2) milliseconds) may be shut down after loading the data for the computations associated with the first layer until it is woken up to be used for a subsequent layer. Shutting down a memory unit, in some embodiments, causes the data stored in the memory unit to be lost and requires a number of cycles (e.g., 100 cycles) to be reversed.

As discussed above, each cluster is limited in the number of non-zero values that can be provided to the dot-product calculation circuitry. In some embodiments, the compiler determines whether sparsity requirements of channels implemented on the individual cores are met on each core. If the sparsity requirement is not met, the compiler, in some embodiments, determines whether the channels of the filter can be rearranged to meet the sparsity requirements on each core and, based on the determination, either rearranges the filter channels or implements a solution to non-sparsity as discussed in related patent U.S. patent application Ser. No. 16/212,643, filed Dec. 6, 2018, which is incorporated herein by reference.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

FIG. 27 illustrates a set of assignments of channels of a filter to partial dot product computation circuits of a core using a naïve distribution of channels, a first rearranged assignment, and a second rearranged assignment.

DETAILED DESCRIPTION

Some embodiments provide a compiler for optimizing the implementation of a machine-trained network (e.g., a neural network) on an integrated circuit (IC). Before discussing the compiler, some details of an IC for which the compiler performs the optimization are discussed.

The IC of some embodiments includes a set of input processing circuits, a neural network computation fabric (also referred to as a neural network inference circuit) that can be configured to apply a neural network to a set of input values, and a microprocessor (e.g., for controlling the input processing circuits and configuring the neural network computation fabric). The neural network computation fabric of some embodiments includes (i) a set of cores that compute dot products of input values and corresponding weight values and (ii) a channel that aggregates these dot products and performs post-processing operations (as well as performs other operations), in order to compute the outputs of neural network computation nodes.

Figure 1:
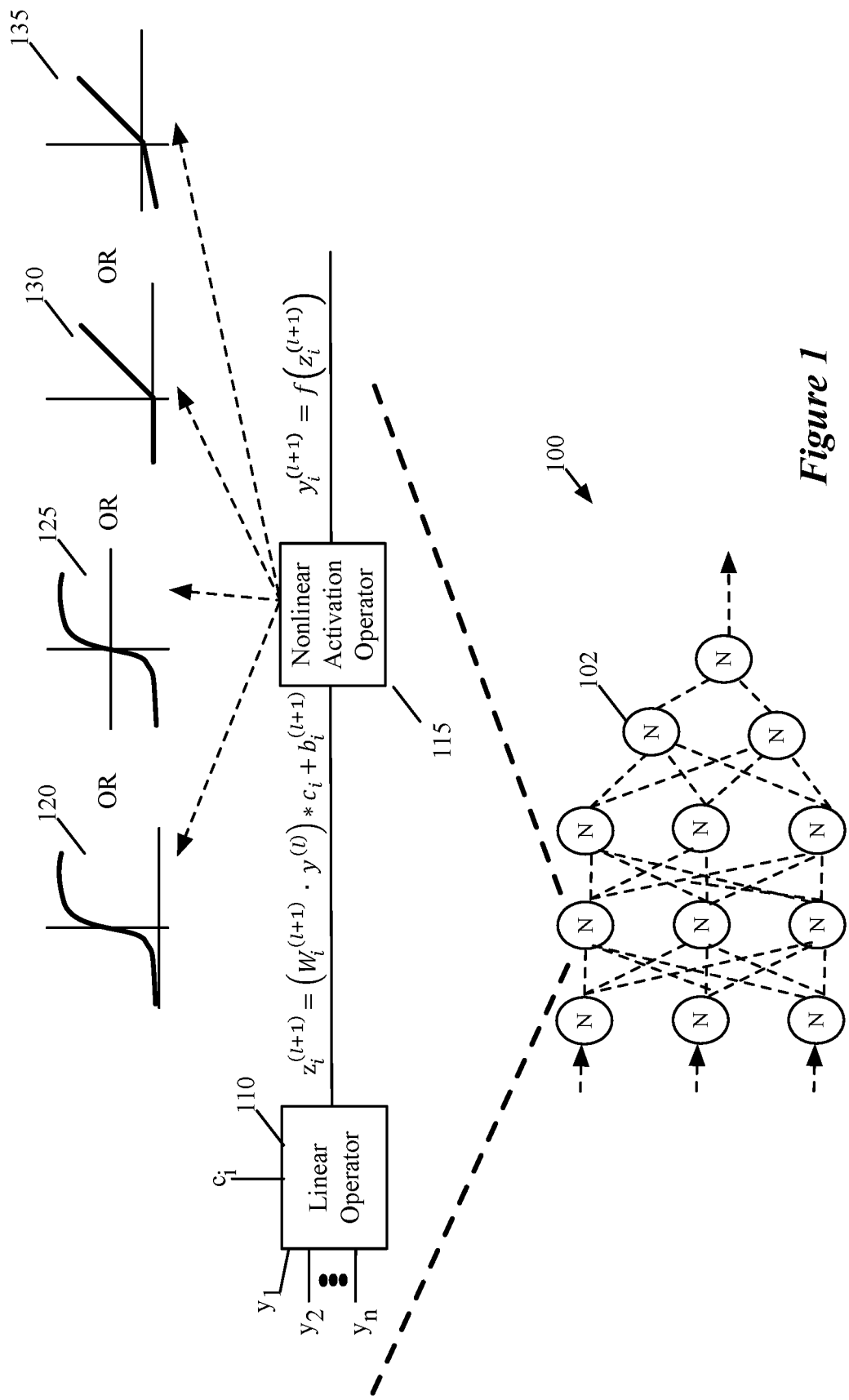
FIG. 1 illustrates an example of a multi-layer machine-trained network of some embodiments.

FIG. 1 illustrates an example of a multi-layer machine-trained network of some embodiments. This figure illustrates a feed-forward neural network 100 that has multiple layers of processing nodes 102 (also called neurons). In all but the first (input) and last (output) layer, each node 102 receives two or more outputs of nodes from earlier processing node layers and provides its output to one or more nodes in subsequent layers. The output of the node (or nodes) in the last layer represents the output of the network 100. In different embodiments, the output of the network 100 is a number in a range of values (e.g., 0 to 1), a vector representing a point in an N-dimensional space (e.g., a 128-dimensional vector), or a value representing one of a predefined set of categories (e.g., for a network that classifies each input into one of eight possible outputs, the output could be a three-bit value).

In this example, the neural network 100 only has one output node. Other neural networks of other embodiments have several output nodes that provide more than one output value. Furthermore, while the network 100 includes only a few nodes 102 per layer, a typical neural network may include a varying number of nodes per layer (with some layers having several thousand nodes) and significantly more layers than shown (e.g., several dozen layers). In addition, the neural networks of other embodiments may be types of networks other than feed forward networks (e.g., recurrent networks, regulatory feedback networks, radial basis function networks, etc.).

The illustrated network 100 is a fully-connected network in which each node in a particular layer receives as inputs all of the outputs from the previous layer. However, the neural networks of some embodiments are convolutional feed-forward neural networks. In this case, the intermediate layers (referred to as "hidden" layers) may include convolutional layers, pooling layers, fully-connected layers, and normalization layers. The convolutional layers of some embodiments use a small kernel (e.g., 3×3×3) to process each tile of pixels in an image with the same set of parameters. The kernels (also referred to as filters) are three-dimensional, and multiple kernels are used to process each group of input values in in a layer (resulting in a three-dimensional output). Pooling layers combine the outputs of clusters of nodes from one layer into a single node at the next layer, as part of the process of reducing an image (which may have a large number of pixels) or other input item down to a single output (e.g., a vector output). In some embodiments, pooling layers can use max pooling (in which the maximum value among the clusters of node outputs is selected) or average pooling (in which the clusters of node outputs are averaged).

As shown in FIG. 1, each node in the neural network 100 has a linear component 110 and a nonlinear component 115. The linear component 110 of each hidden or output node in this example computes a dot product of a vector of weight coefficients and a vector of output values of prior nodes, plus an offset. In other words, a hidden or output node's linear operator computes a weighted sum of its inputs (which are outputs of the previous layer of nodes) plus an offset (also referred to as a bias). Similarly, the linear component 110 of each input node of some embodiments computes a dot product of a vector of weight coefficients and a vector of input values, plus an offset. In other embodiments, each input node receives a single input and passes that input as its output. Each node's nonlinear component 115 computes a function based on the output of the node's linear component 110. This function is commonly referred to as the activation function, and the outputs of the node (which are then used as inputs to the next layer of nodes) are referred to as activations.

The notation of FIG. 1 can be described as follows. Consider a neural network with L hidden layers (i.e., L layers that are not the input layer or the output layer). The variable l can be any of the hidden layers (i.e., l ∈ {1, . . . , L−1} index the hidden layers of the network, with l=0 representing the input layer and l=L representing the output layer). The variable $z_i^{(l+1)}$ represents the output of the linear component of a hidden node i in layer l+1. As indicated by the following Equation (A), the variable $z_i^{(l+1)}$ is computed as the dot product of a vector of weight values $W_i^{(l+1)}$ and a vector of outputs $y^{(l)}$ from layer l multiplied by a constant value $c_i$, and offset by a bias value $b^i$:

$$z_i^{(l+1)} = \left(W_i^{(l+1)} \cdot y^{(l)}\right) * c_i + b_i^{(l+1)} = \sum_{k=1}^{n} \left(w_{ik}^{(l+1)} * y_k^{(l)}\right) * c_i + b_i^{(l+1)}. \quad (A)$$

The constant value $c_i$ is a value to which all the weight values are normalized. In some embodiments, the constant value $c_i$ is 1. The symbol * is an element-wise product, while the symbol · is the dot product. The weight coefficients $W^{(l)}$ are parameters that are adjusted during the network's training in order to configure the network to solve a particular problem (e.g., object or face recognition in images, voice analysis in audio, depth analysis in images, etc.). In some embodiments, the training algorithm imposes certain constraints on the weight values. Specifically, some embodiments impose a ternary constraint that requires all of the weight values for any given layer to be either zero, a positive value, or a negation of the positive value (e.g., 0, 1, and −1). In addition, some embodiments use a training technique that maximizes the number of weight values that are equal to zero (such that, e.g., 75% or 90% of the weight values equal zero).

The output $y^{(l+1)}$ of the nonlinear component 115 of a node in layer l+1 is a function of the node's linear component, and can be expressed as by Equation (B) below:

$$y_i^{(l+1)} = f(z_i^{(l+1)}). \quad (B)$$

In this equation, $f$ is the nonlinear activation function for node i. Examples of such activation functions include a sigmoid function 120 ($f(x)=1/(1+e^{-x})$), a tanh function 125, a ReLU (rectified linear unit) function 130 or a leaky ReLU function 135, as shown.

Traditionally, the sigmoid function and the tanh function have been the activation functions of choice. More recently, the ReLU function ($f(x)=\max(0, x)$) has been proposed for the activation function in order to make it easier to compute the activation function. See Nair, Vinod and Hinton, Geoffrey E., "Rectified linear units improve restricted Boltzmann machines," ICML, pp. 807-814, 2010. Even more recently, the leaky ReLU has been proposed in order to simplify the training of the processing nodes by replacing the flat section (i.e., x<0) of the ReLU function with a section that has a slight slope. See He, Kaiming, Zhang, Xiangyu, Ren, Shaoqing, and Sun, Jian, "Delving deep into rectifiers: Surpassing human-level performance on imagenet classification," arXiv preprint arXiv: 1502.01852, 2015. In some embodiments, the activation functions can be other types of functions, like cup functions and periodic functions.

Equation (B) can be expressed in the following expanded format of Equation (C):

$$y_i^{(l+1)} = f(z_i^{(l+1)}) = f\left[\left(\sum_{k=1}^{n} w_{ik} * y_k\right) * c_i + b_i^{(l+1)}\right]. \quad (C)$$

In this equation, $w_{ik}$ are weight values associated with the inputs $y_k$ of the node i in layer l+1.

Before a multi-layer network can be used to solve a particular problem, the network is put through a supervised training process that adjusts the network's configurable parameters (e.g., the weight coefficients of its linear components). The training process iteratively selects different input value sets with known output value sets. For each selected input value set, the training process typically (1) forward propagates the input value set through the network's nodes to produce a computed output value set and then (2) backpropagates a gradient (rate of change) of a loss function (output error) that quantifies in a particular way the difference between the input set's known output value set and the input set's computed output value set, in order to adjust the network's configurable parameters (e.g., the weight values).

Figure 2:
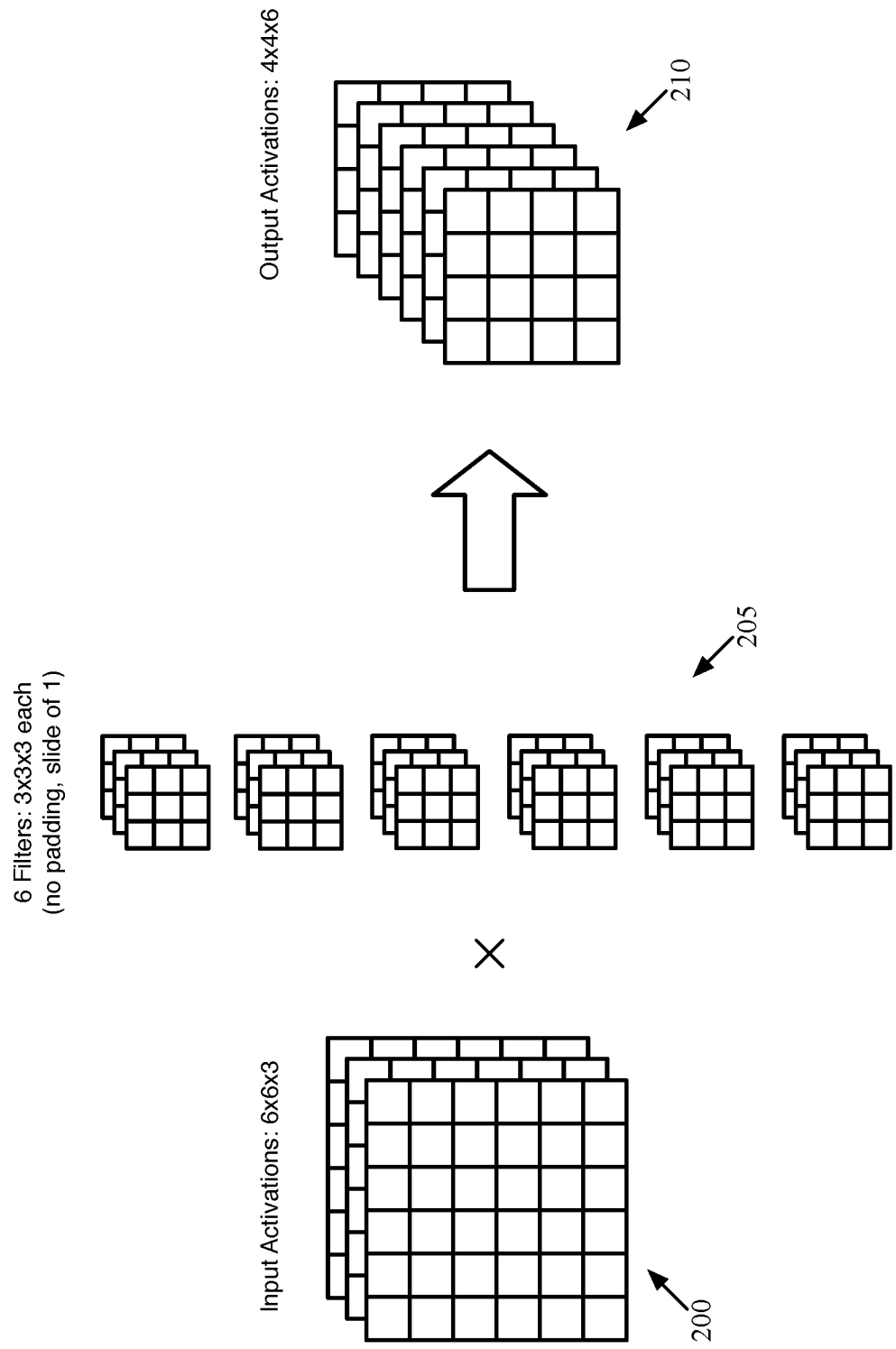
FIG. 2 conceptually illustrates a representation of a convolutional layer of a convolutional neural network.

FIG. 2 conceptually illustrates a representation of a convolutional layer of a convolutional neural network. The convolutional layer receives a set of input activation values 200 organized as a three-dimensional array. This three-dimensional array is either (i) a set of input values for the network, if the convolutional layer is the first layer of the network, or (ii) a set of output values of a previous layer of the network (e.g., a previous convolutional layer, a pooling layer, etc.). The array can be conceptualized as a set of two-dimensional grids, as shown in the figure. In this example, the dimensions of the input values are 6×6×3 (i.e., three 6×6 grids).

Each computation node of the convolutional layer involves a linear component (e.g., a dot product followed by scaling and bias functions) as well as a non-linear component, as described above. The input to each computation node is a subset of the input activation values, and the dot product for the computation node involves multiplying those input activation values by one of the filters of the layer. As shown, in this example the layer includes six filters 205, each of which are 3×3×3. Each value in one of the filters is a weight value that is trained using the techniques described above. Thus, in the example shown in this figure, each filter includes 27 trainable weight values.

The size of the filters in the x and y directions can vary (3×3 and 5×5 are common sizes), but in some embodiments the depth is required to match the depth of the input activations (in this case there are three grids, so the depth is three). The number of filters in a given layer can also vary—in general, each filter is attempting to identify the presence of a particular feature in the input values. For instance, in image analysis, a filter in an early layer might test for the presence of an edge in a particular direction while a filter in a later layer tests for the presence of a more specific object type in the image (e.g., a nose).

To generate the output activations, each of the filters 205 is applied to numerous subsets of the input activation values. Specifically, in a typical convolution layer, each 3×3×3 filter is moved across the three-dimensional array of activation values, and the dot product between the 27 activations in the current subset and the 27 weight values in the filter is computed. This process starts in the top left corner (i.e., x=0-2, y=0-2) of the grid, and includes the full depth of the array. The filter moves across the rows, in this case using a slide of 1 (i.e., moving one column per computation node, such that the second dot product uses activations at x=1-3, y=0-2). When the end of a row is reached, the filter is moved back to the first columns (i.e., x=0-2) and down one row (i.e., y=1-3), and so on until the bottom right corner of the array is reached. Though not the case in this example, some embodiments use zero-padding at the edges of the grids.

The output activation values 210 are arranged in a 4×4×6 array in this example. The outputs from a single filter are arranged in a single grid, and because the example has six filter 205 the output activations have six grids. Using a slide value of 1 with no zero-padding results in a 4×4 output grid for each filter. These output activation values 210 are then the input activation values for the next layer of the neural network.

As mentioned, some embodiments provide an IC that implements a machine-trained network such as that shown in FIG. 1 (e.g., a convolutional neural network with layers similar in structure to that shown in FIG. 2). The ICs of some embodiments are configurable to implement different networks trained to perform a particular function, which may have various different arrangements of nodes and different trained weight values. For instance, the ICs may implement networks for object or facial recognition in images, voice recognition in audio samples, etc. The IC of some embodiments includes a set of input processing circuits, a neural network computation fabric that can be configured to apply a neural network to an input value, and a microprocessor (e.g., for controlling the input processing circuits and configuring the neural network computation fabric).

Figure 3:
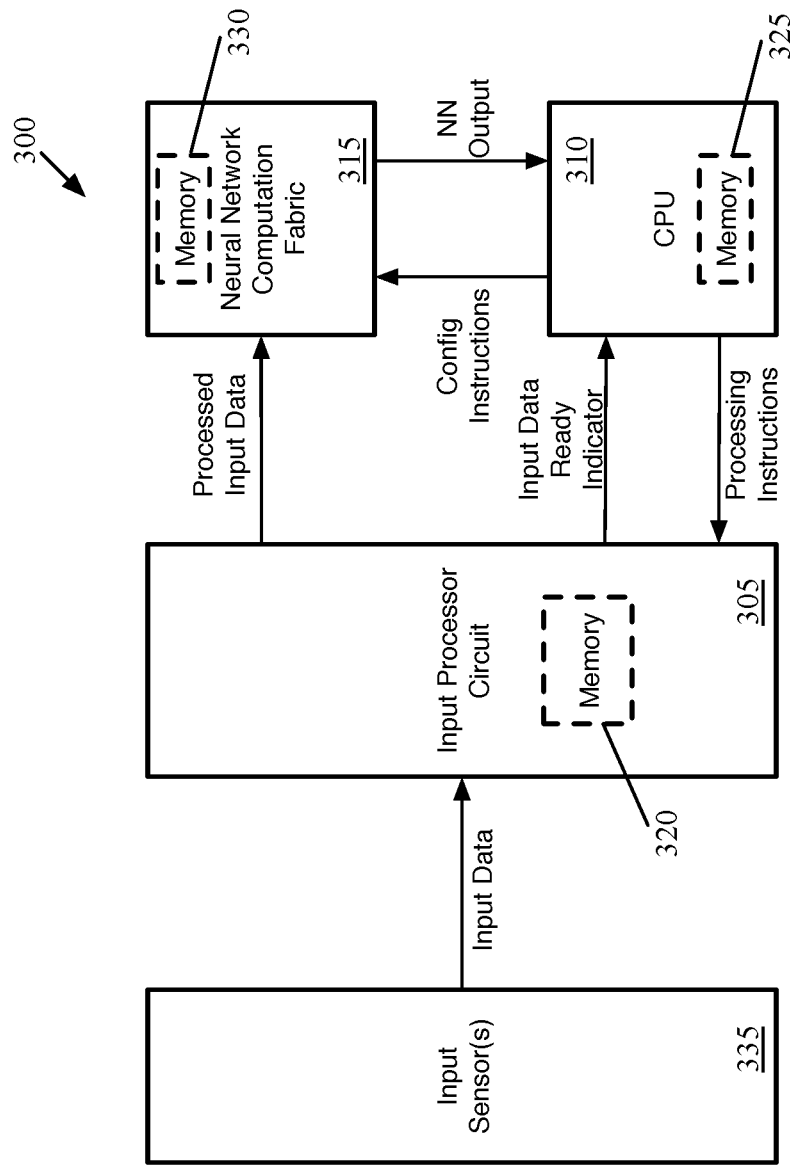
FIG. 3 conceptually illustrates an integrated circuit of some embodiments.

FIG. 3 conceptually illustrates such an IC 300 of some embodiments. As shown, the IC includes an input processor circuit 305, a microprocessor (CPU) 310, and a neural network computation fabric 315. Each of these components 305-315 also has corresponding memory (e.g., random access memory (RAM)) 330. In addition, in some embodiments, the IC is integrated into a device (such as an Internet of Things (IOT) device) with one or more input sensors 335. These input sensors can include cameras (e.g., for capturing video images on which the neural network computation fabric 315 performs face or object recognition, etc.), microphones (e.g., for capturing audio on which the neural network computation fabric 315 performs voice recognition, speech processing, etc.), or other types of input sensors. In other embodiments, the input sensors 335 are located on a separate device that is linked with the IC 300.

In some embodiments, at bootup of the IC 300, the CPU 310 loads neural network configuration data (e.g., weight values, scale and bias parameters, lookup table masks for each layer, memory locations for the weight and input values to use for computing each layer of the network, etc.) from off-chip storage and generates instructions for the neural network computation fabric 315 to write the weight values and other data to its memory 330. In addition, the CPU 310 loads the neural network program instructions for the computation fabric to its own memory 325. These instructions are applied by the computation fabric 315 to input data in order to execute the neural network. These runtime instructions include, e.g., indications as to which pre-loaded sets of instructions to use for each set of calculations, etc.

The input processor circuit 305 receives input data (e.g., still images or video frames, sounds, etc.) from the input sensor(s) 335, and processes these according to processing instructions received from the CPU 310. The CPU 310 stores in its memory instructions for the input processor circuit to prepare input data for the computation fabric 315 as well as the neural network program instructions. These instructions identify, in some embodiments, any sort of initial processing to apply to the raw data (e.g., decompression of compressed data, etc.) as well as how to arrange the data to be provided to the computation fabric 315. For an image, e.g., these instructions might specify the order in which the pixels should be arranged and streamed to the computation fabric 315, so that the computation fabric stores this data in the appropriate locations of its memory 330 for subsequent operations. The input processor circuit 305 also sends signals to the CPU 310 to indicate when it has fully buffered an input (e.g., a frame of video) and when the input is prepared to be sent to the computation fabric 315.

In addition to instructing the input processor circuit 305 how and when to provide input data to the computation fabric 315, the CPU 310 provides the neural network program instructions to the computation fabric. In some embodiments the CPU 310 provides these instructions in stages (e.g., one layer or portion of a layer at a time). Once the final output of the neural network is computed, the fabric 315 provides this output back to the CPU, so that the CPU (or other circuitry on the device) can evaluate this output and perform any actions based on the output.

The computation fabric of some embodiments provides a set of circuits for performing the various computations required for neural networks (e.g., dot product computations, scaler and bias operations, activation functions, etc.), with the network parameters (weight values, bias values, node arrangement, filter size, etc.) configurable. In some embodiments, the computation fabric imposes certain requirements on the networks, such as a maximum size of the network (i.e., a maximum size of the dot product computations), that the weight values be ternary (e.g., 0, a, and -a for each layer of the network), and/or that at least a particular percentage of the weight values be equal to zero.

Figure 4:
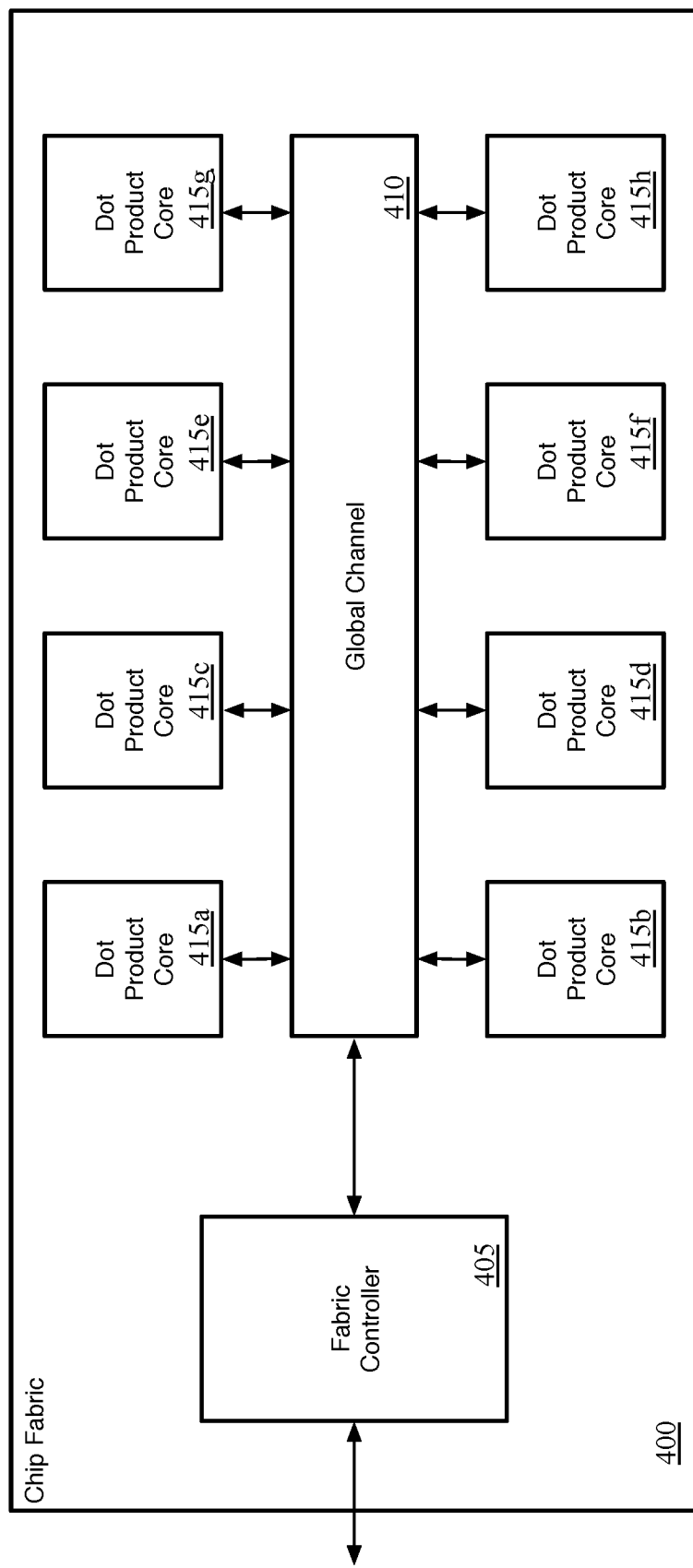
FIG. 4 conceptually illustrates the neural network computation fabric of some embodiments.

FIG. 4 conceptually illustrates the neural network computation fabric 400 (also referred to as the chip fabric) of some embodiments. The chip fabric 400 of some embodiments includes a fabric controller 405, a global channel 410, and a set of dot product cores 415a-h. The connections between the various components 405-415 represent the flow of both control data (e.g., configuration data for a particular neural network layer) and computation data at runtime in some embodiments.

The fabric controller 405 is responsible for managing the operation of the rest of the chip fabric 400 (e.g., the dot product cores 415) in some embodiments. The fabric controller 405 loads instruction arguments (e.g., weight and activation value locations, which cores to use for a particular computation, etc.) from local memory (not shown) on the chip, maps instructions into a sequence of memory-mapped register writes, synchronizes the downstream controllers (e.g., controllers for the various cores 415), etc. The instructions managed by the fabric controller 405 are configured at compile time, in some embodiments, based on the parameters of the network being implemented by the chip fabric 400. In some embodiments, the fabric controller 405 interacts with the microprocessor of the IC as well (i.e., the fabric controller 405 handles the communication with the CPU 310 shown in FIG. 3).

The chip fabric also includes numerous dot product cores 415 as well as a global channel 410 that connects the cores, with these data processing circuits configured by the fabric controller (and a set of hierarchical control circuits, in some embodiments). These data processing circuits 410 and 415 operate to compute neural network operations in an efficient, low-power manner, according to the configuration data provided by the control circuits.

The dot product cores 415a-h include circuitry for computing partial dot products in some embodiments, which is described in further details below. In some embodiments, this circuitry includes memory and/or buffers for storing weights and activations, controllers for reading these values out of memory, and adder trees for computing the partial dot products based on the weight and activation inputs. The core memory, controllers, adder trees, and other core circuitry of some embodiments are described below in greater detail.

The global channel 410 is responsible for providing a communications bus for control and computation data between the fabric controller 405 and the cores 415, as well as from one core to another. The global channel 410, among other operations, accumulates partial dot products from multiple cores when computing dot products that require more computations than can be performed in a single core, and performs post-processing on these dot products. In addition, the global channel 410 carries activations (i.e., computation node outputs) after post-processing for storage (and for use as inputs to subsequent computation nodes) in other cores 415. In some embodiments, the global channel 410 includes an accumulating bus for accumulating the dot products and a non-computation bus for providing activations, weights, and other configuration data to the cores and other computation circuits. In some embodiments, the linear function post-processing and non-linear function for each neural network node are also performed by circuits in the global channel 410.

The chip fabric 400 of some embodiments computes numerous neural network computation nodes simultaneously, with the computation for one node often spread across multiple cores (and subsequently the global channel). In some cases, if a neural network layer is small enough, then computation for that layer may be confined to a single core 415. However, if multiple cores are used for a given layer (any number of cores may be used in some embodiments), then each dot product computed for that layer is spread across all of the cores 415 in use.

That is, for a dot product computed across more than one core 415, each of these cores computes a partial dot product from a subset of the input values and weight values for the node, then provides these partial dot products to the global channel 410. In some embodiments, a set of input values are used as the input to multiple nodes in a layer, so a core simultaneously computes the dot products of these input values with multiple sets of weight values. Similarly, a set of weight values (referred to as a filter, or filter slice when that filter is divided across multiple cores) are used as the weights for numerous nodes with different sets of input values, so in some embodiments the cores load sets of weight values once and then computes dot products of these weight values with numerous different sets of input values.

In the simplest case, all of the partial dot products are computed in the same clock cycle and provided at the same time to the global channel 410. In some cases, however (e.g., for dot products with a very large number of terms or using larger than standard activation values, or when filters have too many nonzero weight values), each core 415 computes more than one partial dot product for a single computation node, requiring multiple clock cycles (also referred to as time-multiplexing of the dot products). Based on configuration data specifying which outputs from the cores are to be added together (and whether multiple partial dot products are required from the same core), the global channel 410 aggregates these partial dot products to compute the complete dot product for each node, then applies various post-processing functions (e.g., the bias, scale, and non-linear activation functions) to compute the output of each node.

Figure 5:
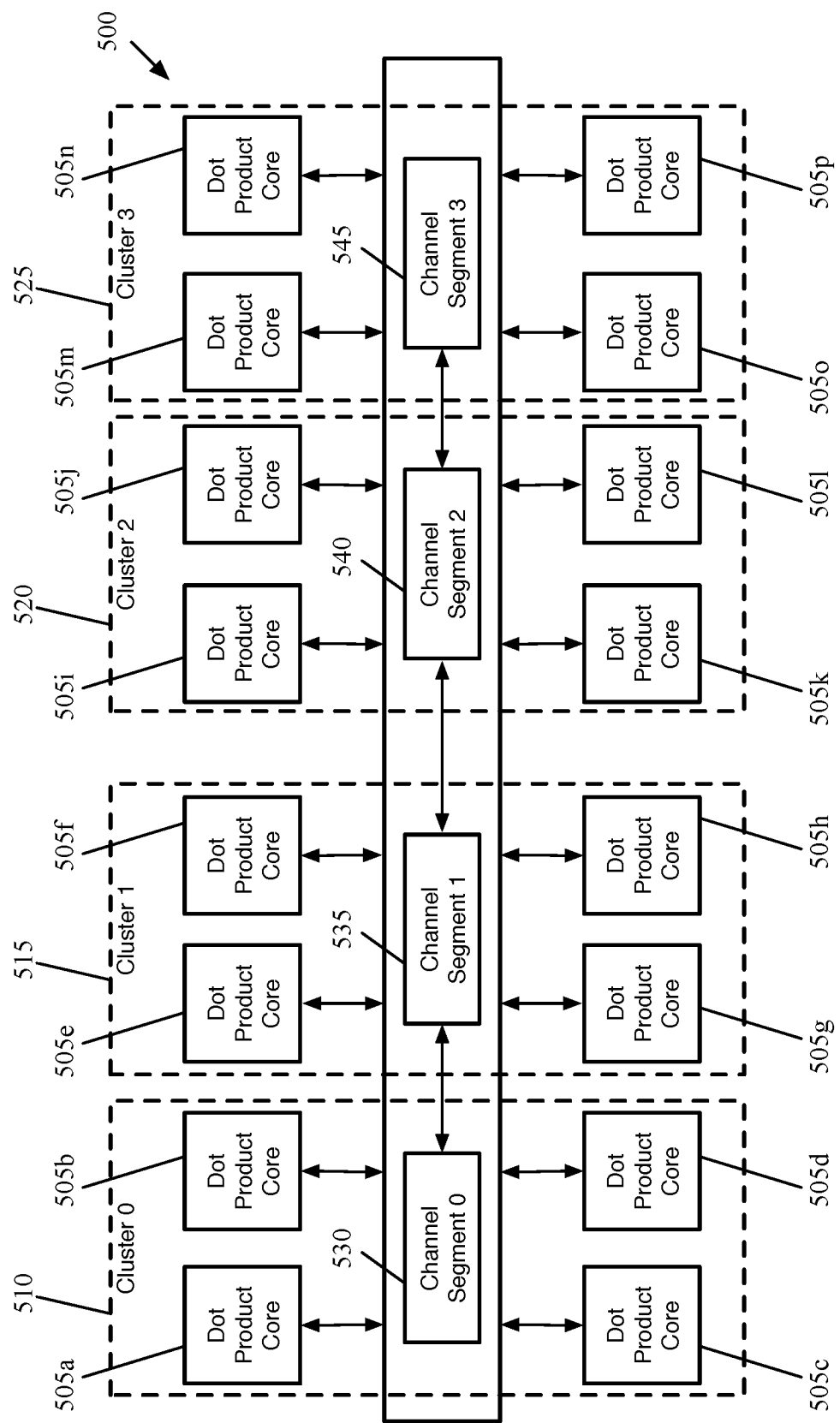
FIG. 5 illustrates a neural network computation fabric of some embodiments with sixteen dot product cores grouped into four clusters.

In some embodiments, the dot product cores are grouped into clusters, and the global channel includes separate segments for each such cluster. FIG. 5 illustrates a neural network computation fabric 500 of some embodiments with sixteen dot product cores 505a-p grouped into four clusters 510-525. In addition, the global channel includes four channel segments 530-545. Each of these channel segments includes the same circuitry in some embodiments, with the exception that buses in the first channel segment 530 and last channel segments 545 only connect to corresponding buses in one other channel segment while the buses in the intermediate channel segments 535 and 540 connect to corresponding buses in two channel segments.

The data processing circuitry of each of the channel segments 530-545 includes a dot product bus, a set of post-processing circuits, and an output bus in some embodiments. The dot product bus receives partial dot products from the cores, aggregates these dot products together, and provides the aggregated dot products to the post-processing circuits. The post-processing circuits perform the non-dot product computations of the neural network computation nodes, which may include a bias (addition) factor, a scaling (multiplication) factor, and a non-linear activation function (e.g., for a node in a convolutional or fully-connected layer). The outputs of the post-processing circuits are the computation node outputs (activations). The output bus, or activation write bus, carries the outputs of the post-processing circuits to the cores 505a-p to be stored as inputs for the next computation layer.

In some embodiments, each cluster 510-525 or group of clusters (e.g., clusters 510 and 515 being one group and clusters 520 and 525 being a second group) can execute a separate neural network. This allows the fabric to execute multiple networks simultaneously, so long as the networks are not so large as to require more than the cores of the allocated cluster. For instance, a single chip of an IOT device could run both a facial recognition network and an object recognition network, a facial recognition network and a language parsing network, etc.

Figure 6:
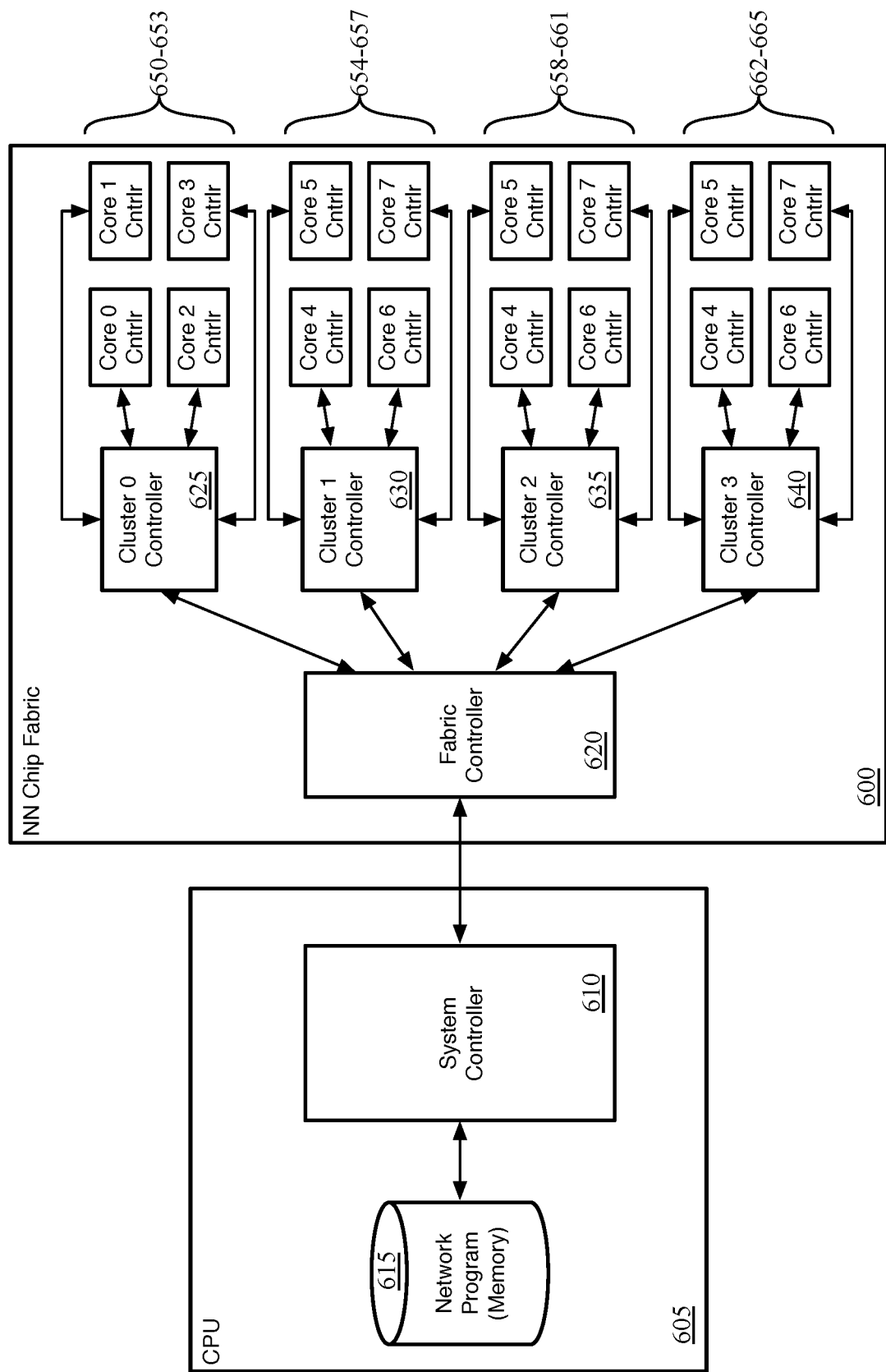
FIG. 6 conceptually illustrates a set of controller circuits for configuring a neural network chip fabric of some embodiments to execute a neural network.

Before describing the structure of the computation circuitry in greater detail, the hierarchical control and configuration of the neural network chip fabric will be described. FIG. 6 conceptually illustrates the set of controller circuits for configuring a neural network chip fabric 600 of some embodiments to execute a neural network. As shown, a CPU 605 executes a system controller 610 and stores a neural network program 615 (i.e., the compiled version of the neural network) in its memory.

The system controller 610 provides the neural network instructions to the chip fabric 600 (per the stored network program 615) for the chip fabric to execute the program on incoming input data (e.g., images, etc.). In some embodiments, the system controller 610 provides these instructions to the chip fabric 600 incrementally. For instance, in some embodiments, the system controller 610 initially loads the instructions for the first layer of the neural network, or a portion of the first layer, then waits for a signal from the chip fabric 600 indicating that these instructions have been completed.

If a layer of the network is small enough to be completed in a single pass, then the compiler of some embodiments schedules the entire layer for one pass. However, in some embodiments, there is a maximum number of filters that can be loaded in a single pass (e.g., 64). In addition, in some embodiments there is a maximum number of output sets that can be written to the same core in the same pass, so this can also constrict the number of filters in a pass. The chip fabric computes the output all of the nodes for each filter loaded (i.e., each pass loads all of the input activations for the layer in the correct order for the outputs to be computed). However, if a layer has more than this maximum number of filters, then the layer will be divided across multiple passes. Once the first portion of the network is completed, the system controller 610 provides the fabric 600 with the instructions for the second portion (e.g., a second layer, or a second pass of the first layer), and so on until the chip fabric has fully executed the network.

The chip fabric 600 includes a hierarchical control structure for configuring the data processing circuitry (i.e., the dot product cores and global channel segments) to execute the neural network instructions from the system controller 610. As shown, the chip fabric 600 of some embodiments includes (i) a fabric controller 620 that interacts with the system controller 610 on the CPU 605, (ii) a set of cluster controllers 625-640, and (iii) a set of core controllers 650-665. Some embodiments include one cluster controller for each cluster of the chip fabric and one core controller for each core (in this case the chip fabric 600 has four clusters with four cores each).

The fabric controller 620 provides the point of interaction with the CPU 605 for the chip fabric 600, receiving neural network program instructions from the system controller 610 and sending signals to the system controller to indicate when instructions have been completed. Upon receiving neural network instructions (e.g., for a layer of the network or portion of a layer), the fabric controller 620 receives these neural network instructions, parses the instructions to identify the active cores (and thus the active clusters), and unpacks additional arguments stored in local instruction memory on the chip fabric. In some embodiments, in order to minimize power usage, the instructions provided from the CPU are high-level commands that the fabric controller parses in order to determine more detailed instructions for the lower-level controllers. Doing so limits control signal power consumption on the chip while encapsulating implementation details of the lower-level (cluster, core) circuits.

For example, in some embodiments the instructions from the system controller 610 to the fabric controller 620 specify to execute a particular pass of a particular layer of the network, and the fabric controller memory includes the required information to execute this specific pass. In some embodiments, this information is conveyed by the system controller instructions specifying to execute a particular type of pass or layer (e.g., convolution) based on the arguments found at a particular memory location of the fabric controller's memory. The specified memory location stores arguments such as the source cores for the computations (i.e., the cores that will perform the dot product calculations) and the destination cores for the output values (i.e., the cores to which the output values are stored), the memory locations in the cores at which to find the weight and/or input values for the computations (in some embodiments, the weight values are loaded into memory initially such that these memory locations are the same across all of the source cores), information for calculating the non-linear activation function for the layer (e.g., the lookup table mapping information), etc.

Because layers may potentially include thousands of output activation values, having the CPU specify a core and RAM location for each such activation value would require a lot of power. Instead, as described, some embodiments specify only a few parameters required for the chip fabric to determine the memory locations for each activation value (e.g., the cores at which the values will be stored, the starting memory address that is the same for each core, and the dimensions of the activation layer). In addition, similar principles apply to the use of input values already stored in RAM (the outputs of the previous layer) for the dot products of the current layer. The weight values and their location in memory, the location of the input values, the lookup table configuration for a layer, etc. are all the same for each network input (e.g., each frame of video) as the network is statically scheduled, so resources can be saved by storing all of this information on the chip at bootup, with a minimal amount of instruction information sent from the CPU for each layer or pass (i.e., only the location in the fabric controller of the arguments for the current layer).

The fabric controller then provides cluster instructions to the cluster controllers for the identified clusters that are in use for the current neural network layer, and waits for completion signals from the clusters indicating that the current set of instructions has been executed (and thus, that the fabric controller can notify the system controller on the CPU that the current set of instructions is complete, causing the system controller to provide the next set of instructions). Avoiding use of some of the clusters when possible provides power savings, as these cores can be powered down, or at least the memories in the cores put to sleep. Even for networks that require the use of all of the cores of the chip fabric, often the initial layers have smaller dot product computations that require fewer cores. In addition, in some embodiments, the fabric controller synchronizes the cluster controllers, ensuring that dot products computed across multiple clusters are aggregated together correctly.

In some embodiments, the cluster instructions provided by the fabric controller are not fully parsed instructions, pushing some of this work to the cluster and/or core controllers. For instance, the fabric controller may only provide the starting memory address for the activations and the activation layer dimensions, allowing the cluster controllers to determine at which core (and the RAM location within that core) each activation value is to be stored. The fabric controller also broadcasts these instructions in some embodiments, while including certain bits that specify the difference in setup between the clusters (or whether certain clusters even need to act on the instructions). Some embodiments broadcast the instructions only to the clusters involved in the computation (which could include clusters with source cores, destination cores, or both). This broadcasting reduces latency and power consumption as compared to sending separate sets of instructions to each cluster.

Each of the cluster controllers 625-640 receives instructions from the fabric controller and configures its own segment of the global channel in addition to parsing the instructions to identify configuration data for each of the cores in its cluster. That is, each cluster controller 625-640 that receives cluster instructions for a given high-level instruction directly configures the dot product bus, the post-processing units, and the activation write bus in its channel segment. In addition, these cluster controllers 625-640 determines which of its cores require the instructions and provides these instructions to the core controllers for these identified cores.

Much as the fabric controller 620 parses the high-level instructions from the system controller 610, the cluster controllers 625-640 of some embodiments decompose the instructions from the fabric controller 620 to determine the configuration data to provide to its channel segment circuits (dot product bus, post-processing units, and activation write bus) as well as the sets of instructions for each of its cores. The cluster controllers configure the channel segment circuits to, e.g., aggregate the partial dot products from the cores correctly (both within a channel segment and across channel segments), provide these aggregated dot products to the post-processing units in the correct channel segment, perform post-processing operations, and provide the output of the post-processors to the correct core. In some embodiments, this information both comes from the fabric controller (e.g., the lookup table mapping for the non-linear activation function) as well as from information stored in cluster controller memory.

The use of separate cluster controllers enables the ability of the chip fabric to execute multiple separate networks simultaneously in some embodiments. The fabric controller 620 can provide instructions to the first cluster controller 625 for a layer of a first neural network and, so long as those instructions do not require the use of other clusters, the first cluster can execute the entire neural network layer in a self-contained manner. At the same time, the fabric controller 620 could provide instructions to the second cluster controller 630 for a layer of a second neural network, with the second cluster executing the entire neural network layer in a self-contained manner. The third and fourth cluster controllers 635 and 640 could receive instructions for third and fourth networks as well, to execute at the same time as the first two. In addition, other combinations of clusters can execute multiple networks simultaneously (e.g., the first two clusters executing a first network and the second two clusters executing a second network, the first two clusters executing a first network while the third and fourth clusters each separately execute second and third networks, etc.

The cluster controllers 625-640, as mentioned, also provide the appropriate configuration data to each of the core controllers 650-665, which coordinate the dot product processing in the core (as well as the direct delivery of input activation values to the global channel for pooling, element-wise operations, etc.). In some embodiments, the cluster controllers do not fully parse the instructions to specify each individual memory read or write, but instead provide the higher-level instructions to each core controller. In addition, some embodiments broadcast the instructions from a particular cluster controller to each of the core controllers within the cluster (or the core controllers for each of the cores active in the current pass), while including certain bits that specify the difference in setup between the cores. This broadcasting reduces latency and power consumption as compared to sending separate sets of instructions to each core.

The core controllers 650-665 then parse these instructions to determine the specific configuration data for the operations of the core. This configuration data includes memory locations for various read operations to read and align weight and activation values, enable bits for the dot product operations, memory locations for write operations after activations have been computed, etc. Once the instructions are fully executed, the core controllers 650-665 send completion signals to the cluster controllers 625-640. Similarly, once the cluster controllers 625-640 receive these completion messages, they send similar messages to the fabric controller 620, which can then notify the system controller executing on the CPU that the instructions are complete. In some embodiments, the last set of neural network instructions is a set of memory read operations, for the computation fabric to deliver the neural network output results to the system controller for any post-processing operations (e.g., a soft-max operation to generate a probability, etc.). After this, the system controller puts the fabric to sleep until the next set of input data is to be processed, in some embodiments. If only a portion of the fabric is involved in executing the neural network (e.g., because one or more clusters execute a different neural network in parallel), then that portion of the fabric is put to sleep in some embodiments.

Figure 7:
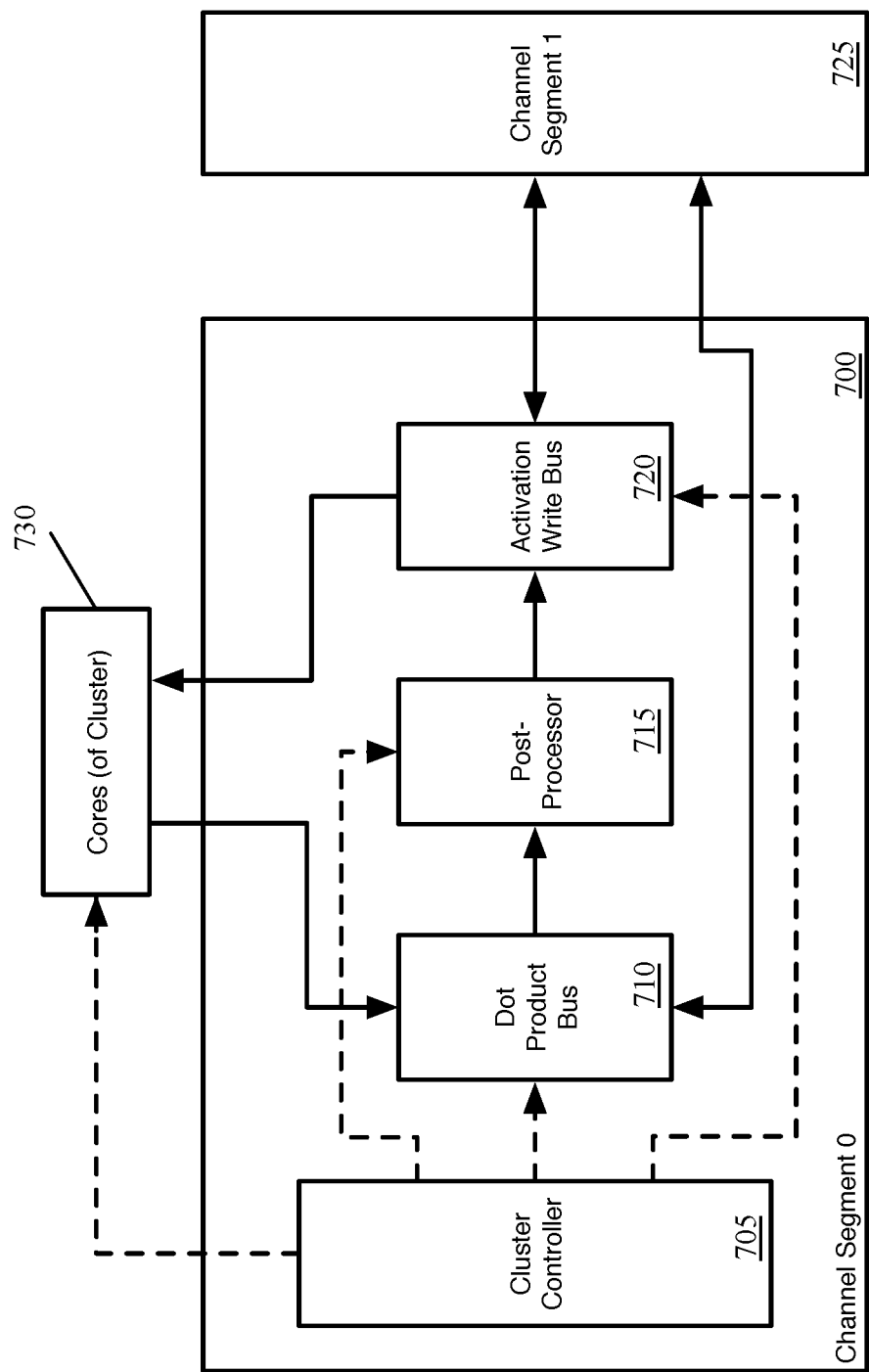
FIG. 7 conceptually illustrates the circuit blocks of a channel segment of some embodiments.

Returning to the neural network computation circuitry, FIG. 7 conceptually illustrates the circuit blocks of a channel segment 700 of some embodiments (e.g., one of the channel segments 530-545 shown in FIG. 5). The channel segment 700 includes a cluster controller 705, a dot product bus 710, a post-processor 715, and an activation write bus 720 (also referred to as an output bus). In addition to the channel segment 700, the figure also illustrates an additional channel segment 725 and the cores 730 of the local cluster for the channel segment 700, as the circuit blocks of the channel segment 700 exchange dot product and configuration data with these other circuits. In this diagram, the dashed lines represent the flow of configuration data while the solid lines represent the flow of neural network computation node data for convolution or fully-connected layer nodes (i.e., nodes that use a dot product based linear function). Additional neural network computation data, such as that flowing directly from the cores 730 to the post-processor 715 for pooling nodes or element-wise operators, is not shown.

The cluster controller 705 configures the dot product bus 710, post-processor 715, and activation write bus 720 as per the configuration instructions received from the fabric controller in some embodiments. For the dot product bus 710, this configuration data specifies, in some embodiments, (i) which partial dot products are to be added together as part of the same neural network computation node and (ii) to which post-processing unit each aggregated dot product is sent (the post-processor 715 of some embodiments includes numerous post-processing units with the same circuitry). In other embodiments, the post-processing unit that receives each aggregated dot product is not specified as configuration data because there are an equal number of dot product bus lanes and post-processing units, so that the data from each lane is provided as the primary input to a different post-processing unit.

For the post-processor 715, the configuration data of some embodiments indicates (for each of the post-processing units) whether a dot product computation node or other computation node (e.g., pooling, element-wise operator) is being executed, the scaler and bias factors for a linear computation, the activation function to use (which may be specified, e.g., as a lookup table), as well as other data. For the activation write bus 720, the configuration data indicates to which cores each output value is to be delivered, in some embodiments.

As mentioned, the solid lines indicate the flow of neural network computation data, for a node in a convolutional or fully-connected layer. The cores 730 (as well as, in some cases, cores of other clusters) compute partial dot products. For a given computation node, these partial dot products may be computed across multiple cores. In some embodiments, if more than one core is used to compute the dot products for a neural network layer, then the partial dot products for each node are computed across all of these cores.

These partial dot products are output to the dot product bus 710, which aggregates the partial dot products from the cores 730 of the local cluster. The dot product bus 710, in some embodiments, includes a number of independent dot product bus lanes that each receives partial dot products from the cores, aggregates these together, and provides the aggregated dot products to the post-processing circuits. In some embodiments, each lane corresponds to (i) one of the adder trees in each of the cores (i.e., dot product bus lane N receives the partial dot products from each of the adder trees of index N in the cores), and (ii) one of the post-processing units in each of the clusters (i.e., dot product bus lane N provides its aggregated output to the post-processing unit N in one of the clusters, as specified by the configuration data).

Each lane of the dot product bus 710 spans all of the channel segments, and the dot product bus lanes in each channel segment aggregate the partial dot products from the cores of its local cluster. The dot product bus 710 in the channel segment 700 also exchanges locally-aggregated dot products with its neighboring segments for further aggregation if needed (i.e., if the source cores for the dot product computation span multiple clusters). In this case, the channel segment 700 only has one neighboring segment, but internal channel segments (e.g., the segments 535 and 540 in FIG. 5) will have two such neighboring segments. The configuration data from the cluster controller 705 specifies whether to send these dot products in one direction or the other along the global channel for each dot product bus lane, or to aggregate the dot products from the neighboring channels locally, depending on where post-processing will occur for each dot product.

The post-processor 715 includes numerous post-processing units that receive the dot products from their corresponding dot product bus lane and perform the non-dot product functions of the neural network computation nodes. For a typical computation node of a convolutional (or fully-connected) layer, these functions include an addition operation to account for the bias factor, a multiplication operation to account for the scaling factor, and a non-linear activation function. In some embodiments, the outputs of the linear function are quantized or truncated to a particular number of bits (e.g., 4 bits, 5 bits, 8 bits). Using a small, fixed number of bits for the outputs of each computation node allows for (i) power and resource savings by enabling smaller computations and (ii) certainty in the scheduling of computations (i.e., by knowing that all input values will be within a particular range) that enables further power and resource savings in design. The non-linear activation function, in some embodiments, is implemented as a lookup table rather than a hardwired function. This enables the IC to execute different neural networks that use different activation functions and, in some embodiments, allows for different activation functions to be used in different layers of the neural network. The operation of the dot product bus 710 and the post-processing units 715 of some embodiments is discussed in greater detail in U.S. patent application Ser. Nos. 16/212,617 and 16/212,643, both filed Dec. 6, 2018, now issued respectively as U.S. Pat. 11,170,289 and 11,250,326, both of which are incorporated herein by reference.

The activation write bus 720 receives the computation node activation outputs from the post-processing units and carries these outputs back to the cores 730, to be stored in the memory of the core and used as inputs for the computation nodes of the next layer of the neural network. The activation write bus connects to the cores 730 in the local cluster as well as the activation write bus in the neighboring channel segment 725. As with the dot product bus 710, the activation write bus 720 of some embodiments includes lanes, with each post-processing unit of the post-processor 715 sending its output to a different one of these lanes.

In some embodiments, the output values may be computed by the post-processor 715 in one cluster but carried by the activation write bus 720 to a core in another cluster to be stored. For efficiency, the compiler of some embodiments (a software program that generates the configuration data for enabling the IC to execute a particular neural network) attempts to optimize the location of the post-processing unit for each computation node output relative to the cores used to compute the constituent partial dot products for that computation node and the destination core for the output value. The activation write bus 720 also includes a right shift circuit for each core that is used to align the output values for the core, in order for the values to be stored in contiguous blocks within the core RAM.

Figure 8:
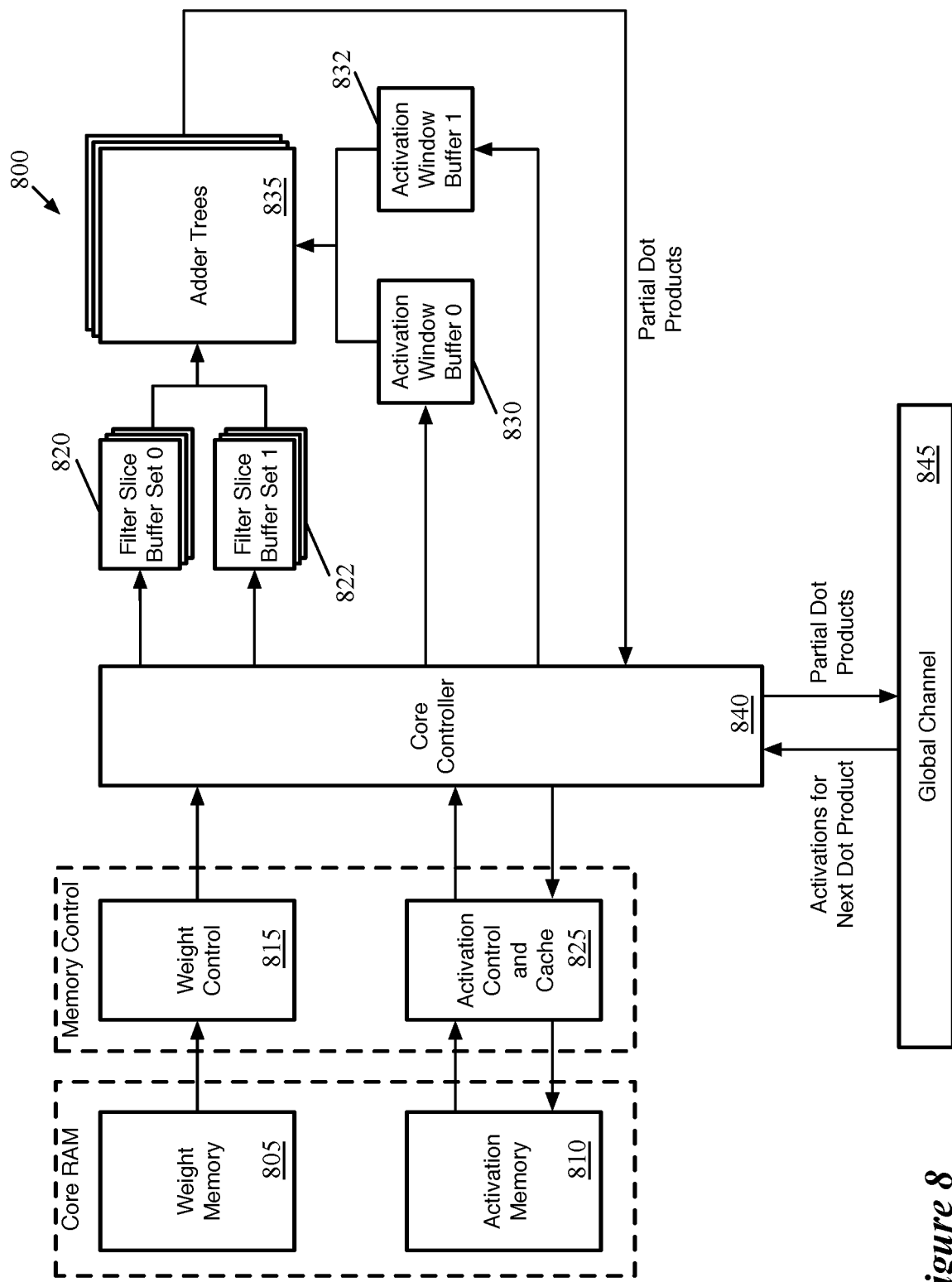
FIG. 8 conceptually illustrates the data flow within one of the cores of some embodiments for a dot product computation.

As mentioned, the dot product cores perform the majority of the dot product computation of the chip fabric of some embodiments. FIG. 8 conceptually illustrates the data flow 800 within one of the cores of some embodiments for a dot product computation. This data flow will be described with certain specifics (e.g., weight sizes, number of separate adder trees simultaneously computing partial dot products, etc.) as examples, but it should be understood that different embodiments may use different sizes for weight and/or activation values, different numbers of adder trees within a core, etc.

In some embodiments, the dot product cores store weight values (e.g., weights for multiple nodes in multiple layers) in the weight memory 805 and activation values in the activation memory 810. In some embodiments, as shown, these memories 805 and 810 are part of a single block of memory for the core (e.g., banks of random access memories such as SRAMs). In addition to storing weight and activation values, in some embodiments the microprocessor of the IC can use the memories in the cores as overflow memory (e.g., to store an image before the image is processed and provided as input to the neural network fabric).

The weight values are part of the network parameters and thus are determined at compile time (and do not change at runtime), while the activation values (the input values to a particular node being computed) are the output values from a previous computation (or, for the first layer, are otherwise based on the network input) and thus are determined at runtime. Thus, the weight memory 805 is typically larger than the activation memory 810 (e.g., 512 KB to 64 KB), as the activation memory is at least party overwritten for each new layer of the neural network while the weight memory 805 stores the weights for all of the dot product computations performed by the core. In some embodiments, the weights are stored as 1-bit or 2-bit values (e.g., all values stored as 2-bit values, or zeros stored as a single bit and negative/positive values stored as 2-bit 1/-1). In other embodiments, the weights are encoded in such a manner that less than 1 bit of the weight memory 805 is allocated per weight value (e.g., by encoding the weight values in such a way that many of the zeros are removed).

The weight controller 815 reads data from the weight memory 805 into sets of filter slice buffers 820 and 822 that store the weight values to be used in the dot products. In some embodiments, as mentioned, a filter is a set of weights that is used to compute a dot product with a set of inputs (e.g., in order to identify a specific feature type within a portion of an image). Depending on the number of channels of the activation inputs, filters may be divided into multiple slices. Each filter, in some embodiments, is used repeatedly to compute dot products with numerous activation windows (e.g., contiguous sets of activation inputs). Some embodiments load 36 weight values into each filter slice buffer, which are actually used to compute 144 dot product components (with the requirement that at least 75% of the weight values be zero, the actual adder tree only receives 36 inputs for 144 activation values, as described in detail below).

Some embodiments include both primary filter slice buffers 820 and secondary filter slice buffers 822, as shown in this figure. In a given clock cycle, at most one of these sets of filter slice buffers is used to compute dot products (e.g., using multiplexers to select only one of the sets of weight values). For simpler dot product computations, only the primary filter slice buffer 820 is needed, so there is no need to load weight values into the secondary filter slice buffers 822. However, in other cases, both sets of filter slice buffers may be used (e.g., when dot products are too large to be computed in a single clock cycle using only the primary buffers).

The activation controller 825 reads data (input values) from the activation memory 810 into the activation window buffers 830 and 832. In addition, the activation controller 825 arranges the input values within the activation window buffer 830 in some embodiments to match up with the weight values in the filters. In some embodiments, the input values in an activation window read into the buffer 830 include all of the values (as opposed to the 25% of the values needed for a particular filter), because the activation window is multiplied by numerous filters simultaneously (i.e., some or all of the filters stored in the filter slice buffers). The input values, in some embodiments, are quantized to have a fixed size (e.g., 4 bits), or set of fixed sizes (e.g., 4 bits or 8 bits) for ease and simplicity of computation.

As with the sets of filter slice buffers, some embodiments include both a primary activation window buffer 830 and a secondary activation window buffer 832. In a given clock cycle, at most one of these sets of activation window buffers is used to compute dot products (e.g., using multiplexers to select only one of the sets of weight values). For simpler dot product computations, only the primary activation window buffer 820 is needed, so there is no need to load activation inputs into the secondary activation window buffer 822. However, in other cases, both activation window buffers may be used, as described below (e.g., when dot products are too large to be computed in a single clock cycle using only the primary buffers). In some embodiments, the weight control 815 and the activation control 825 are a single circuit block that reads data from (and writes data to) the weight and memory partitions 805 and 810 of the core memory. In such embodiments, the cache may be used to store weight value data when reading the weights from the weight memory 805.

The adder trees 845 compute the dot products between the weight values in the filter slice buffers 820 and the input values in the activation window buffer 830. The details of these partial dot product computation circuits of some embodiments are described below by reference to FIG. 9. These adder trees 845 output partial dot products (e.g., 10-bit values) that are provided to the dot product bus, which combines the partial dot products with other partial dot products as described above. In some embodiments, the number of filter slice buffers in each of the sets 820 and 822 is equal to the number of adder trees 835, dot product bus lanes, and post-processing units in each segment. Thus, for a typical neural network computation node, the partial dot products computed by the adder trees 835 in multiple cores having a particular index are aggregated by the dot product bus lane with the same index and that aggregated dot product is provided for post-processing to one of the post-processing units with the same index (i.e., the post-processing unit with that index in one of the channel segments).

The core controller 840 configures and coordinates the operation of the memory controllers 815 and 825 in addition to the filter slice buffers 820, activation window buffer 830, and adder trees 835. Furthermore, the core controller 840 receives the input activations and weights from the memory controllers 815 and 825 and loads them into the correct slots in the sets of filter slice buffers 820 and 822 and the activation window buffers 830 and 832 (or directs them to the ALU bus for non-dot product computations). Lastly, when the adder trees 835 output their partial dot product values, the core controller 840 sends these values to the dot product bus in the global channel 845. When the activations are output, the activation write bus carries these values to the core controller 840, which provides them to the activation control 825 to be written to activation memory 810.

To reduce the circuit area and power required for dot product computations (which use the majority of resources for neural network inference), the partial dot product computation circuits (e.g., the adder trees 835) of some embodiments map each of a first number of input values to a second number (e.g., 25% of the first number) of dot product inputs, such that each dot product input only receives at most one input value with a non-zero corresponding weight value. Specifically, in some embodiments, the partial dot product computation circuit includes at least two sets of wires for each input (activation) value, with each of the sets of wires for a given input value connected to at least two different dot product inputs (so that each input value can be provided to at least two different inputs). With a guarantee of at least 75% weight sparsity (i.e., at least 75% of the weight values for any set of input values are zero), the number of dot product inputs is set at 25% (or slightly more than 25%, for redundancy) of the number of input values loaded in an activation window for the dot product computation circuit. In some embodiments, the weight sparsity is guaranteed by the training algorithm used to train the weights to perform a specific purpose, and the IC is adaptable for any set of weights that meets the guarantee.

Figure 9:
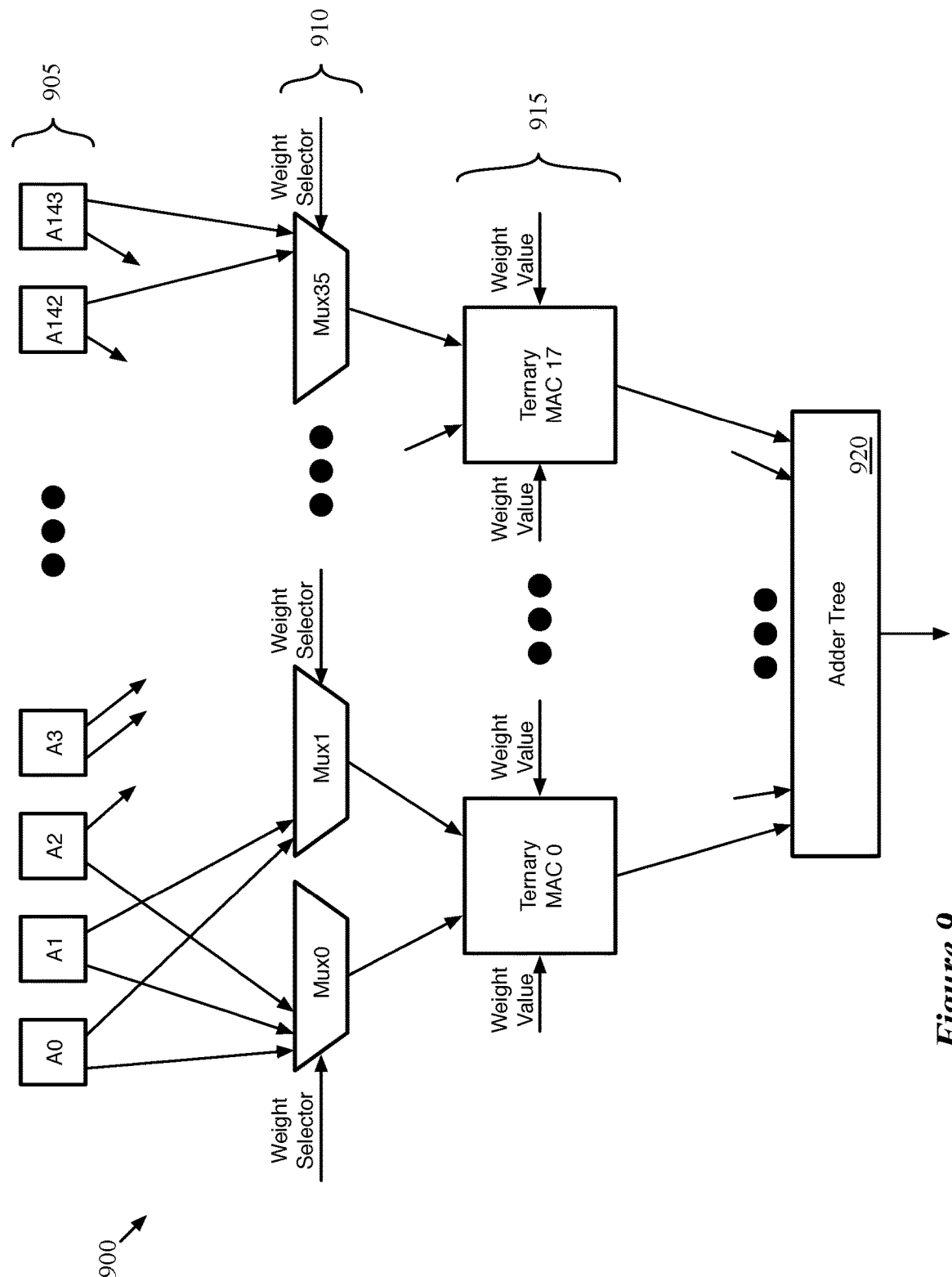
FIG. 9 conceptually illustrates an example of a partial dot product computation circuit for a guaranteed weight sparsity of at least 75%.

FIG. 9 conceptually illustrates an example of such a partial dot product computation circuit 900 for a guaranteed weight sparsity of at least 75%. The wiring of the input values for this dot product computation circuit is designed to optimize the likelihood that, so long as the weights meet the sparsity requirement, the compiler can ensure that at runtime each input value with a nonzero corresponding weight value is provided to a different dot product input for nearly any arrangement of the nonzero weight values. As shown, the dot product computation circuit 900 includes a set of activation inputs 905, a set of multiplexers 910, a set of ternary multiplier-accumulator (MAC) circuits 915, and an adder tree 920.

In this example, the dot product computation circuit 900 includes 144 input values 905. In different embodiments, the activation window buffer may have different sizes, which defines the size of the partial dot product computation. Each input value storage (e.g., each buffer location) is connected to two of the thirty-six multiplexers 910. In this example, at least 75% sparsity is assumed for each set of weight values, and thus the 144 activation inputs can be reduced to 36 inputs to the actual dot product computation. This significantly reduces the circuit area required for the dot product computation, as the number of adders is reduced by 75% (the adder tree effectively starts with 36 values rather than 144 values).

The multiplexers 910 each have eight inputs and receive a set of select bits (the weight selector input) from the core controller that specifies which of these eight inputs to pass to the dot product computation. Having thirty-six 8-input multiplexers 910 allows for 288 sets of wires from the activation inputs 905 to the multiplexers 910, which is two wires for each activation input. If the sparsity guarantee was only 50%, then seventy-two 4-input multiplexers could be used with two sets of wires for each activation input 905 (or seventy-two 8-input multiplexers with four sets of wires for each activation input 905), with similar proportions for different sparsity guarantees and numbers of wires per activation input.

The wire sets from the activation inputs to the multiplexers are arranged such that each input value with a nonzero corresponding weight is provided to a different one of the multiplexers 910. The weight values are not known at the time of IC manufacture, and thus the wiring design is resilient to different arrangements of the nonzero weight values (that meet the sparsity requirement). Some embodiments use a cuckoo hashing algorithm (or other algorithm) to optimally map the wire sets from the activation inputs 905 to the multiplexers 910. In some embodiments, this algorithm computes two hashes (e.g., with two different hash functions) for each of the activation input locations 905 that map to two different multiplexers 910 (e.g., by computing the hash modulo 36). Each activation input location 905 is wired to these two different multiplexers 910 determined by the hashes. If one of the hash functions maps an activation input to a multiplexer that already has eight inputs, then some embodiments compute a third hash function for either that activation input or one of the activation inputs previously mapped to the multiplexer.

Other embodiments use other techniques to select the multiplexers to which each input value is wired, so long as each input is wired to two different multiplexers (and thus each multiplexer has input wires from eight different activation inputs). Additional constraints may be imposed as well, such as ensuring that no more than a specified maximum number of activation inputs are wired to the same pair of multiplexers. In addition, it should be understood that these techniques can be applied to dot product computation circuits with different numbers of inputs, different numbers of multiplexers, and different numbers of wires per input.

The weight values are known before the network is executed by the IC (i.e., at compile time), and thus the compiler can determine which of the two multiplexers that receive each input value with a non-zero corresponding weight at runtime will select that input value, such that each input value is selected by a different multiplexer (and only one multiplexer). In some embodiments, the compiler uses the same cuckoo hashing or other algorithm as was used for the wires. The select bits for the multiplexers 910 are (i) determined by which of the inputs to the multiplexer carries an input activation value with a nonzero corresponding weight value and (ii) are received from the core controller. These multiplexers 910 provide their output to a set of ternary multiply-accumulator (MAC) circuits 915. The ternary MAC circuits effectively form the leaves of the dot product computation, and the number of such circuits is half the number of multiplexers 910 (18 ternary MAC circuits 915 in this example).

In some embodiments, the weight values for a particular dot product computation are all either zero, a positive value, or the negation of the positive value in some embodiments. In this case, the dot product does not require any actual multiplication at the leaves of the computation, as the positive and negative weight values can be treated as 1 and −1, with a single multiplication by the positive value afterwards. Removing the multiplication at the leaves saves significant circuit area for a chip with numerous such computation circuits.

To combine the two input values while accounting for the ternary weight values, the ternary MAC circuits 915 add the two input values from the multiplexers 910 while also receiving as inputs the corresponding weight values for these input values (or configuration bits generated based on the weight values). If both of the weights are positive, then the ternary MAC outputs the sum of the two input values (and outputs the negative of this sum if both of the weights are negative). If only one of the weight values is negative, then its corresponding input value is subtracted from the other input value (with a positive corresponding weight value), and if both of the weight values are zero, then the ternary MAC output is zero. Lastly, if only one of the weight values is zero, then the ternary MAC outputs the input value (or the negative of the input value) with the corresponding nonzero weight value). The negative values are accounted for in the bias computation within the post-processing unit, as described above.

The outputs of the ternary MACs provide the inputs to the adder tree 920 that computes the output for the partial dot product computation. In some embodiments, this adder tree is a standard adder tree circuit that adds pairs of values over several layers. For example, the adder tree 920 receives 18 inputs for 9 adders, which in turn provide outputs to 4 adders (with an additional output to be added in later), etc. In some embodiments, the inputs to the ternary MACs 915 are 4-bit inputs (the length of the quantized activation values), and the ternary MACs 915 output 6-bit values. The adder tree 920 receives these 6-bit values and outputs a 10-bit value after several stages of addition. It should be noted that this description refers to handling of signed 4-bit input values. Some embodiments can also handle unsigned input values by converting them to signed input values before performing the addition operations.

While this diagram shows the wires (or some of the wires) connecting the input value 905 to a single partial dot product computation circuit, in some embodiments each of these input values 905 in the activation window buffer is actually connected to each of the partial dot product computation circuits in the core. That is, for the case with 64 such circuits, each value in the activation slice register is carried by 128 total wires to 128 multiplexers (two for each of the partial dot product computation circuits). In some embodiments, the wiring arrangement is the same for each set of multiplexers (i.e., for each partial dot product computation circuit).

As mentioned, for redundancy, some embodiments use a number of dot product inputs (i.e., multiplexers) that is slightly more than required by the sparsity guarantee for the dot product computation. For instance, in the example above, rather than using 36 inputs (exactly 25% of the 144 input values), some embodiments use 38 or 40 inputs. In this case, some of the activations 905 are mapped to three of the multiplexers 910, rather than two. For the integrated circuit (IC) described above some embodiments provide a compiler to optimize the implementation of a machine-trained network (e.g., a neural network) on the IC.

Figure 10:
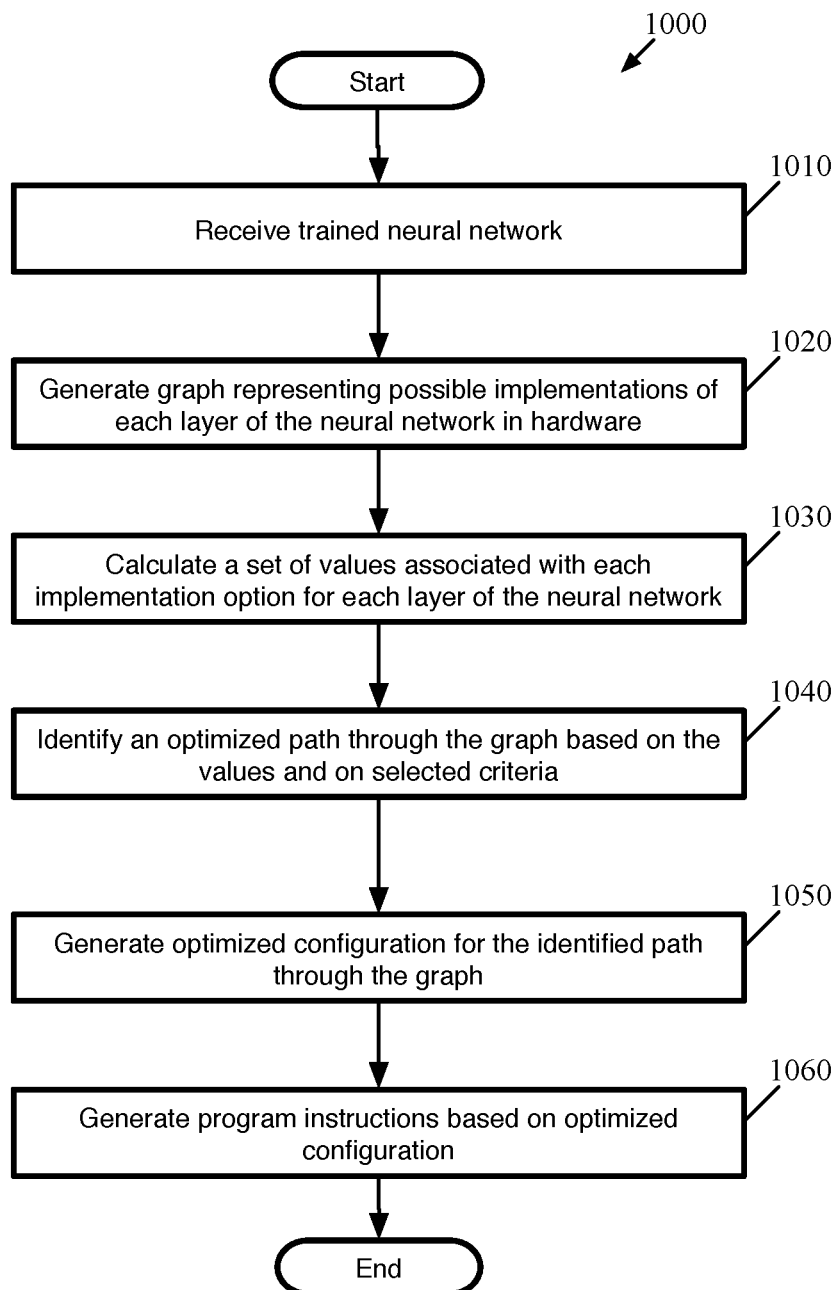
FIG. 10 conceptually illustrates a process of some embodiments for generating optimized program instructions for a received machine-trained network.

FIG. 10 conceptually illustrates a process 1000 of some embodiments for generating optimized program instructions for a received machine-trained network. The process 1000 is performed by a compiler for a particular IC (e.g., the IC described above). The process begins (at 1010) by receiving a specification for a machine trained network (e.g., a neural network). The machine-trained network, in some embodiments, is trained according to a method that enforces a required sparsity (e.g., 75% zero values) on the filters of each layer of the machine-trained network.

After receiving the machine-trained network, the process (at 1020) generates a graph of the possible implementations of each layer of the machine-trained network (e.g., nodes) and defines edges (e.g., connections between nodes) that indicate possible subsequent implementations for each layer of the machine-trained network (e.g., neural network). Generating the graph, in some embodiments, includes generating a complete set of options for each layer of the machine-trained network and then testing each option against criteria in sets of criteria for implementing machine-trained networks in the particular IC. For example, a set of criteria for using certain numbers of clusters may include a criterion that all clusters must use the same number of cores and that the total number of cores used must exceed the number of cores on a lesser number of clusters. In some embodiments, an option representing the use of a particular set of clusters of the NNIC for implementing a particular layer of the neural network is non-viable when there are too many non-zero weights in at least one set of filter channels in the particular layer that are assigned to partial dot product computation circuits (PDPCCs) of a particular core in the particular set of clusters for processing. An option representing the use of a particular set of clusters of the NNIC for implementing a particular layer of the neural network is non-viable, in some embodiments, when there are too many dot-product terms in the particular layer to process using partial dot product computation circuits (PDPCCs) in the particular set of clusters (or there are too many dot-product terms assigned to at least one core in the particular set of clusters).

In addition, some embodiments perform a set of zero channel removal operations prior to this initial graph generation stage in order to reduce the number of channels and outputs of the machine-trained network before enumerating the implementation options for the graph. These operations simplify the machine-trained network by removing unnecessary operations in implementing the machine-trained network. For example, some operations remove filters that are comprised of all-zero weights. As another example, some operations remove activations for which all filters have an all-zero channel. Additional operations, in some embodiments, propagate the changes forward and backward in the machine-trained network so as to remove additional calculations that are no longer required. Some of these operations are described in more detail below by reference to FIGS. 11 and 12.

Some embodiments then calculate (at 1030) a set of values associated with each implementation option for each layer of the machine-trained network. Separate values are generated, in some embodiments, for each node and edge in the graph. In some embodiments, the values are only calculated for each edge of the graph as that fully defines the values for a path through the graph. The generated values represent a cost associated with the option (e.g., node or edge) based on a knowledge of the IC structure and the necessary operations to implement the node or edge (e.g., reads, writes, dot products, etc.) in some embodiments. The costs associated with an option, in some embodiments, include power (e.g., energy use) and latency (i.e., timing, clock cycles) values associated with each option. In some embodiments, the generation of values is a part of graph generation and the evaluation of viable options for implementing the machine-trained network in the IC.

Once values are generated, an optimized path through the graph is identified (at 1040) using a set of optimization operations based on (1) the values calculated (at 1030) for each implementation option and (2) a selected optimization criterion. Optimization, in some embodiments, is performed for multiple sets of criteria (optimization parameters). For example, optimized configurations, in some embodiments, are generated for each of power, latency (speed), memory allocation, or power at a given frame rate (e.g., 33 fps). In some embodiments, optimization is performed over many cycles in which a set of edges or nodes with non-optimal (e.g., greatest) values are removed from the graph with the condition that a viable path remain through the graph. Other embodiments cast the optimization operation into a mixed-integer problem and use a mixed-integer solver to solve for each optimization parameter. In some embodiments, a separate mixed integer problem to be solved by the mixed-integer solver is generated for each of multiple optimization parameters. The separate mixed-integer problems, in some embodiments, are mixed-integer problems with different optimization criteria (e.g., different objective functions). Each solution to the mixed-integer problem, in some embodiments, is pareto-optimal. The optimized configurations in some embodiments specify a number of clusters and a number of cores within each cluster to implement each layer of the received machine-trained network.

In some embodiments, formulating the mixed integer problem includes defining a set of input variables, parameters, constraints, and an objective function to optimize (e.g., minimize). Some embodiments define a graph of a set of vertices and edges (e.g., Plangraph (V,E)) with each vertex (e.g., V[a][c]) corresponding to a placement of an activation ([a]) on a cluster set ([c]) and assign a Power Model of the PlanGraph, providing power (power[E]), and latency (time[E]) of each edge of the graph (PlanGraph). Additional inputs include a set of footprint sets (F) that define activations that must exist in memory at the same time, a maximum weight size for each PlanGraph edge (max_weight_size[E]), a maximum activation size for each PlanGraph vertex (max_act_size[V[a][c] ]), a number of bits in each memory unit (e.g., core RAM or CRAM) in terms of "words" (cram_words), and a parameter ("slack") to allow for inefficiency when packing weights. Optimization targets "edge_coeff[E]," "weight_mem_coeff," and "act_mem_coeff" are also provided in some embodiments to define the objective function.

The integer values used in defining the mixed integer problem, in some embodiments, include v[a][c] for each vertex in the PlanGraph, e[i] for each edge in the PlanGraph, actind[a][cl] for each activation in the network and cluster "cl," ainter[ai][aj] for each pair of activations (ai, aj) in each footprint in F, and ainter[ai][aj][cl] for each pair of activations (ai, aj) in each footprint in F and each cluster "cl." Additional continuous variables are defined including sumw[cl] for each cluster "cl," asize[a] for each activation "a" in the network, actaddr[a] for each activation "a" in the Network, and maxf[cl] for each cluster "cl" in some embodiments.

Based on the defined variables, constraints can be placed on the network such as choosing exactly one cluster per activation, choosing exactly one plan for a layer, ensuring that activations don't over/underflow the memory, making sure that activations in a same footprint are not assigned to a same core unless they are stored in different (non-overlapping) memory locations, that weight memory (e.g., taking into account the inefficiency implied by the slack variable) for each cluster fits in the region left over after activation memory is assigned. With the appropriate constraints in place, the mixed integer problem is then used to minimize a value associated with either the power (power[E]), time (time[E]), or memory usage ("weight_mem_coeff," and "act_mem_coeff"). One of ordinary skill in the art will understand that this is only one way to formulate the mixed integer problem and recognize that other equivalent formulations will provide comparable results.

Based on the results of the optimization, the process then generates (at 1050) configuration data for a configuration optimized for a selected criterion. In some embodiments, the compiler generates configuration data for each of the optimized configuration. The configuration data, in some embodiments, includes specifying an optimized assignment of each layer of the machine-trained network to a particular number of cores, the assignment of the different filter slices to different weight value buffer/partial dot product computation circuit/dot product bus lane/post-processing unit indices, and the specification of which segment will perform post-processing on each output value, etc. Some embodiments optimizing configurations for multiple optimization parameters, generate configuration data for each optimized configuration. In embodiments that generate multiple sets of configuration data, a user selects a particular optimization parameter (and associated configuration) and some embodiments then remove the generated configuration data for unselected optimization parameters using a dead-code elimination process before proceeding to the next step.

Once configuration data is generated, the process generates (at 1060) program instructions for implementing the neural network according to the optimized configuration data. The program instructions, in some embodiments, include instructions for loading the weight values onto the neural network computation circuit and instructions for the circuit to execute based on the optimized assignment of each layer of the machine-trained network to a particular number of cores, the assignment of the different filter slices to different weight value buffer/partial dot product computation circuit/dot product bus lane/post-processing unit indices, and the specification of which segment will perform post-processing on each output value, etc. In embodiments that generate multiple sets of configuration data, a user selects a particular optimization parameter (and associated configuration) before generating the program instructions and the generated configuration data for unselected optimization parameters are removed using a dead-code elimination process before generating the program instructions.

Figure 11:
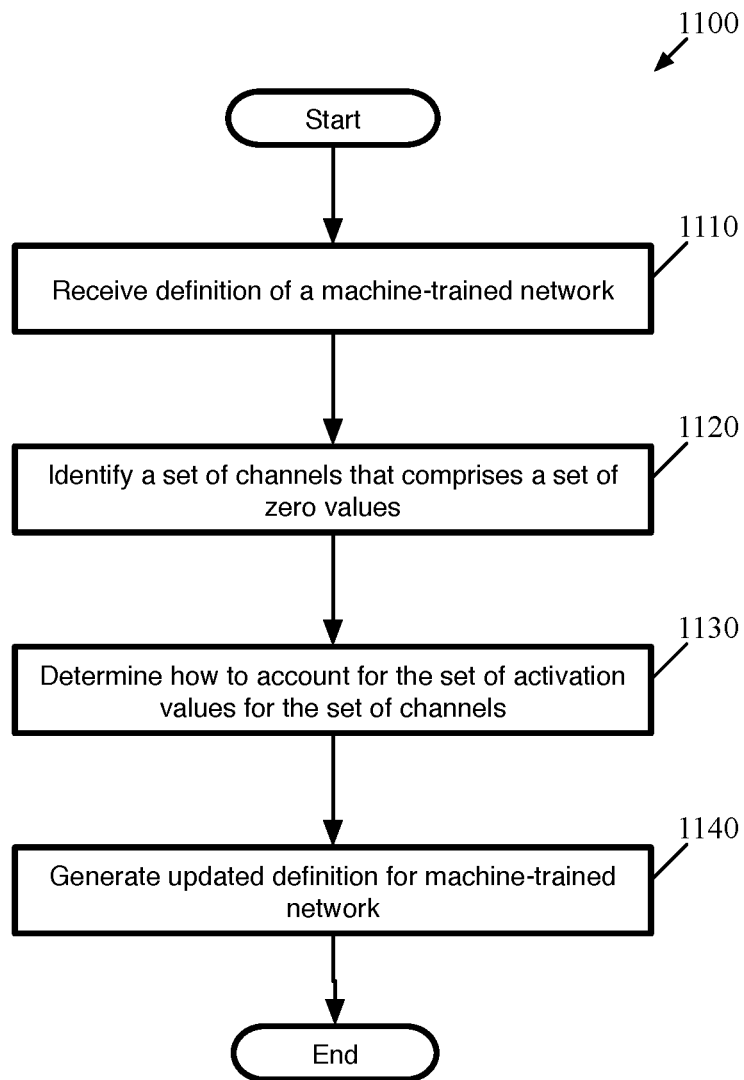
FIG. 11 conceptually illustrates a process for zero channel removal.

As described in relation to FIG. 10, as part of generating the graph in some embodiments, the compiler determines whether any set of channels contains no non-zero weight values (i.e., contains only zero weight values). For sets of channels that include no non-zero values, some embodiments perform a zero channel removal operation to remove all-zero channels wherever possible. In some embodiments, zero channel removal operations include removing input channels, removing output channels, forward propagation, and backward propagation of channels and constants. Reducing the number of channels and outputs results in conservation of power, as removal of the all-zero channels reduces the amount of calculation circuitry used for a given layer. FIG. 11 conceptually illustrates a process 1100 for zero channel removal. In some embodiments, process 1100 is performed by the compiler.

Process 1100 begins by receiving (at 1110) a definition of a machine-trained network (i.e., a specification of weights and biases for each layer of the network). The machine-trained network definition, in some embodiments, is received as part of process 1000 for generating the graph. As subsequent optimization operations depend on the exact use of power and time to compute dot products or element-wise operations in implementing the machine-trained network, process 1100 is performed before any other implementation operations.

After receiving (at 1110) the machine-trained network definition, the process identifies (at 1120) a set of channels (or an entire filter) that includes no non-zero values (i.e., a zero channel (or zero filter)). In some embodiments, the identified set of channels is a set of channels of a particular filter in a particular layer of the machine-trained network that will be used by a particular core of the neural network inference circuit to compute a set of activations for a subsequent layer of the machine-trained network. In some embodiments, each set of non-zero channels is a set of channels that is assigned to a particular partial dot product computation circuit of the neural network inference circuit by the compiler. Reducing the number of total channels by removing zero channels in turn reduces the number of cores or particular partial dot product computation circuits of the neural network inference circuit that must be used for a layer of the machine-trained network. Using fewer elements of the neural network inference circuit in turn reduces the power, time, or both needed to implement the machine-trained network.

After identifying (at 1120) the set of channels (or filter) that includes no non-zero values, the process determines (at 1130) how to account for the set of activation values for the identified set of channels. In some embodiments, the identified set of channels is accounted for by calculating the set of activations for the set of channels and storing those values in the activation memory while not using the elements of the neural network inference circuit to calculate the partial dot product of the set of channels. In embodiments for which the output is zero, the channels having all zero values can effectively be ignored as the sum of the other channels with zero is the same as just calculating the dot product of the other channels. Activation values that are not used by subsequent layers, in some embodiments, are not written into activation memory to avoid the cost (in terms of power) of the write operation. In such embodiments, additional forward or backwards propagation of the removed channel or activation is performed as described in relation to FIGS. 12A-E. In some embodiments, the identified set of channels is accounted for by introducing a shift in the output channel so long as the shift does not cause overflow. In some embodiments, the shift is introduced in a post-processing unit as described below by reference to FIG. 28 and in further detail in U.S. patent application Ser. No. 16/355,653, filed Mar. 15, 2019, which is incorporated herein by reference. One of ordinary skill in the art will appreciate that within the implementation of a single machine-trained network both methods are used in some embodiments and that the method selected depends on the identity of the set of channels that is all zero values. In some embodiments, multiple sets of channels are identified and in some of those embodiments, the multiple sets of channels belong to multiple filters for executing multiple layers of the machine-trained network.

After determining how the identified sets of channels will be accounted for, the process proceeds to generate (at 1140) an updated definition for the machine-trained network to be used to generate the graph and the program ends. In some embodiments, generating (at 1140) the updated machine-trained network definition is performed as part of process 1000 (at 1020) to generate the graph used to determine an optimized machine-trained network implementation as described above.

FIGS. 12A-E illustrate a set of zero-channel removal operations. Before discussing specific operations, the notation used in FIGS. 12A-E is discussed. Each activation element indicates a set of values for number of channels (e.g., the grids of FIG. 2), an x-dimension width, and a y-dimension length as an ordered set (e.g., (channels, x, y)) referred to below as an implementation set. Because each "channel," or grid, of an activation element serves, in some embodiments, as both the result of, and the input to, different convolution computations, for the sake of these examples a channel is alternatively referred to by its role in the current example (e.g., input activation set or filter result). For ease of representation, all activations are assumed to be 1×1 as are the convolution kernels (i.e., the channels of the filters) of the filter set. One of ordinary skill in the art will appreciate how to extend the process into cases using larger convolution kernels (e.g., 3×3 kernels rather than 1×1 kernels) and larger activation sets (e.g., 5×5 activation sets instead of 1×1 activation sets). For example, if a filter uses a set of 3×3 kernels (e.g., one for each activation set) each kernel of an all-zero filter would be a set of nine zero values. However, if any of the values in any kernel (applied to an input activation set) of the filter includes even one non-zero value, the filter would no longer be an all-zero filter. Additionally, or alternatively, if all the kernels applied to a particular activation set (e.g., a 5×5 set of values to which a 3×3 kernel will be applied in a convolution for each filter) are all-zero kernels, the particular activation set can be ignored or removed as discussed below for the simple case (e.g., 1×1 activations and kernels).

Figure 12A:
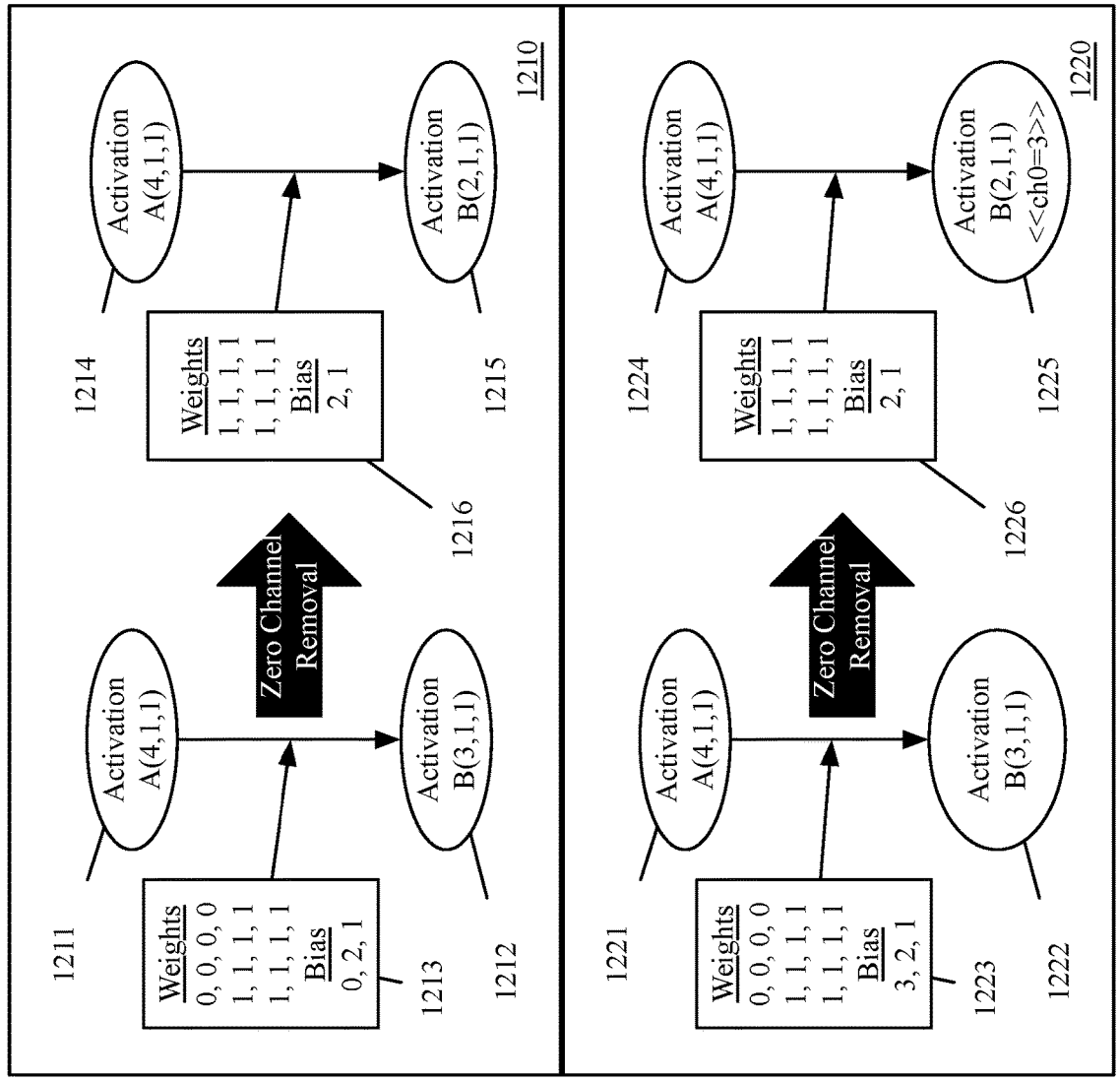
FIG. 12A-E illustrate a set of zero channel removal operations.

FIG. 12A illustrates two instances 1210 and 1220 of zero channel (filter) removal.

The zero channel removal operation depicted in 1210 includes a set of initial activation configurations that specify (4, 1, 1) and (3, 1, 1) as the parameters that define activation A 1211 and activation B 1212, respectively, as their implementation sets. A convolution 1213 that produces activation A 1212 from activation B 1211 is specified as including an all zero first channel with a zero bias. As an example of deriving activation B 1212 from activation A 1211 we will assume that activation A 1211 includes 4 activation sets (e.g., 1×1 matrixes) with values (2, 3, 4, 5), the convolution 1213 (or set of convolutions) produces the values (0; 16; 15) (i.e., (0*2+0*3+0*4+0*5+0; 1*2+1*3+1*4+1*5+2; 1*2+1*3+1*4+1*5+1) with each value being the result of the weights of each channel (depicted as a row of values in convolution 1213) being multiplied by the values of the activation set and added to a bias value for the channel).

In instance 1210, a zero channel removal operation removes the all-zero channels (the first filter) from convolution 1213 and adjusts activation B 1212 to produce activation B 1215 that has an implementation set of (2,1,1) that includes one less activation set (i.e., an output of the updated convolution operation on the input activation sets) than the original activation B 1212. Similarly, instance 1220 includes activations A 1221 and B 1222 that are equivalent to activation A 1211 and B 1212, but the convolution 1223 includes a non-zero bias (i.e., 3) for the removed filter. In instance 1220, the activation B 1225 still has a reduced number of activation sets (e.g., specified by the implementation set (2, 1,1)) based on removing the zero filter from the convolution definition, however a constant for the first channel (i.e., ch0) is set to the bias value associated with the channel (i.e., 3 in this case). In some embodiments, this is implemented by changing the bias of a next set of channels (filters) for a next layer that uses the results of the removed channel to account for the bias of the removed channel as in FIG. 12E.

Figure 12B:
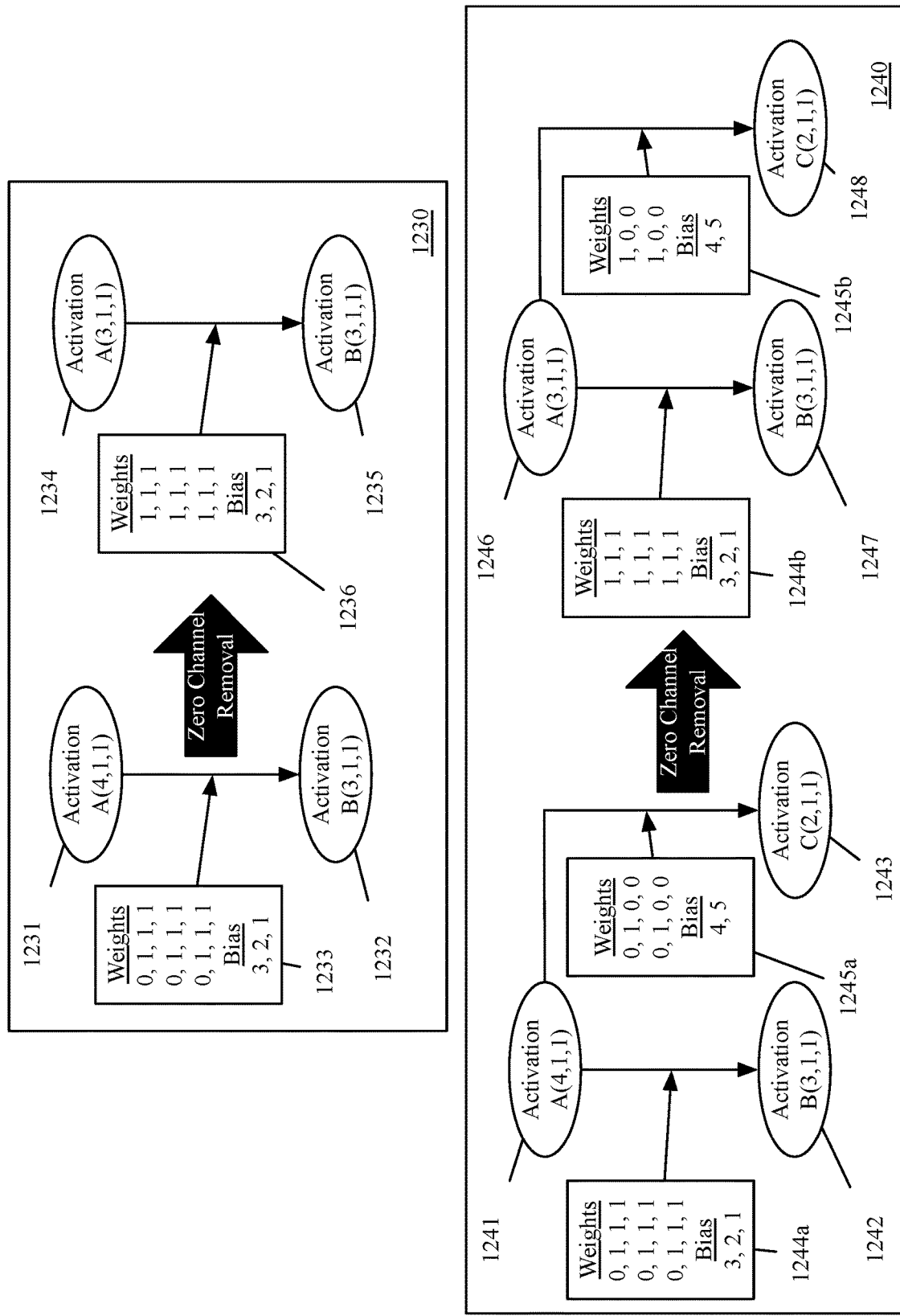

FIG. 12B illustrates two instances 1230 and 1240 of zero channel removal. The zero channel removal operation depicted in 1230 includes a set of initial activation configurations that specify (4, 1, 1) and (3, 1, 1) as the parameters that define activation A 1231 and activation B 1232, respectively, as their implementation sets. A convolution 1233 that produces activation B 1232 from activation A 1231 is specified as including a set of zero weights for convolution with a first input from activation A 1231. For example, assuming as above that activation A 1231 includes 4 activation sets (e.g., 1×1 matrixes) with values (2, 3, 4, 5), the convolution 1233 (or set of convolutions) produces the values (15; 14; 13) (i.e., (0*2+1*3+1*4+1*5+3; 0*2+1*3+1*4+1*5+2; 0*2+1*3+1*4+1*5+1). It can be seen from the example that the components of each filter computation for a first activation set (i.e., the bolded terms for the value 2 in activation A 1231) can be ignored without affecting the calculation of the activation values of activation B 1232.

Thus, in instance 1230, a zero channel removal operation removes the channel (i.e., first activation set) from the input activation A 1231 (producing an implementation set (3,1,1) for updated activation A 1234) and adjusts convolution 1233 to produce convolution 1236 that has weight values for only three input activation sets (e.g., 1×1 matrixes). Activation B 1235 still has an implementation set of (3,1,1) as each filter (i.e., set of channels) that produced an activation in activation B 1235 has non-zero values. In some embodiments, a backpropagation operation as discussed in relation to FIG. 12D follows the zero channel removal operation in instance 1230.

Instance 1240 includes activations A 1241, B 1242, and C 1243, and two convolutions 1244a and 1245a producing activations B 1242 and C 1243, respectively, from activation A 1241. Each of the convolutions has a set of zero weights for convolution with a first activation set from activation A 1241, with convolution 1245a having additional sets of zero weights for convolutions with third and fourth activation sets from activation 1241. In instance 1240, only the first activation set of activation A 1241 can be discarded (to produce activation A 1246 having an implementation set of (3,1,1) and convolutions 1244b and 1245b) because it is the only activation set that has zero weights for all convolutions performed on activation A 1241.

Figure 12C:
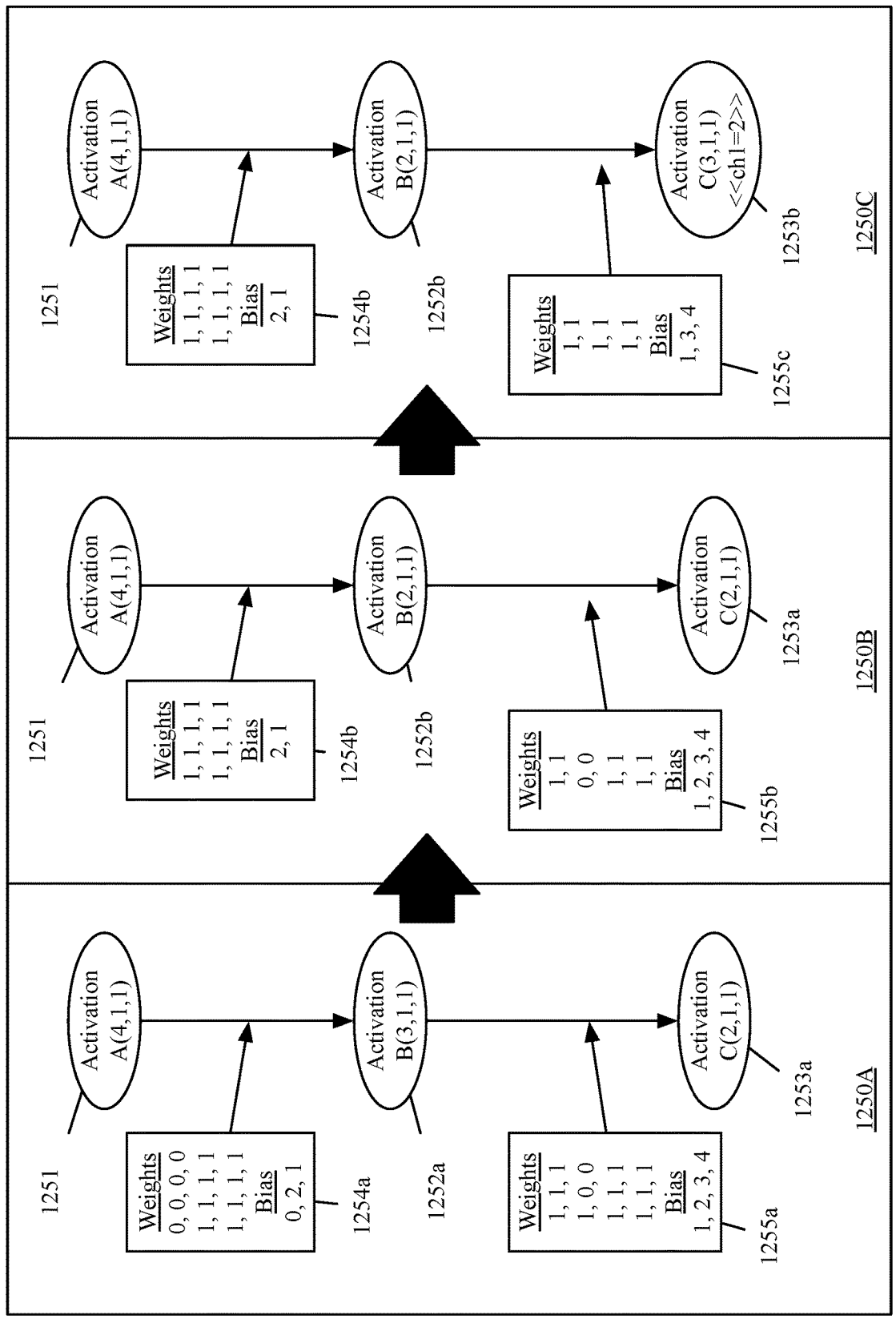

FIG. 12C illustrates a forward propagation of a zero (e.g., after a zero channel removal operation as in 1210) in three stages 1250A-C. Stage 1250A includes activations A 1251, B 1252a, and C 1253a with convolutions 1254a and 1255a for producing activations B 1252a and C 1253a, respectively. As in instance 1210, convolution 1254a has a zero filter (with a zero bias) that is removed in transitioning to stage 1250B, however in this case the removal of downstream weights associated with the removed filter is shown. After the weights associated with the first (removed) filter of the convolution 1254a are removed from convolution 1255a, in transitioning from state 1250A to 1250B, to produce convolution 1255b, a second zero channel operation is performed on convolution 1255b to produce convolution 1255c and modified activation 1253b with 3 activation sets and a constant value (i.e., a constant value of 2) associated with the second removed filter (ch1) indicated by <<ch1=2>>. In some embodiments, this is implemented by changing the bias of a next set of filters for a next layer that uses the results of the removed activation set to account for the bias of the removed channel as in FIG. 12E.

Figure 12D:
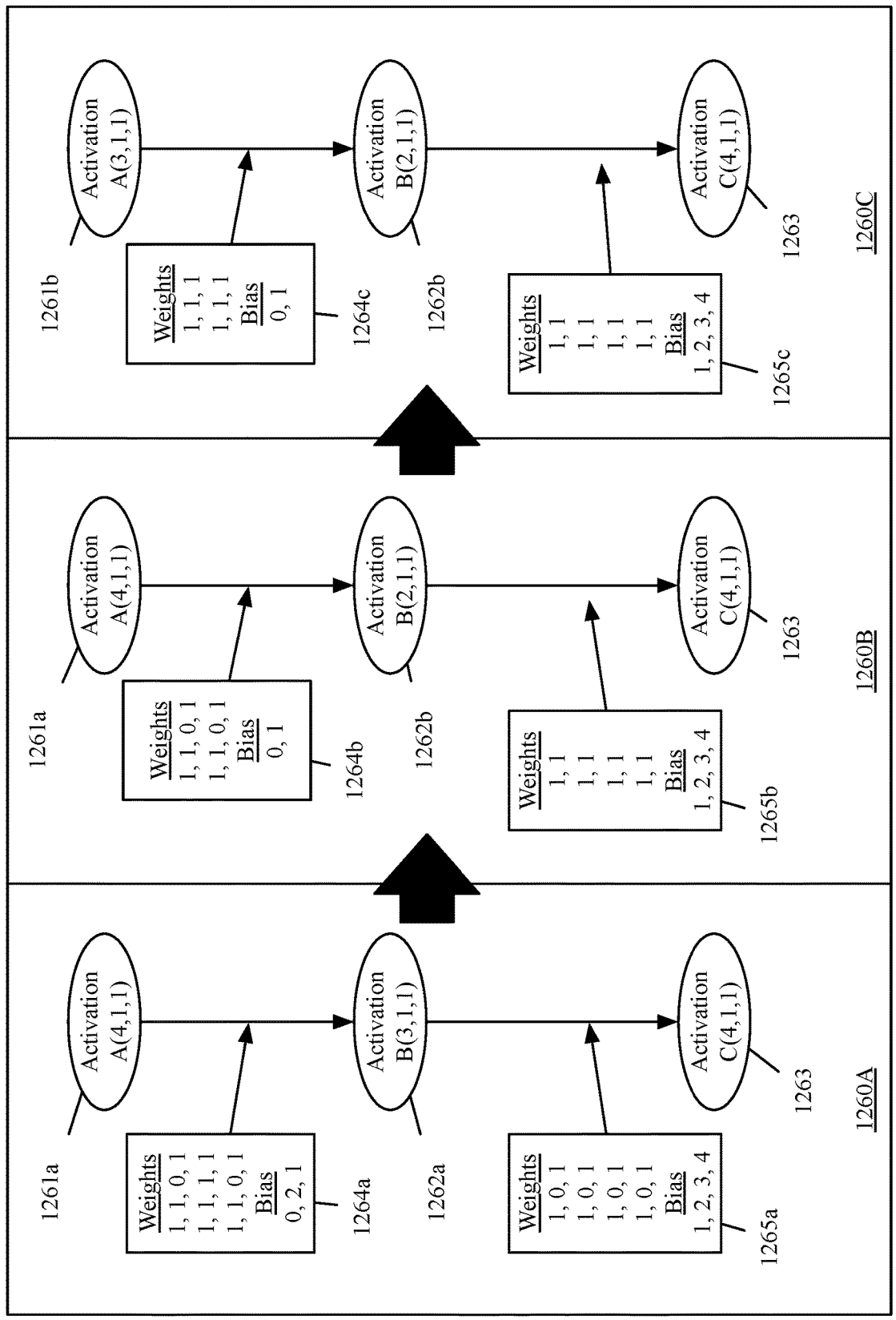

FIG. 12D illustrates a backward propagation of a zero channel removal (e.g., after an activation set removal operation as in 1230) in three stages 1260A-C. Stage 1260A includes activations A 1261a, B 1262a, and C 1263a with convolutions 1264a and 1265a for producing activations B 1262a and C 1263a, respectively. As in instance 1230, convolution 1265a has a set of zero weights associated with an activation set of activation B 1262a which leads to the removal of the activation set from 1262b and the associated weights from convolution 1264b in transitioning from 1250A to 1250B. However, in this case, the removal of upstream weights associated with the removed channel enables further similar upstream zero channel removal operations. After the weights associated with the second (removed) activation set of the activation 1262a are removed from convolution 1264a to produce convolution 1264b, a second zero channel operation is performed on convolution 1264b to produce convolution 1264c and modified activation A 1261b with a third activation set removed. One of ordinary skill in the art will appreciate that this second zero channel removal operation may further be propagated back to a previous convolution set, activation, or both.

Figure 12E:
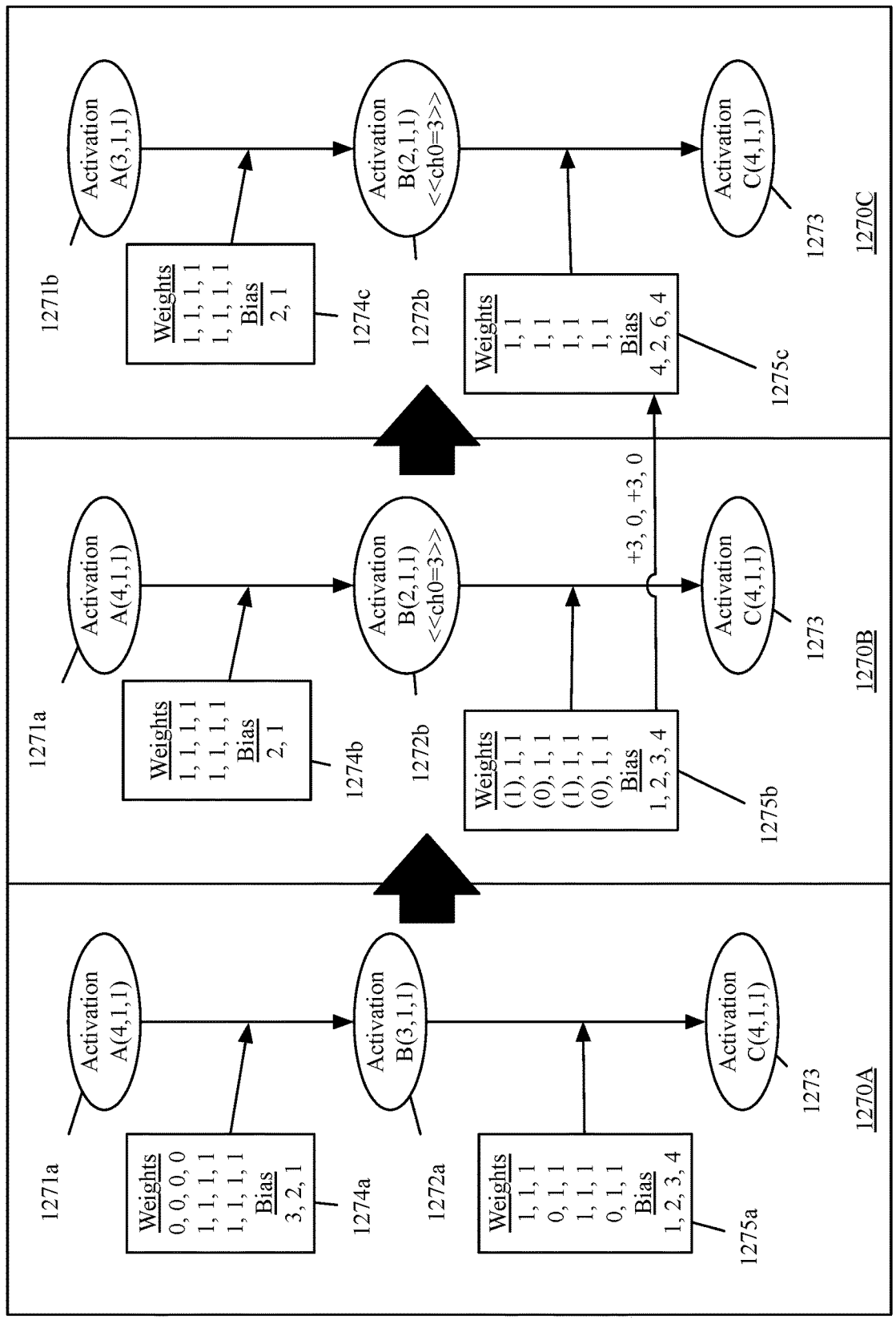

FIG. 12E illustrates a forward propagation of a constant (e.g., after an activation value removal operation as in 1210) in three stages 1270A-C. Stage 1270A includes activations 1271a, 1272a, and 1273 with convolutions 1274a and 1275a for producing activations 1272a and 1273, respectively. As in instance 1210, convolution 1274a has a zero filter which leads to the removal of the activation set from 1272b (while adding a constant value for the removed channel based on the bias (i.e., <<ch0=3>>)) and the associated weights from convolution 1274b in transitioning from 1250A to 1250B. Stage 1250B also includes, in some embodiments, identifying weight values of convolution 1275b as related to the constant channel value. The constant value is then propagated as adding the weight value times the constant to the bias for each filter of convolution 1275c while the weight values associated with the removed activation set of activation 1272b are removed from convolution 1275c. One of ordinary skill in the art will understand that the operations described in FIGS. 12A-E will be propagated through the machine-trained network definition, in some embodiments, until there are no more possible zero channel removal operations possible and that a zero channel removal operation such as those described above may be impossible for architectural reasons such as layers that do not act on a per-channel basis (e.g., element-wise operations) or loss of precision when attempting to add to an existing bias as in FIG. 12E. Once convergence has been reached, in some embodiments, for removing zero channels from a machine-trained network, a graph is generated for performing subsequent optimization operations as described in other sections of this document.

Figure 13:
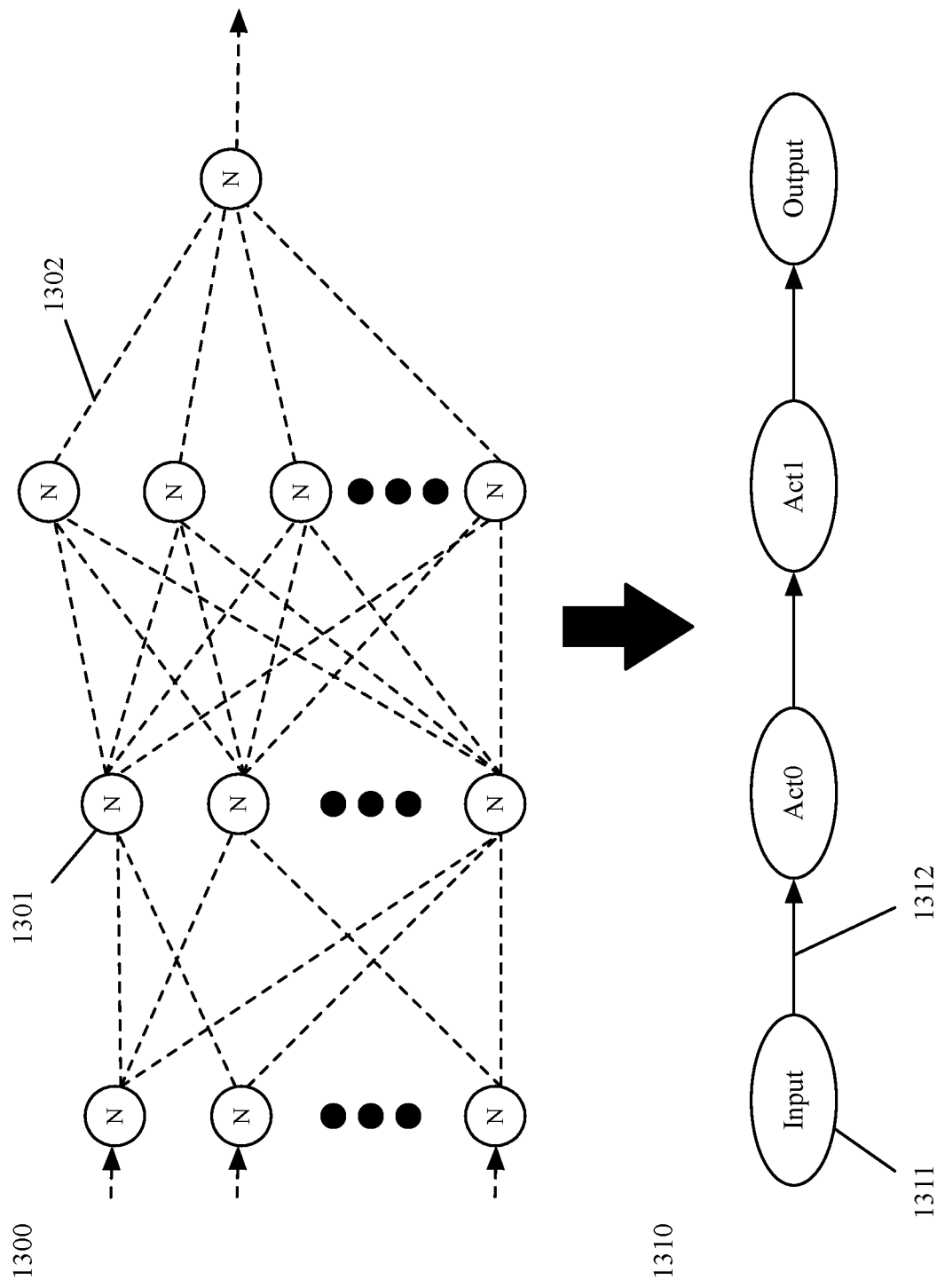
FIG. 13 illustrates a simple machine-trained (neural) network with 4 layers of neurons and connections between neurons.

FIG. 13 illustrates a simple machine-trained (neural) network 1300 with 4 layers of neurons 1301 and connections 1302 between neurons. Machine-trained (neural) network 1300, in some embodiments, includes a set of at least one of fully-connected layers, convolutional layers, deconvolutional layers, subsampling layers, pooling layers, etc. The compiler converts machine-trained network 1300 into a raw graph 1310 including nodes 1311 and edges 1312 that represent layers of the machine-trained network and connections between layers, respectively. While machine-trained neural network 1300 and raw graph 1310 show a neural network with a set of sequential layers, other types of machine-trained networks (recursive networks, recurrent networks, etc. that are not shown) are also translated into graphs by the compiler of some embodiments.

Figure 14:
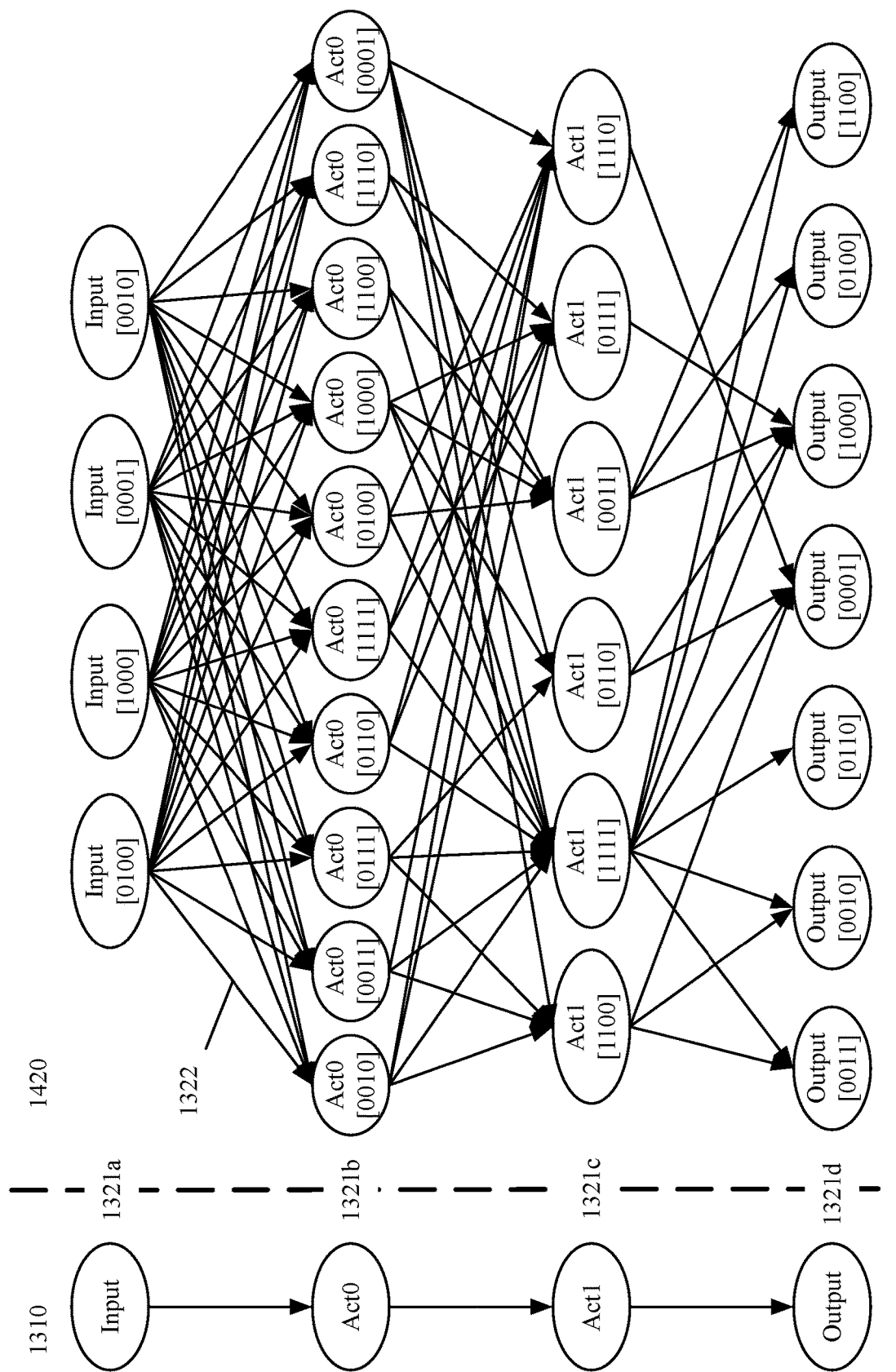
FIG. 14 illustrates the raw graph of FIG. 13 being translated into a full graph of enumerated possible implementations of each layer (input layer, subsequent layers of activations, and the output layer).

FIG. 14 illustrates the raw graph 1310 of FIG. 13 being translated into a full graph 1420 of enumerated possible implementations of each layer (input layer 1321a, subsequent layers of activations (Act0 layer 1321b and Act1 layer 1321c), and the output layer 1321d). As seen in the raw graph 1420, not all options are available for each layer. For example, the input layer includes options for the input layer to be implemented on any one of the four clusters (indicated by the vector below the layer name, each "1" indicating that a particular one of four clusters is used to implement the layer), but does not include any implementations with more than one cluster. In some embodiments, the use of additional clusters is excluded because less than all the cores of the cluster are necessary to implement the layer.

Subsequent layers 1321b, 1321c and 1321d are depicted as having multiple possibilities for number of clusters used to implement the layers. For example, layer 1321b is shown with implementation options using 1, 2, 3, or 4 clusters, while layer 1321c is shown with implementation options using 2, 3, and 4 clusters and layer 1321d is shown with implementation options using 1 and 2 clusters. These possibilities are determined using rules as described above in the description of FIG. 10. Connections 1322 between layers indicate possible paths through the graph. As depicted some nodes of the graph do not connect to nodes in subsequent layers. Nodes of the graph that do not connect indicate that the nodes represent implementations that are not compatible. For example, an option in layer 1321b that uses one cluster does not connect to implementations of layer 1321c using that same cluster with only one additional cluster. The incompatibility, in some embodiments, arises from conflicts that arise when trying to read and write to a same memory unit of a cluster (or core of a cluster). As shown, when using multiple clusters, options including contiguous clusters are identified as possibilities while options using non-contiguous clusters are not identified. In some embodiments, using contiguous clusters simplifies the implementation and also reduces the number of possibilities that must be considered and the time it takes to optimize the implementation, however, other embodiments identify all possible implementations including those with non-contiguous cluster use.

Figure 15:
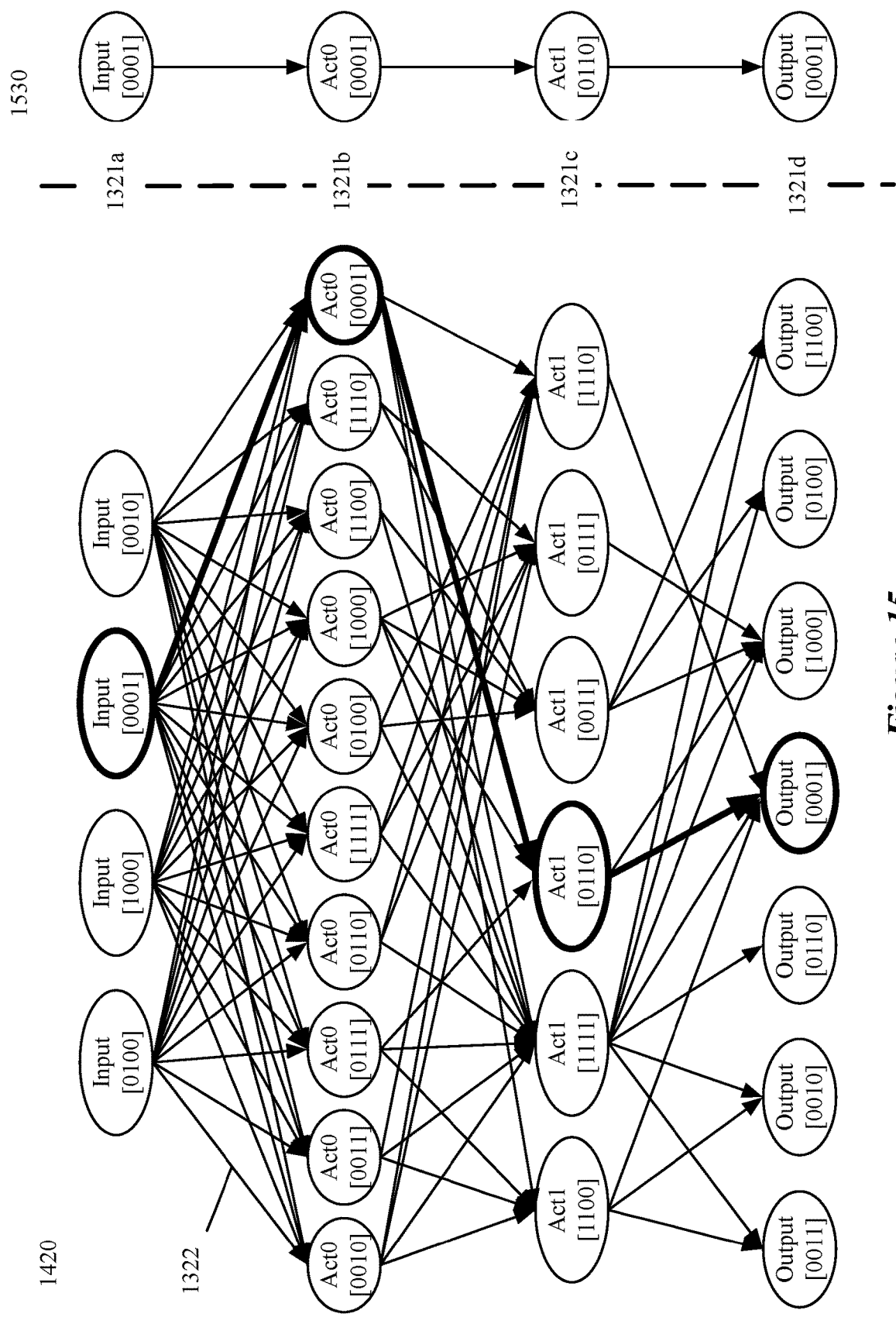
FIG. 15 illustrates the raw graph with optimized nodes identified for each layer along with the edges connecting the nodes.
Figure 16:
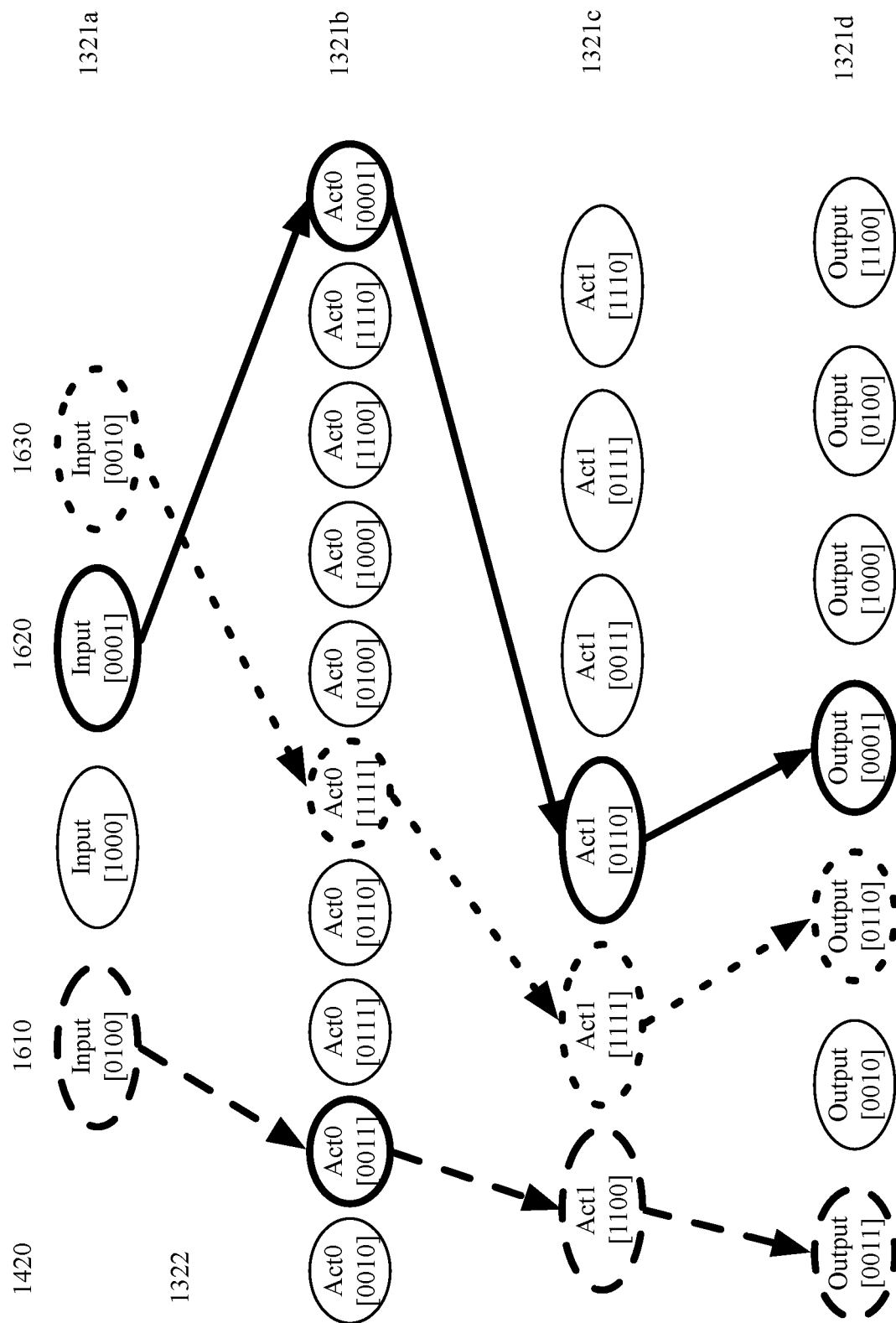
FIG. 16 illustrates a set of optimized paths that are each optimized for different criteria (optimization parameters).

FIG. 15 illustrates the raw graph 1420 with optimized nodes (i.e., Input [0001], Act0 [0001], Act1 [0110], and output [0001]) identified for each layer along with the edges connecting the nodes. Based on the selected nodes the optimized graph 1530 is generated by the compiler and configuration data for the optimized graph 1530 is generated. FIG. 16 illustrates a set of optimized paths 1610, 1620, and 1630 that are each optimized for different criteria (optimization parameters). For example, path 1610 represents an optimization for power at a given speed (e.g., frames per second (fps) of processing), path 1620 represents an optimization for power consumption, and path 1630 represents an optimization for processing speed (measured in terms of fps processed or clock cycles per input data set). As for FIG. 15, the compiler, in some embodiments, generates optimized graphs (not shown) and configuration data for each optimization.

In addition to optimizing the number of clusters and cores used to implement a machine-trained network, a compiler of some embodiments, also optimizes memory storage. In some embodiments, memory storage is optimized such that input and output layers of a single layer are not stored in a same memory unit. Such an optimization, in some embodiments, avoids attempting to read and write from a same memory unit within a core in a single clock cycle. In some embodiments, each core stores data for each layer at a same memory location (i.e., a same memory unit and a same location in the memory unit).

Figure 17:
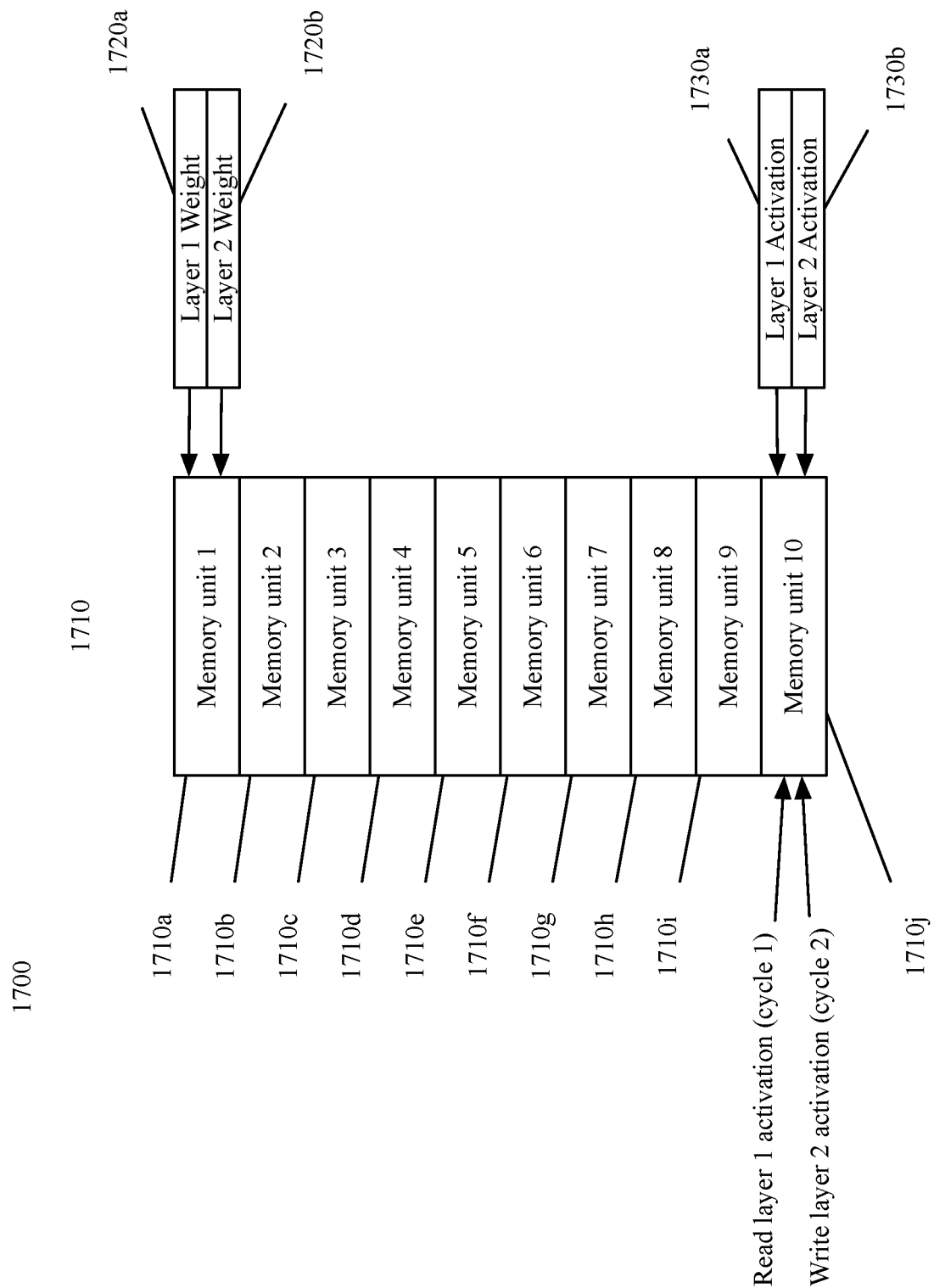
FIG. 17 illustrates a memory configuration including set of memory units of a core configured to store data for weights for different layers in a first memory unit and activations (inputs) for those layers in a second memory unit.

FIG. 17 illustrates a memory configuration 1700 including set of memory units 1710 of a core configured to store data for weights 1720 for different layers in a first memory unit 1710a and activations (inputs) 1730 for those layers in a second memory unit 1710j. In this example, processing the activations for layer 1 is assumed to produce the activations that are processed for adjacent layer 2 such that as the layer 1 processing proceeds, activation values for layer 2 are produced and must be stored (i.e., written) in the memory unit allocated for layer 2 activations. While the set of memory units 1710 can be subject to a read and write operation in a same clock cycle, a single memory unit cannot be the target for a read and write operation in a single clock cycle. FIG. 17 illustrates that, in such a configuration, a single memory unit storing activations for two adjacent layers must have read and write operations performed in separate clock cycles. As this introduces unnecessary additional clock cycles, in some embodiments, a compiler optimizes the memory storage configuration to avoid introducing these additional clock cycles to the processing of layer 1.

Figure 18:
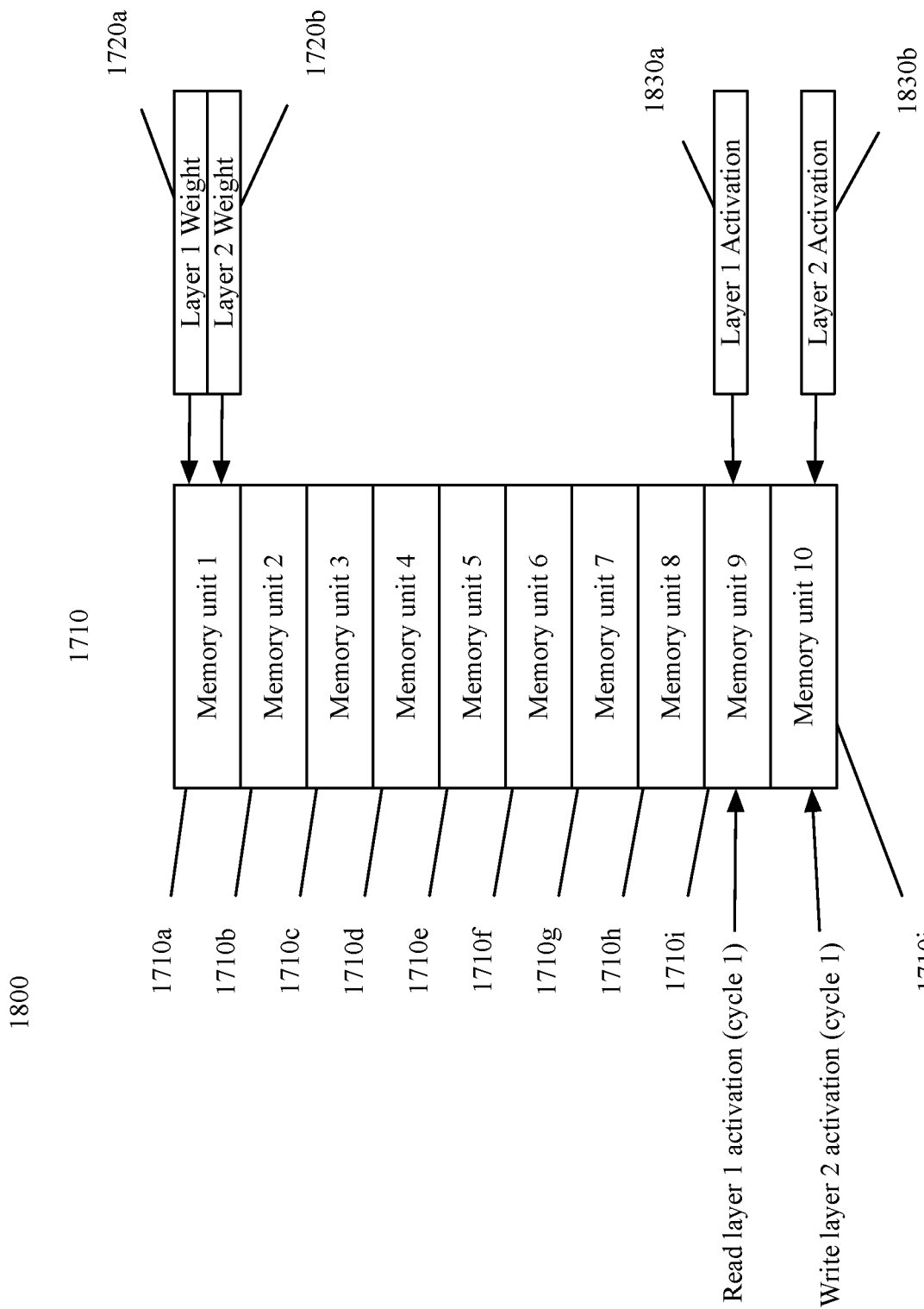
FIG. 18 illustrates a memory configuration including set of memory units of a core configured to store data for weights for different layers in a first memory unit and activations (inputs) for those layers in separate memory units.

FIG. 18 illustrates a memory configuration 1800 including set of memory units 1710 of a core configured to store data for weights 1720 for different layers in a first memory unit 1710a and activations (inputs) 1830 for those layers in separate memory units 1710i and 1710j. In this example, we once again assume that the activations for layer 1 are used to produce the activations that are processed for adjacent layer 2 such that as the layer 1 processing proceeds, activation values for layer 2 are produced and must be stored (i.e., written) in the memory unit 1710j allocated for layer 2 activations. In contrast to configuration 1700 of FIG. 17, configuration 1800 stores activations for adjacent layers in separate memory units so that read and write operations for the separate layers' activations can be performed in a same clock cycle.

Figure 19:
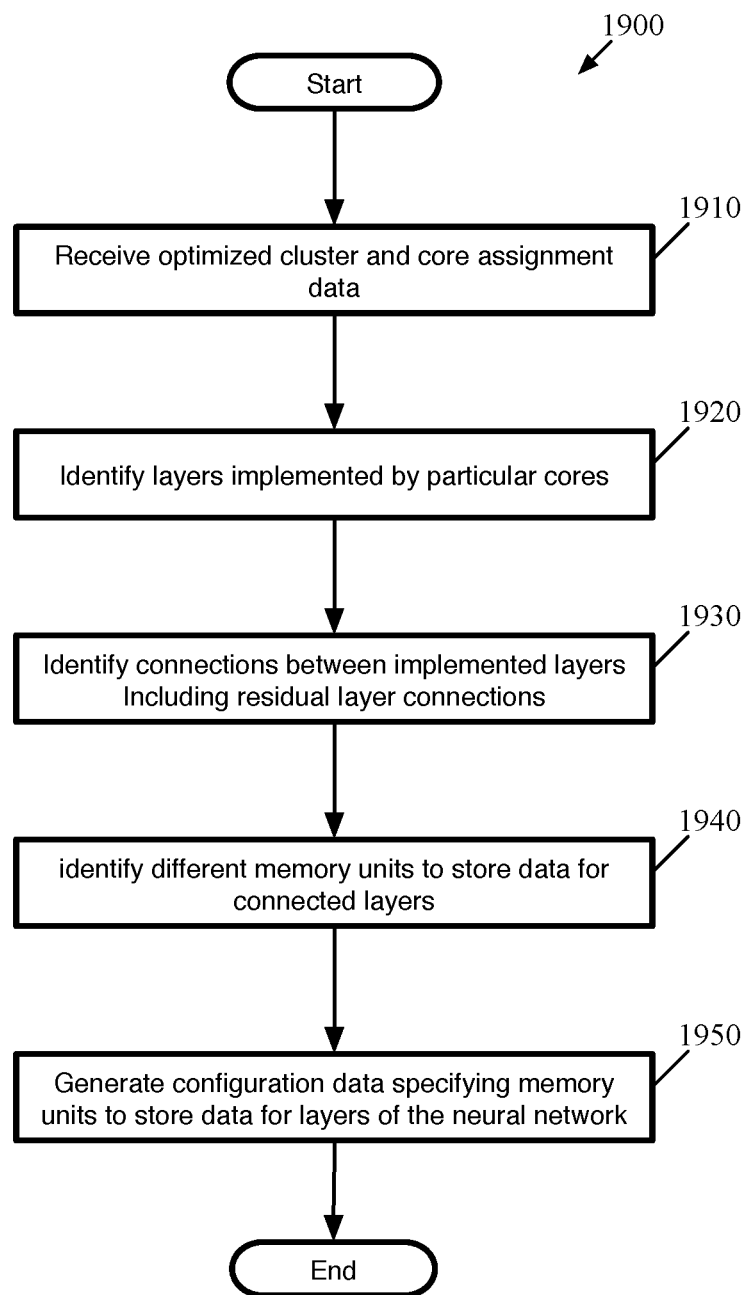
FIG. 19 conceptually illustrates a process for a compiler to perform to optimize the memory storage locations to avoid adding unnecessary extra clock cycles as described above.

FIG. 19 conceptually illustrates a process 1900 for a compiler to perform to optimize the memory storage locations to avoid adding unnecessary extra clock cycles as described above. In some embodiments, process 1900 is performed as part of process 1000 after identifying optimized implementation configurations (at 1040) and as part of generating configuration information (at 1050). Process 1900 begins by receiving (at 1910) a set of optimized cluster and core assignments, for example, those produced by process 1000.

After receiving the optimized cluster and core assignments, the process identifies (at 1920) layers implemented by particular cores. In some embodiments, less than all cores of a cluster are used to implement a particular layer of the machine-trained network. The identification, in some embodiments, also includes identifying a preliminary memory allocation for the different layers implemented by the cores.

Once the cores implementing particular layers are identified, the process identifies (at 1930) connections between implemented layers. The connections, in some embodiments, are connections between adjacent layers. In some embodiments, the connections include long range connections in which data from a non-adjacent, previous layer is used as an input for implementing a subsequent, non-adjacent layer (e.g., in residual neural networks). These connections, in some embodiments, indicate layers for which inputs and outputs should not be stored in a same memory unit (e.g., activations identified in a footprint of the mixed integer problem). For example, inputs for a particular layer should not be stored in the same memory unit as the outputs for that layer, and the process identifies connections between layers (especially non-adjacent layers) to avoid this situation.

After cores implementing layers and connections between layers are identified, the process identifies (at 1940) memory units of each core to store the activations associated with each layer. The identified memory units are selected to avoid adding another cycle in order to schedule a read and write operation to a same memory unit instead of concurrently reading from a first memory unit and writing to another memory unit. For example, a particular core implementing a first layer whose output is the input for a second layer also implemented by the particular core has a first memory unit identified to store activations (input) for the first layer and a second, different memory unit identified to store the output of the first layer that are the activations (input) used for the second layer.

Once the memory units are identified (at 1940), the process generates (at 1950) configuration data specifying the identified memory units for storing activations for each layer of the machine-trained network. In some embodiments, the default memory locations are maintained for any layers that are not connected to layers implemented by a same core as no additional cycles need to be added for reading and writing for those layers. In some embodiments, this configuration data generation is included as part of the configuration data process described above in relation to FIG. 10 and process 1000.

In some embodiments, process 1900 for bubble minimization (i.e., minimizing the number of related activation memories that are stored in a same memory unit) is realized using a satisfiability solver and appropriate satisfiability conditions based on the definition of the machine-trained network. For example, in some embodiments, a set of inputs is defined. The set of inputs includes, in some embodiments, a footprint "F" that identifies activations that must be stored in the memory at the same time, a maximum activation size on any core for each activation, an available space in each core after weight allocation, a set of cores on which each activation is stored, an effective core size for each activation, a number of memory banks in each core, and a number of memory words in each bank. In some embodiments, a set of variables for an interval are defined such as start, duration, and end that are subject to the constraint that duration is greater than 0, and that the start plus the duration is equal to the end. In some embodiments, the interval variables specify locations in memory for a particular activation. Additional variables, in some embodiments, include start, duration, and end values for a memory block as defined for an entire core and for specific memory units of the core.

Boolean variables for identifying overlap and functions to generate values for the variables are defined in some embodiments. For example, a disjunctive function is defined to determine if a first interval variable starts before a second interval variable ends or vice versa (i.e., to determine if the intervals overlap) and an intersection function to determine the cores for which there is overlap between any two activations that is applied to activations in a footprint set to determine if there is any overlap between cores. Additional operations are performed to determine a starting and ending memory unit for a particular activation based on the core memory block start and end locations (or start location and duration) and the number of words per memory unit, and to determine for all activation with non-zero intersection sets whether any banks (memory units) overlap for different activations in a same footprint set. A bubble value is then defined as the total number of overlapping banks found. A SAT solver is then used to minimize the number of bubbles (overlapping activation sets in a same footprint set) and to output a set of optimal start locations for the various activations and an indication for each pair of activations that require a "bubble" (an additional write cycle to separate read and write operations to a same memory unit (bank)).

In some embodiments, the compiler also generates instructions for gating operations. Gating operations, in some embodiments, include gating at multiple levels (e.g., gating of clusters, cores, or memory units). Gating operations conserve power in some embodiments by gating signals so that they do not reach the gated element or so that they are not propagated within the gated element. In some embodiments, a clock signal is gated such that a register that transmits data on a rising (or falling) edge of a clock signal is not triggered.

Figure 20:
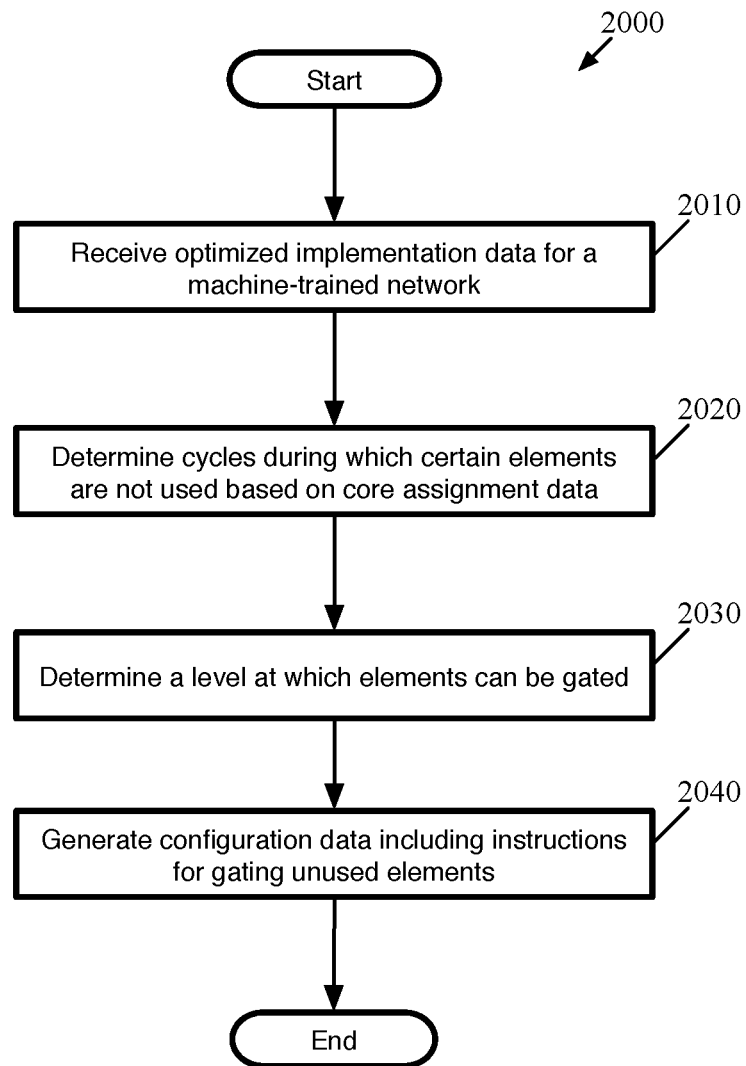
FIG. 20 conceptually illustrates a process for generating instructions for gating operations.

FIG. 20 conceptually illustrates a process 2000 for generating instructions for gating operations. In some embodiments, process 2000 is performed by the compiler after the optimized implementation is identified as part of generating the configuration data for implementing the machine-trained network as described in relation to FIG. 10 and process 1000. Process 2000 begins by receiving (at 2010) optimized implementation data for the machine trained network. In some embodiments, process 2000 is performed after process 1900 so that a final assignment of clusters, cores and memory units is determined.

The process then determines (at 2020) cycles during which certain elements (clusters, cores, memory wrappers, memory units, etc.) are not used based on the optimized implementation. For example, a particular layer may be implemented by only 2 clusters, by only 3 cores of each cluster, and for certain cycles may use 0, 1, or 2 memory units accessed through a memory wrapper. For all cycles implementing the layers, the 2 unused clusters may be gated (if not shutdown entirely), the unused core of each used cluster may be gated, and the unused memory units may be gated (if not shutdown) with the memory wrapper gated for those cycles not using any memory units of the memory wrapper.

The process then determines (at 2030) the level at which the unused elements can be gated. For different layers, and cycles during the implementation of the layers, elements at different levels (cluster, core, memory wrapper, memory unit) may be unused, but not shutdown. For example, a particular core may only use two memory units for reading an initial set of data for implementing a particular layer, the rest of the memory units can be gated or shutdown (as described below in relation to FIG. 22) but the core and cluster must still receive and propagate signals, however, if an entire core (or cluster) is not being used to implement a particular layer, gating can occur at the level of the core (or cluster).

Once the level at which elements can be gated is determined (at 2030), the process generates at (2040) configuration data including instructions for gating unused elements. In some embodiments, process 2000 is performed as part of process 1000 for finding an optimized implementation and generating configuration data for the optimized implementation. In some embodiments, the gating instructions are implemented by hardware elements of the IC that are specific.

Figure 21:
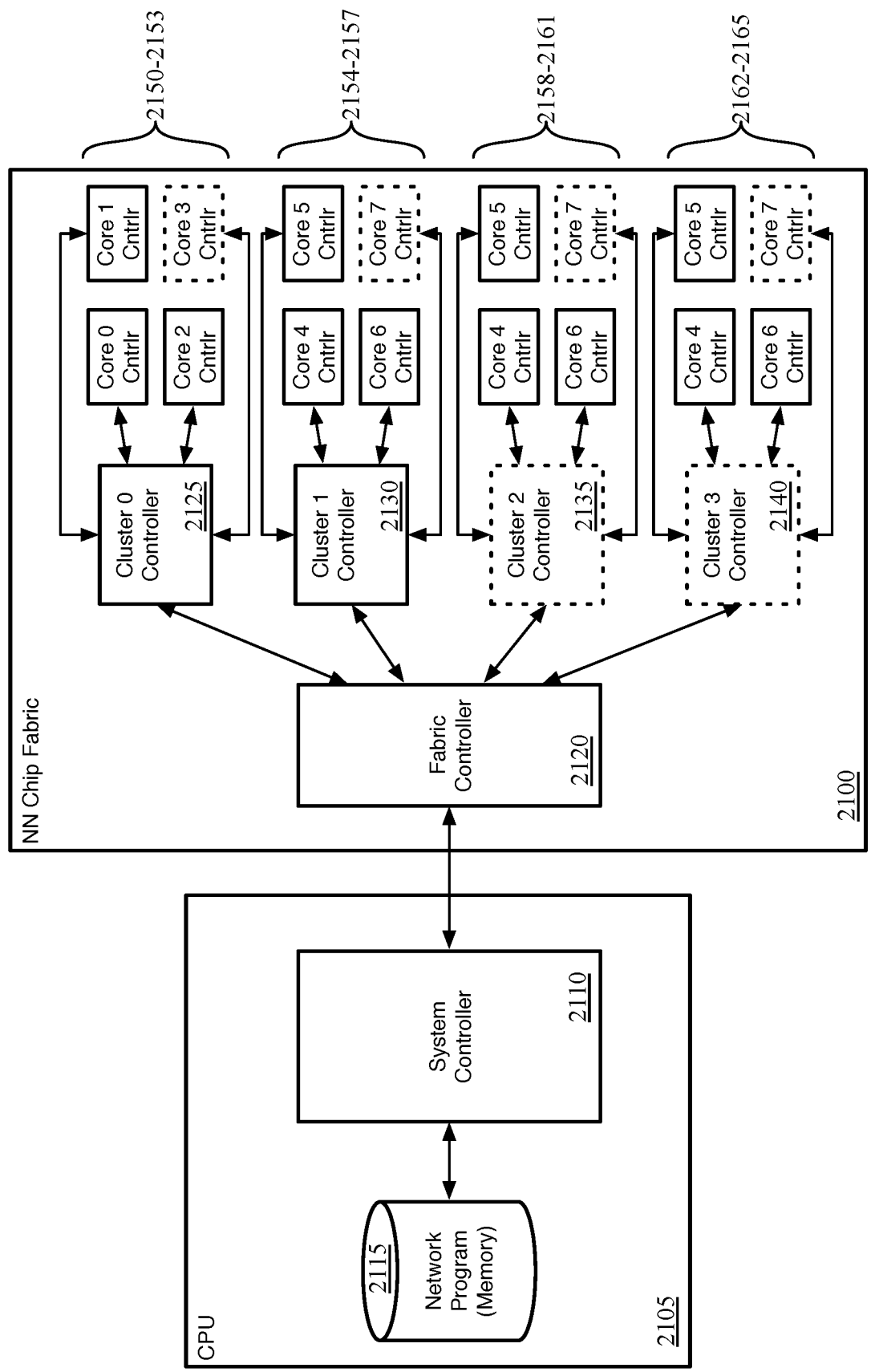
FIG. 21 illustrates an embodiment in which different elements are gated at different levels of a hierarchy.

FIG. 21 illustrates an embodiment in which different elements are gated at different levels of a hierarchy. FIG. 21 reproduces the elements of FIG. 5 and indicates a set of core controllers 2153, 2157, 2161, and 2165 and cluster controllers 2135 and 2140 that receive instructions for gating the cores and clusters they control. In some embodiments, the core controllers of gated clusters do not receive the instructions for gating the cores they control because the cluster controller of the cluster to which they belong has received an instruction to gate the entire cluster. In some embodiments, gated elements in different clusters are addressed by a same value (index) and are either all gated or not gated.

Figure 22:
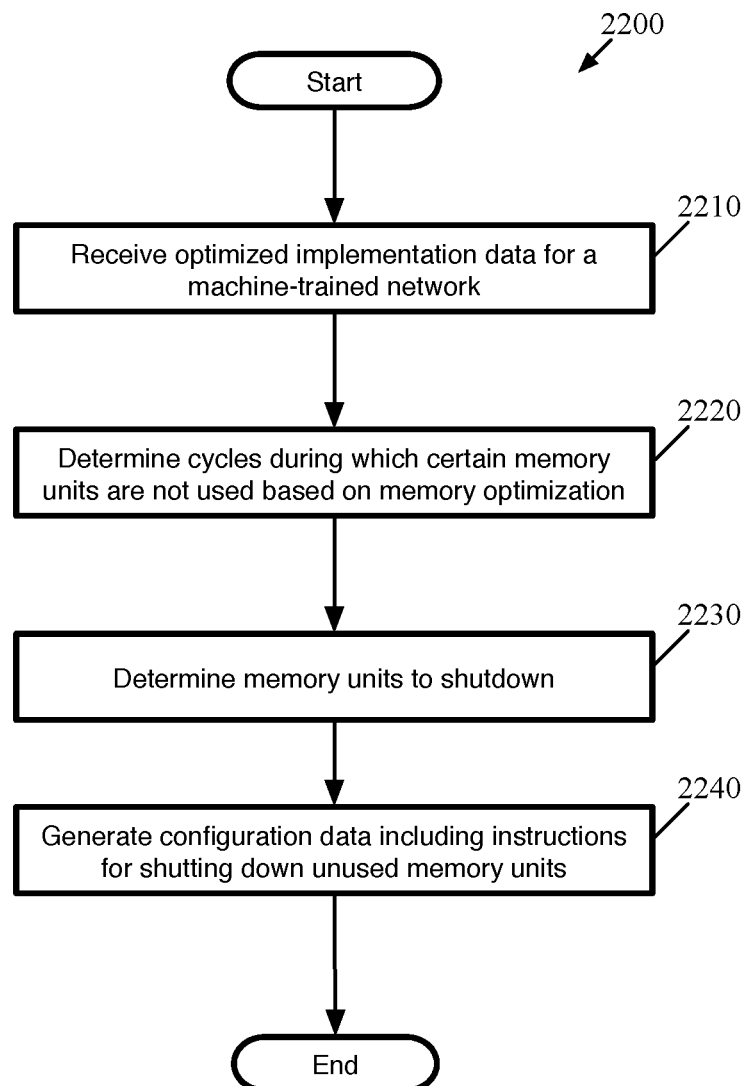
FIG. 22 conceptually illustrates a process for determining which memory units to shut down.

The compiler of some embodiments is also responsible for generating instructions relating to shutting down (and waking up) memory units of cores. FIG. 22 conceptually illustrates a process 2200 for determining which memory units to shut down. In some embodiments, the memory units to shutdown are determined by the compiler based on the data that is stored or will be stored in the particular memory units. For example, a memory unit that stores input data for a first layer of the machine-trained network and will not be used for a specific period of time (e.g., a threshold number of (1) clock cycles or (2) milliseconds) may be shut down after loading the data to the partial dot product computation circuits for the computations associated with the first layer until it is woken up to be used for a subsequent layer. Shutting down a memory unit, in some embodiments, causes the data stored in the memory unit to be lost and requires a number of cycles (e.g., 100 cycles) to be reversed. Process 2200 begins by receiving (at 2210) optimized implementation data for a machine-trained network. The optimized implementation data, in some embodiments, is received as part of process 1000 and include data optimized for cluster and core use (described in relation to FIG. 10), memory unit usage (described in relation to FIG. 19), and channel rearrangement (described below in relation to FIG. 25).

The process continues by determining (at 2220), based on the optimized implementation, which memory units are in use (and not in use) during each cycle of the machine-trained network execution. In some embodiments, the machine-trained network execution, including the memory access (e.g., read and write operations) in each clock cycle is fully specified by the optimized implementation data. In some embodiments, the optimized implementation data provides enough information to generate a full specification of the machine-trained network execution including memory access (e.g., read and write operations) for each clock cycle. The optimized implementation data, in some embodiments, has been optimized for a particular optimization parameter and has had its memory storage locations optimized to avoid adding additional cycles based on a need to read and write to a same memory unit.

In some embodiments, memory units identified as unused are of cores (or clusters) that are not used to execute a particular layer of the machine-trained network. Additionally, some embodiments identify a subset of memory units within a core that are not being used even when the core is being used to execute the machine-trained network. In some embodiments, a distinction is made between memory units storing weight data that is constant for each set of input data and memory units available for storing activation (output) data for each layer, such that memory units storing weight data are not shut down unless all memory units are shut down during a time that the machine-trained network is not executing on the neural network inference circuit.

Based on the determination of the unused memory units for each cycle, the memory units to be shut down (e.g., put in to a shutdown state) at different times are determined (at 2230). In some embodiments, the determination is made based on the number of cycles a memory unit will not be used. Shutting down a memory unit causes data stored in the memory unit to be lost, so the determination is also made based on whether data stored in the memory unit will be necessary for subsequent computations. Whether data will be necessary for subsequent computations, in some embodiments, is determined based on whether each write operation is followed by a read operation for a memory unit before the time period that the memory unit is not in use, such that any write operation that is not followed by a read operation is assumed to be necessary for a subsequent operation. Additional verification is required, in some embodiments, even when data written to a memory unit is subsequently read before a period of inactivity that the data is not necessary for additional subsequent computations.

In some embodiments, a power cost is associated with shutting down a memory unit and the power cost is compared to the power saved during the period that the memory unit will be shut down to determine if the memory unit will be shut down. The determination as to which memory units to shut down, in some embodiments, also includes a time to send a signal to power on (e.g., transition into an active state) the memory units so that they are accessible by the clock cycle in which they will be accessed. Powering on a memory unit, in some embodiments, takes a certain number of cycles and the number of cycles necessary for powering on a memory unit is taken into account when calculating the power savings to determine whether a memory unit will be shut down.

After determining the memory units to shut down (and power on) at particular times, configuration data is generated (at 2240) that includes a specification of the determined times and memory units and the process ends. In some embodiments, the generated configuration data is included in the configuration data generated (at 1050) by process 1000. The program instructions generated (at 1060) by process 1000, in such embodiments, include instructions for shutting down and powering on memory units. In some embodiments, the instructions include instructions for shutting down memory units of cores (or clusters) storing activation data that are not used to execute a particular layer of the machine-trained network. Additionally, some embodiments include instructions for shutting down a subset of memory units within a core that are not being used even when the core is being used to execute the machine-trained network. Additional operations to shut down the whole neural network inference circuit are used in other embodiments when a machine-trained network is run intermittently, and power is conserved by reloading the weights and program instructions as the machine-trained network is executed using the neural network inference circuit.

Figure 23:
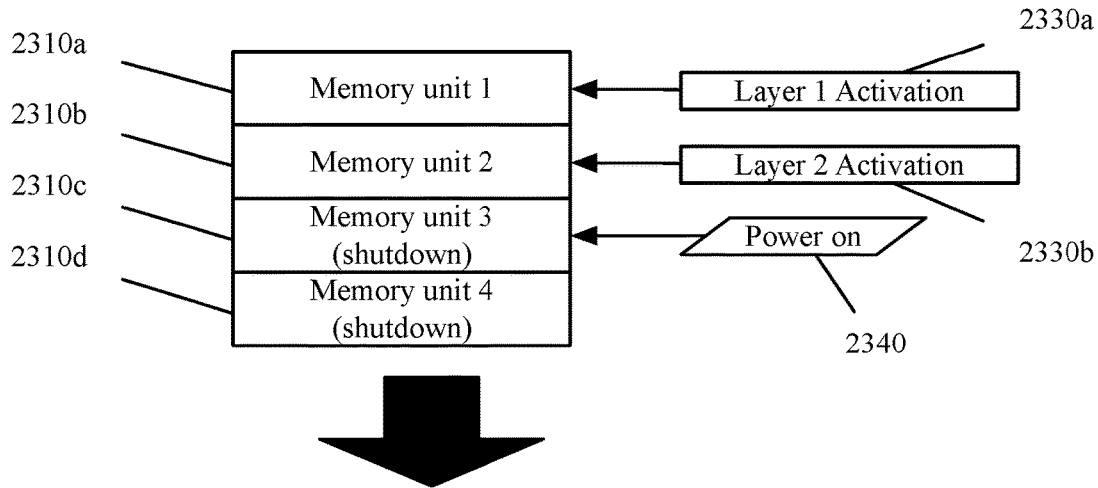
FIG. 23 illustrates an embodiment of a set of memory units of a core (not shown) for a set of sequential layers using the core that are sequentially shut.
Figure 23:
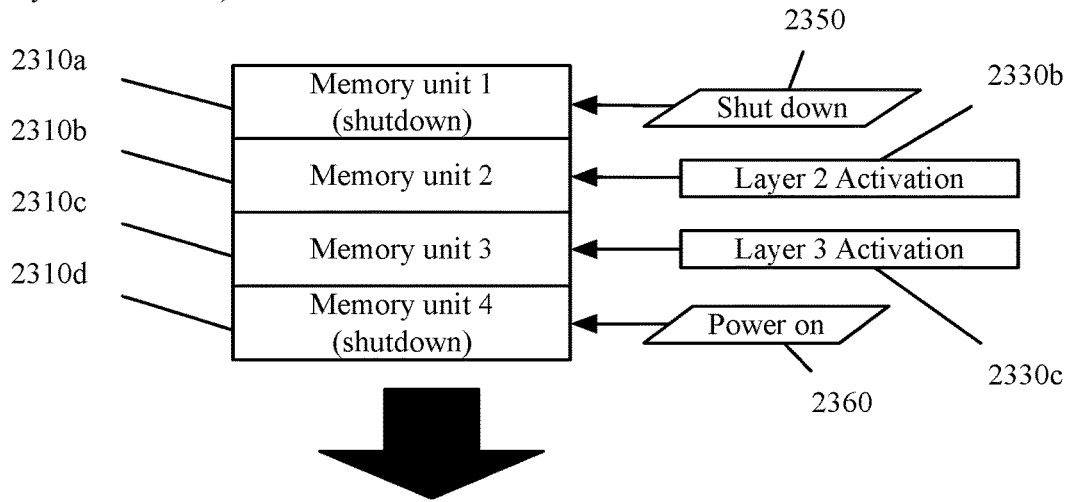
Figure 23:
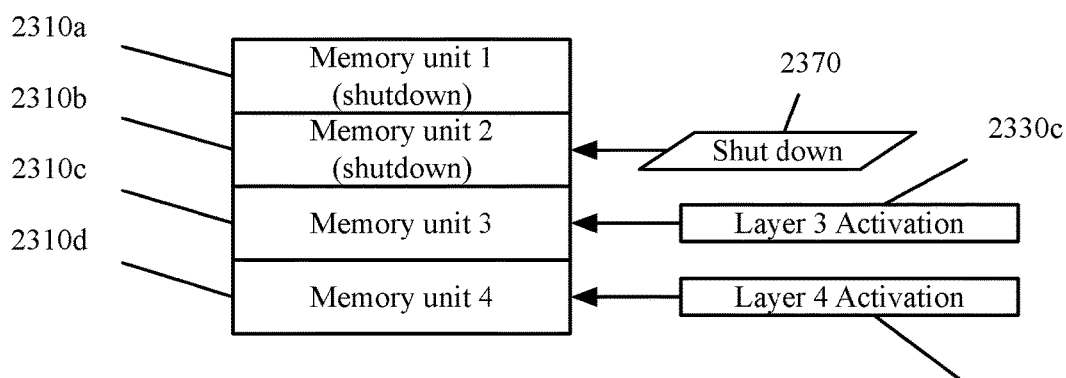

FIG. 23 illustrates an embodiment of a set of memory units 2310a-d of a core (not shown) for a set of sequential layers using the core that are sequentially shut down as the beginning of a rolling shutdown process that has a limited number of active memory units that are cycled through to store activation (e.g., output) data for layers of the machine-trained network. FIG. 23 illustrates the memory units during the execution of three layers (layers 2-4) of a machine-trained network. Stage 2301 illustrates the execution of a second layer of the machine-trained network that uses the activations 2330a from the first layer (layer 1) of the machine-trained network stored in memory unit 2310a to produce the activations 2330b of the second layer (layer 2) stored in 2310b. During the execution of layer 2 an instruction is received by memory unit 2310c to power on for storing the activations of the subsequent layer (layer 3).

Stage 2302 illustrates the execution of a third layer of the machine-trained network that uses the activations 2330b from the second layer (layer 2) stored in memory unit 2310b to produce the activations 2330c of the third layer (layer 3) stored in memory unit 2310c (the memory unit powered on during the execution of the previous layer of the machine-trained network). During the execution of the third layer, the first memory unit 2310a receives an instruction to shut down as the activations from the first layer are no longer needed. However, in embodiments in which the activations from the first layer are used to produce the activations from a subsequent layer, the memory units storing the activation for the first layer cannot be shut down. As in stage 2301, an instruction to power on an additional memory unit 2310d is received during the execution of the third layer so that the memory unit will be available by the time the execution of the next layer begins (in some embodiment the time required for powering on may be greater than the execution of a particular layer and the instruction to power on would be received in the execution of a previous layer in the machine-trained network).

Stage 2303 illustrates the example of a fourth layer of the machine-trained network that uses the activations 2330c from the third layer (layer 3) stored in memory unit 2310c to produce the activations 2330d of the fourth layer (layer 4) stored in memory unit 2310d (the memory unit powered on during the execution of the previous layer of the machine-trained network). During the execution of the fourth layer, the second memory unit 2310*b* receives an instruction to shut down as the activations from the second layer are no longer needed. As above, in embodiments in which the activations from the second layer are used to produce the activations from a subsequent layer, the memory units storing the activation for the second layer cannot be shut down.

Figure 24:
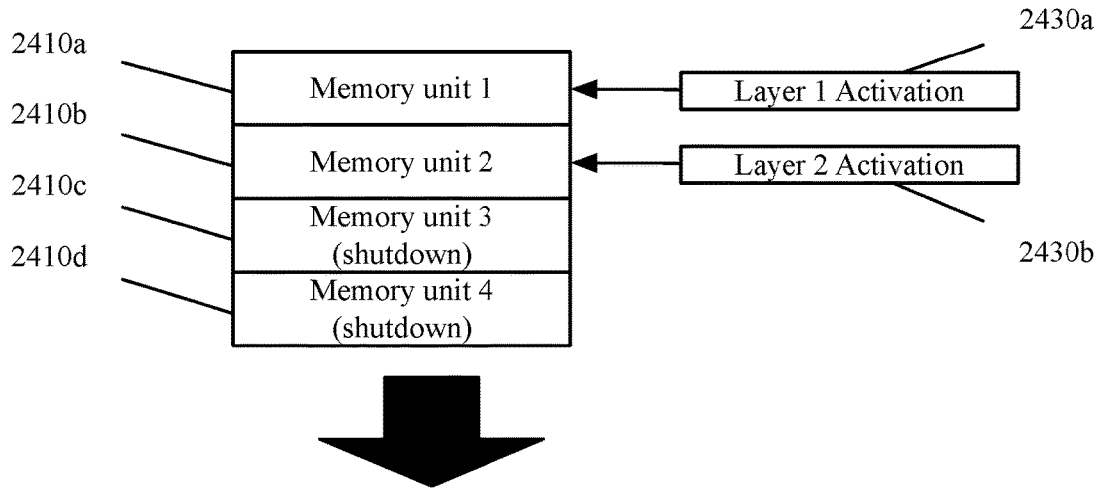
FIG. 24 illustrates an embodiment of a set of memory units of a core (not shown) for a set of sequential layers reusing memory units of the core and powering on additional memory units as needed.
Figure 24:
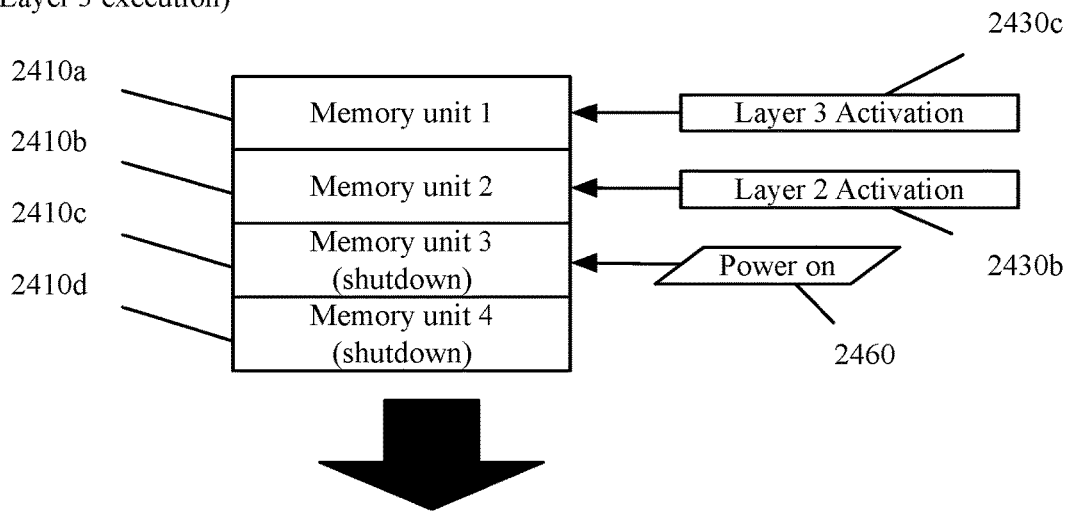
Figure 24:
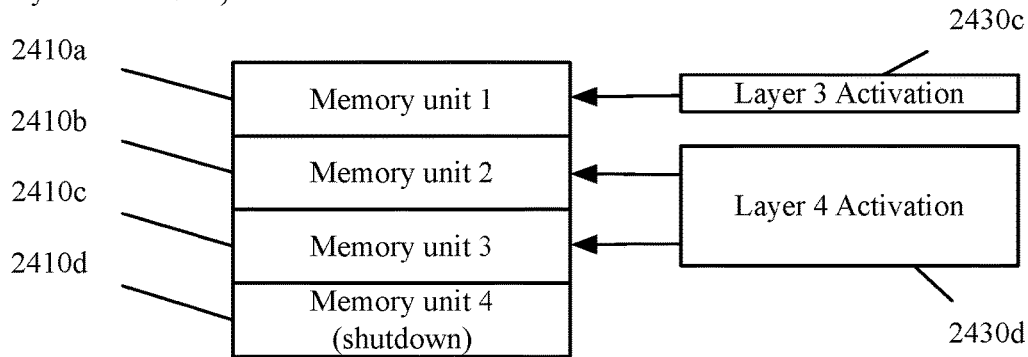

FIG. 24 illustrates an embodiment of a set of memory units 2410*a-d* of a core (not shown) for a set of sequential layers reusing memory units of the core and powering on additional memory units as needed to store activation (output) data for layers of the machine-trained network. FIG. 24 illustrates the memory units during the execution of three layers (layers 2-4) of a machine-trained network. Stage 2401 illustrates the execution of a second layer of the machine-trained network that uses the activations 2430*a* from the first layer (layer 1) of the machine-trained network stored in memory unit 2410*a* to produce the activations 2430*b* of the second layer (layer 2) stored in 2410*b*. As opposed to the previous example, the embodiment in FIG. 24 reuses memory units instead of using a rolling shutting down and powering on. In some embodiments, reusing memory units instead of powering on and shutting down memory units conserves power (based on the cost associated with shutting down).

Stage 2402 illustrates the execution of a third layer (layer 3) of the machine-trained network that uses the activations 2430*b* from the second layer (layer 2) stored in memory unit 2410*b* to produce the activations 2430*c* of the third layer (layer 3) stored in memory unit 2410*a* (the memory unit previously storing activations for layer 1). During the execution of the third layer, the third memory unit 2410*c* receives an instruction to power on as the activations from the next (fourth) layer require more than one memory unit for storage.

Stage 2403 illustrates the execution of a fourth layer (layer 4) of the machine-trained network that uses the activations 2430*c* from the third layer to produce the activations 2430*d* of the fourth layer which are stored in memory units 2410*b* and 2410*c* (the memory unit powered on in anticipation of the additional storage necessary for storing the activations of the fourth layer). One of ordinary skill in the art will appreciate that these are merely two different scenarios for memory shutdown and powering on and that, in practice, additional implementations of memory shutdown are used depending on the particular machine trained network being implemented using the machine-trained network inference circuit. One of ordinary skill in the art will also appreciate that the input and output of a particular layer of the machine-trained network do not always reside on a same core (or even on a same cluster of cores) and that FIGS. 23 and 24 illustrate a single core for clarity.

Figure 25:
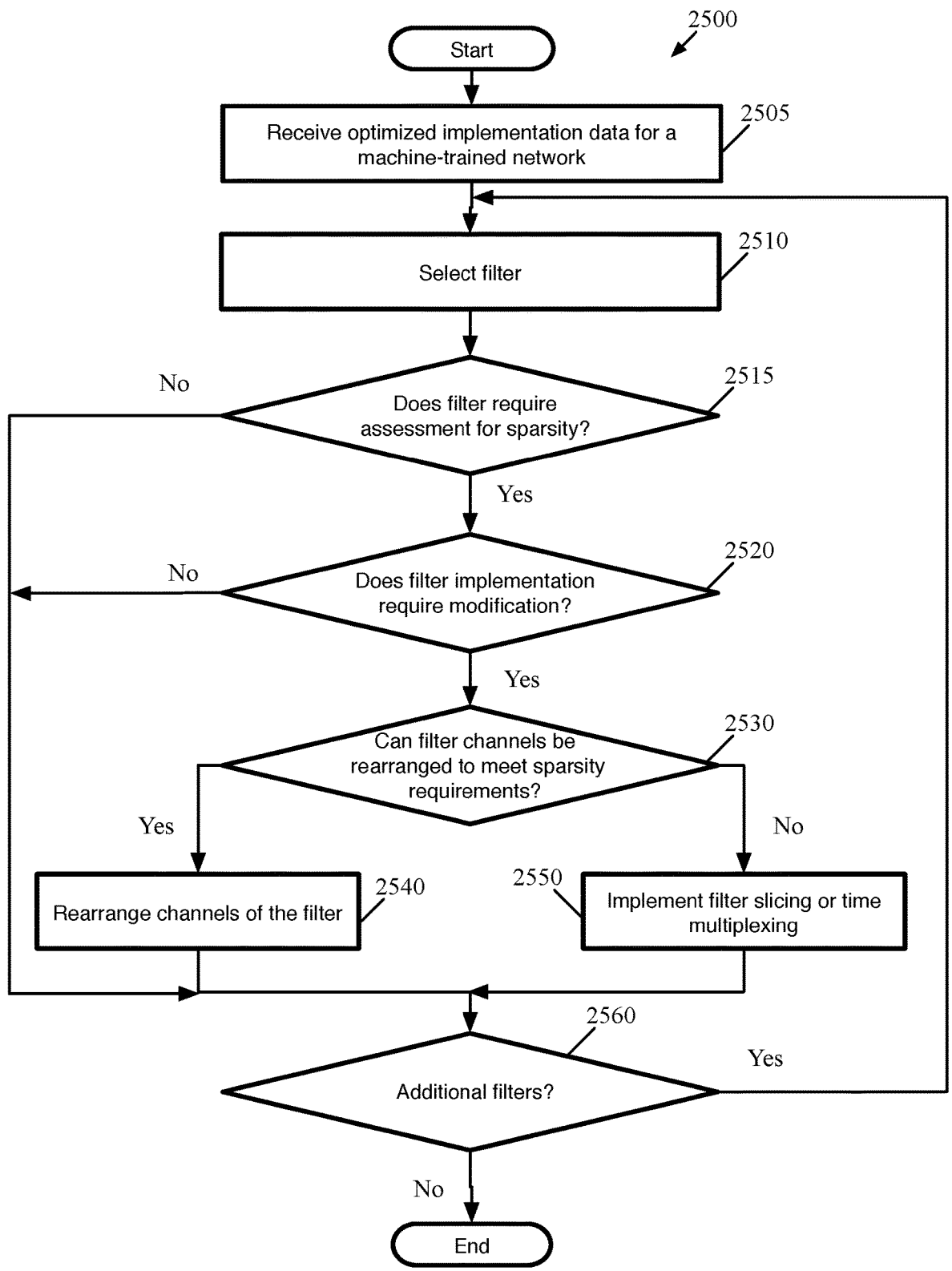
FIG. 25 conceptually illustrates a process for determining whether channels of a filter need to be rearranged to meet sparsity requirements and whether they are capable of being rearranged or whether other methods of dealing with a lack of sparsity are necessary.

As discussed above, each cluster is limited in the number of non-zero values that can be provided to the dot-product calculation circuitry of the core. In some embodiments, the compiler determines whether sparsity requirements of channels implemented on the individual cores are met on each core (or on each partial dot product computation circuit of the core). If the sparsity requirement is not met, the compiler, in some embodiments, determines whether the channels of the filter can be rearranged to meet the sparsity requirements on each core (or on each partial dot product computation circuit of the core) and, based on the determination, either rearranges the filter channels or implements a solution to non-sparsity as described in U.S. patent application Ser. No. 16/212,643, filed Dec. 6, 2018, which is incorporated herein by reference. FIG. 25 conceptually illustrates a process 2500 for determining whether channels of a filter need to be rearranged to meet sparsity requirements and whether they are capable of being rearranged or whether other methods of dealing with a lack of sparsity are necessary. In some embodiments, process 2500 is performed by the compiler as part of process 1000 (at 1050) before generating the program instructions.

Process 2500 begins by receiving (at 2505) optimized implementation data for a machine-trained network. In some embodiments, the optimized implementation data includes the optimized path selection identifying the clusters of the neural network inference circuit (i.e., neural network chip fabric) used to implement the different layers of the machine-trained network. In some embodiments, the optimized implementation data also includes the optimizations for either memory unit usage, gating of unused elements, or both memory unit usage and gating. A default assignment of filters or sets of channels of filters, in some embodiments, is included in the optimized implementation data. In some embodiments, the default assignment is based on an assumption that each channel of each filter meets a sparsity requirement (e.g., 75% zero values) established for the weights of the machine-trained network. Process 2500 is performed to ensure that the optimized assignment can be implemented and to optimize the implementation to avoid unnecessary clock cycles during the implementation.

After receiving the optimized implementation data, the process selects (at 2510) a filter to analyze. The filter, in some embodiments, is selected from a set of filters of the neural network beginning at a first layer and moving forwards while in other embodiments, the selection begins at a last layer and moves backwards through the layers of the neural network. In other embodiments, filters are selected using different algorithms understood by one of ordinary skill in the art.

After selecting (at 2510) a filter, the process, in some embodiments, determines (at 2515) whether, for the selected filter, the filter requires assessment for sparsity. In some embodiments, the determination is based on a total number of non-zero values across the channels of the filter, while in other embodiments the determination is made for each set of channels assigned to a particular core (or a partial dot product computation circuit of the core). In some embodiments, the determination is made as to whether a threshold number of non-zero values is present in the filter or the set of filters. For example, if a filter or set of channels has less than 32 non-zero weights (the number depends on the number of multiplexers in the partial dot product computation circuits) there is no need to rearrange any channels. In some embodiments, this determination is skipped and is included in the determination (at 2520) whether the sets of channels of the filter must be rearranged. If the filter does not require assessment for sparsity, the process proceeds to 2560 to determine if there is another filter in the machine-trained network that has not been assessed for sparsity. If the filter requires assessment, the process proceeds to 2520.

If the filter needs to be assessed for sparsity, the process determines (at 2520) whether the filter implementation requires modification. In some embodiments, modification is required when a first (default) assignment of sets of channels of the filter to particular cores (or partial dot product computation circuits of the cores) results in too many non-zero weights being assigned to a single partial dot product computation circuit (i.e., more weights than multiplexers, or the weights are organized in a way that cannot be accommodated by the configuration of multiplexers) or too many non-zero weights to be implemented without filter-splitting or time-multiplexing (computing the partial dot product using two activation buffers in alternative clock cycles). If the filter can be implemented by the partial dot product computation circuits according to the first assignment, the process continues to 2560 to determine if there is another filter in the machine-trained network that has not been assessed for sparsity. If the filter requires rearrangement, i.e., the filter cannot be implemented according to the first assignment or requires filter-splitting or time-multiplexing, the process proceeds to 2530.

The process then determines (at 2530) whether the channels of the filter can be rearranged to meet the sparsity requirements on each core (e.g., using the set of partial dot product computation circuits of the core). In some embodiments, the determination is made by identifying the number of non-zero weight values in each channel of the filter and determining whether the channels can be rearranged into sets of channels that each meet the sparsity requirement. The determination, in some embodiments, also includes a determination as to whether the weights are arranged in a way that can be implemented using the assigned partial dot product computation circuits (without time-multiplexing). If the process determines (at 2530) that the weights are not capable of being arranged to be implemented using the partial dot product computation circuits in a single clock cycle (e.g., without time-multiplexing), the process proceeds to 2550 to implement filter slicing or time-multiplexing as described in U.S. patent application Ser. No. 16/212,643 and the process proceeds to 2560 to determine if there is another filter in the machine-trained network that has not been assessed for sparsity. One of ordinary skill in the art will appreciate that rearrangement is more difficult for filters with larger channels (a 7×7 filter channel vs. a 3×3 filter channel) as each channel is not broken up (spread) to be computed by multiple cores such that each core computes values for a smaller number of complete channels giving less options for switching or rearranging channels to meet the sparsity requirement.

If, however, the process determines (at 2530) that the channels can be rearranged, the process proceeds to rearrange (at 2540) the channels of the filters to be implemented according to a second assignment to partial dot product computation circuits of the different cores (and clusters). In some embodiments, the second assignment is over the same set of partial dot product computation circuits as the first (default) assignment but the sets of channels are rearranged sets of channels such that at least two sets of channels in the sets of channels that make up the filter have rearranged (e.g., switched) channels. In other embodiments, the second assignment is over the same set of cores as the first (default) assignment but rearranges the sets of channels such that none of the sets of channels in the first assignment are used in the rearranged sets of channels.

Figure 26:
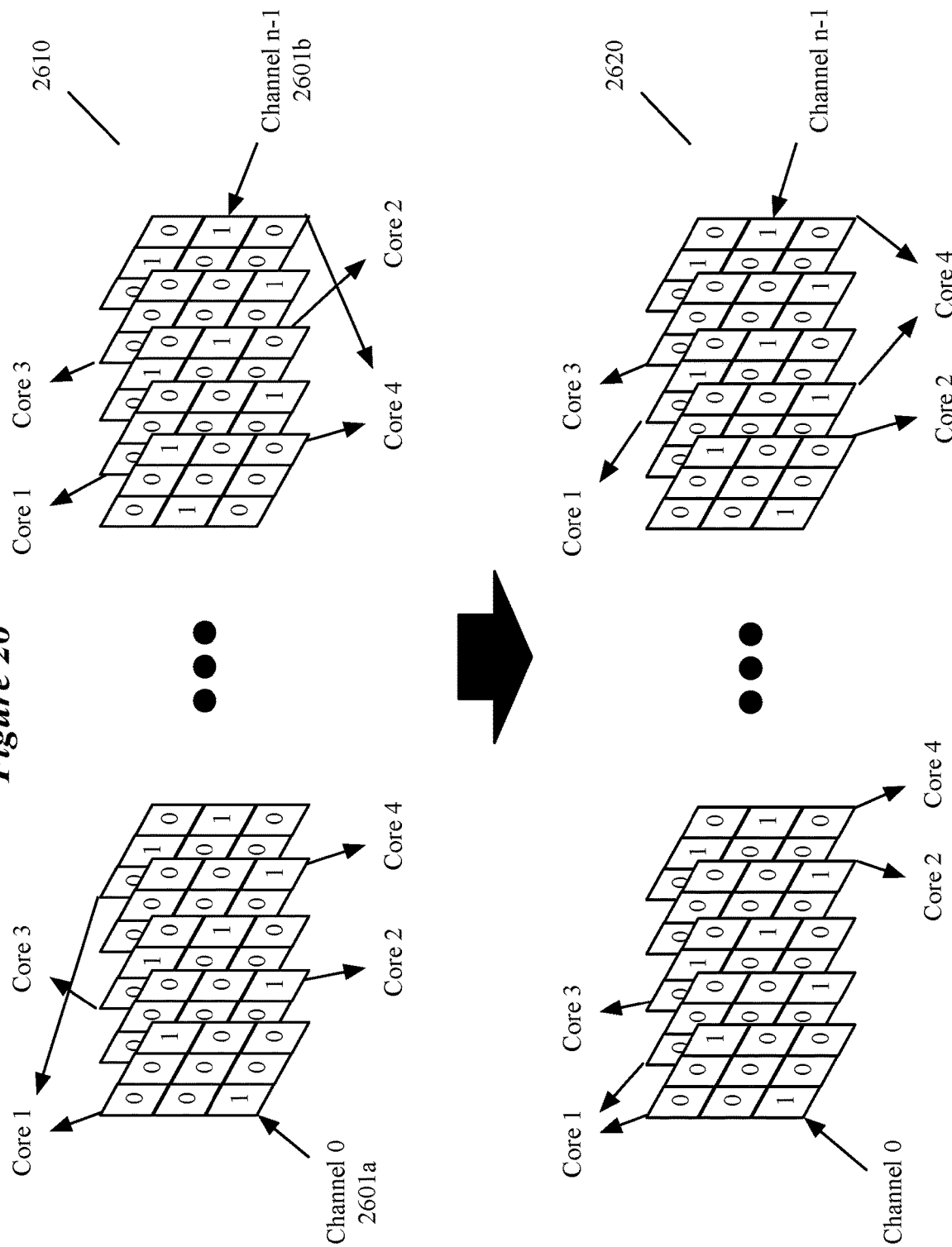
FIG. 26 illustrates a rearrangement of channels of a filter assigned to cores from a naïve distribution of channels among a set of 4 cores of a neural network inference circuit.

FIG. 26 illustrates a first assignment 2610 of channels 2601 of a filter to cores (e.g., partial dot product computation circuits of the core) using a naïve distribution of channels among a set of 4 cores of a neural network inference circuit and a rearranged assignment 2620 of channels among the same set of cores to ensure that each set of channels can be executed in a single clock cycle for calculating partial dot products. The first assignment 2610 assigns n−1 channels of a filter cyclically over the set of cores (e.g., using a modulo function) such that a first of four cores is assigned to compute a partial dot product for channels with indices 0, 4, 8, etc. while a second of the four cores is assigned to compute a partial dot product for channels with indices 1, 5, 9, etc. The rearranged (second) assignment 2620 has the channels assigned to different cores in the set of 4 cores such that each core is assigned to compute partial dot products for sets of channels that are sufficiently sparse (have enough zero weight values arranged to be compatible with the partial dot product computation circuit). One of ordinary skill in the art will appreciate that different algorithms are used in different embodiments to generate the rearranged assignment of channels to cores and that rearranging channels does not affect subsequent layers because the sum over all the channels of a particular filter remains identical. In some embodiments, activations of previous layers are also rearranged in order to maintain the association between a channel and the input data it is applied to. For this reason, some embodiments, begin with a filter that appears at a latest layer of the machine-trained network and works backwards through the previous filters to maintain associations between the channels and their inputs.

FIG. 27 illustrates a first assignment 2710 of channels of a filter to partial dot product computation circuits of a core using a naïve distribution of channels among four cores (to distribute 64 channels of a 3×3 channel (filter slice) evenly across a number of cores), a first rearranged assignment 2720 of the same channels among the cores using a single partial dot product computation circuits. In some embodiments, the first assignment 2710 is rearranged such that the same cores are used, but at least one set of channels is split such that the set of channels is processed by two PDPCCs of the core. In some embodiments, the first assignment 2710 is rearranged such that the same cores and PDPCCs are used in each core, but time-multiplexing is used for at least one set of channels assigned to one PDPCC of a core.

The first assignment 2710 assigns a first set of 64 channels of a filter evenly (16 filters per computation circuit). The rearranged (second) assignment 2720 has exchanged some channels previously assigned to the first partial dot product computation circuit with channels previously assigned to the second partial dot product computation circuit. Additional default assignments of channels to partial dot product computation circuits have been left unchanged (this example assumes that there was a problem caused by channels 9-11 and that other sets of channels met the sparsity requirements). In some embodiments, at least one all zero (padding) channel is added to make the number of channels implemented by each partial dot product computation circuit the same (for example, by adding channels to filters for which filter splitting was employed such that an additional PDPCC is used on each core). In some embodiments adding a padding channel, the output of the padding channel is ignored. In some embodiments, adding an all-zero channel does not affect the output of the filter. In some embodiments, filters of previous layers of the machine-trained network are also rearranged to provide the correct input for the rearranged channels.

Once the channels have been rearranged (at 2540) or the filter-splitting or time-multiplexing has been implemented (at 2550) the process continues to 2560 to determine if there is another filter in the machine-trained network that has not been assessed for sparsity. If additional filters exist that have not been assessed, the process returns to 2510 to assess the next filter, otherwise the process ends.

Figure 28:
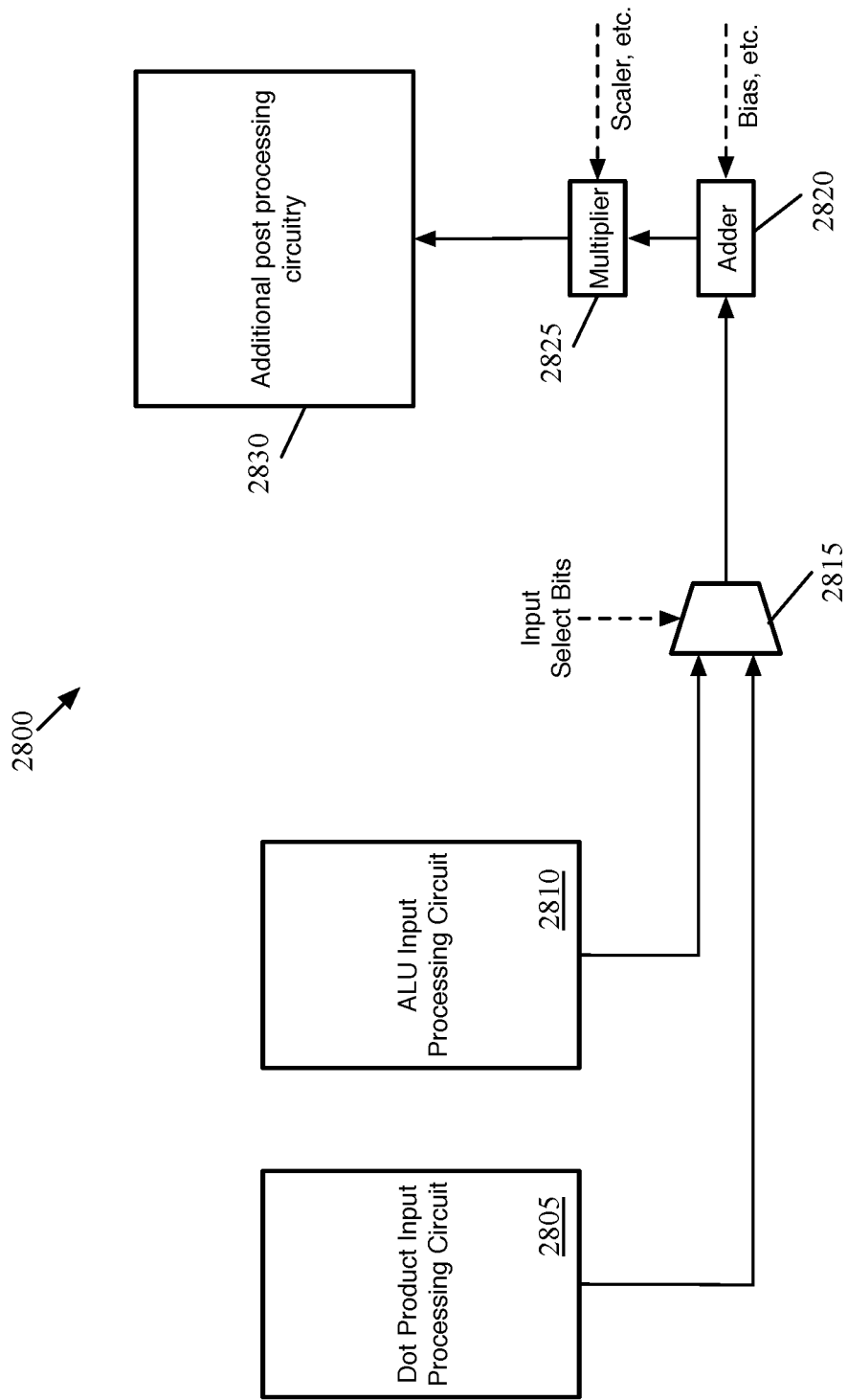
FIG. 28 conceptually illustrates the structure of a post-processing unit of some embodiments.

FIG. 28 conceptually illustrates the structure of a post-processing unit 2800 of some embodiments. As shown, the post-processing unit 2800 includes a dot product input processing circuit 2805, an ALU input processing circuit

2810, a multiplexer 2815 that selects between the outputs of these two circuits, and a set of post-processing operation circuits 2820-2830.

The dot product input processing circuit 2805 is used to combine dot products from two separate cycles if a dot product is too large to be computed in a single cycle across the cores of the computation fabric. In addition, if a particular filter slice needs to be split across multiple cores (because of too many non-zero weight values), the dot product input processing circuit is configured to account for that by using inputs from multiple dot product buses. Furthermore, some embodiments enable dot products to be double the size of the standard quantized output (e.g., 8-bit rather than 4-bit) by using dot products from multiple cycles and bit-shifting the first set of input data.

The ALU input processing circuit 2810 is used to perform operations for neural network nodes that do not use dot products (i.e., that are not part of convolutional or fully-connected layers). Neural network computation nodes that do not use dot products include, for example, pooling layers of convolutional networks (e.g., average pooling and max pooling layers) as well as nodes that perform element-wise operations. In some of these embodiments, the cores provide input values directly to the post-processing units without computing dot products, and the post-processing units are configured to perform the appropriate operations on these inputs.

The output of each of these circuits 2805 and 2810 is sent to a multiplexer 2815, and a set of configuration bits is used to select between these two possible inputs. This input value is sent to an adder 2820 and then to a multiplier 2825. For dot product outputs, the adder 2820 adds the bias of the linear function for the node and the multiplier 2825 multiplies this by the scaling factor for the linear function. The bias value sent to the adder 2820, in some embodiments, is a combination of (i) the bias value computed during the training of the neural network and (ii) a number of negative weight values. In some embodiments, the bias is adjusted to account for the all zero channel outputs. As described in more detail below and in U.S. patent application Ser. No. 16/120,387, filed Sep. 3, 2018 and now issued as U.S. Pat. No. 10,740,434, which is incorporated herein by reference, in some embodiments the weight values are ternary in each layer (i.e., either 0, a positive value, or a negation of that positive value). The partial dot product calculation in the cores treats these ternary weights as {0, 1, and −1}, and uses a ternary MAC circuit that performs one's complement addition to account for negative weights. The bias factor in the configuration data then accounts for the number of negative weights, to effectively turn the one's complement addition into two's complement addition. Furthermore, for larger input and output values (e.g., 8-bit input and output values), in which the dot product input processing circuit 2805 left shifts the dot product of the most significant bits of the inputs (e.g., by 4 bits), the bias factor has to add a larger amount for the negative weights. For the 8-bit case (in which the dot product of the weights with the most significant nibble of the inputs is shifted by 4 bits), the bias factor adds 17 for each negative weight. The value sent to the multiplier 2825, in some embodiments, is a combination of (i) the scaler value computed during the training of the neural network (which is often 1) and (ii) the positive value of the ternary weight (which was removed in order to scale the weight values used in the dot product to 1 and −1).

In some embodiments, a multiplexer is used to select between a bias value specific to the post-processing unit (i.e., allowing for different bias values for different computation nodes in a layer) and a bias value shared across all of the post-processing units in a layer. In general, convolution and fully-connected nodes will use a node-specific bias value (especially when accounting for the number of negative weights), but pooling and element-wise operator layers may use the same value for all of the nodes (often zero). For the scaling factor, a set of multiplexers is used in some embodiments to select between a node-specific scaling value and two possible shared scaling values. In some embodiments, pooling layers will use the same shared scaling value for each node (e.g., to divide by the number of nodes over which average pooling is performed), but at the end of a row will need a different scaling value to account for padding.

Additional post processing circuitry 2830 in some embodiments includes a right bit shift operator that ensures that, post-multiplication, the value has the desired precision (i.e., shifting the binary point), a truncator that performs a clipping operation in some embodiments to truncate the output value of the linear operator down to the desired number of bits, a LUT that implements the non-linear activation function. The functions of the components of the additional post processing circuitry is described in greater detail in U.S. patent application Ser. No. 16/355,653, filed Mar. 15, 2019, which is incorporated herein by reference.

The integrated circuit of some embodiments can be embedded into various different types of devices in order to perform different purposes (e.g., face recognition, object categorization, voice analysis, etc.). For each type of device, a network is trained, obeying the sparsity and/or ternary constraints, with the network parameters stored with the IC to be executed by the IC on the device. These devices can include mobile devices, desktop computers, Internet of Things (IOT devices), etc.

Figure 29:
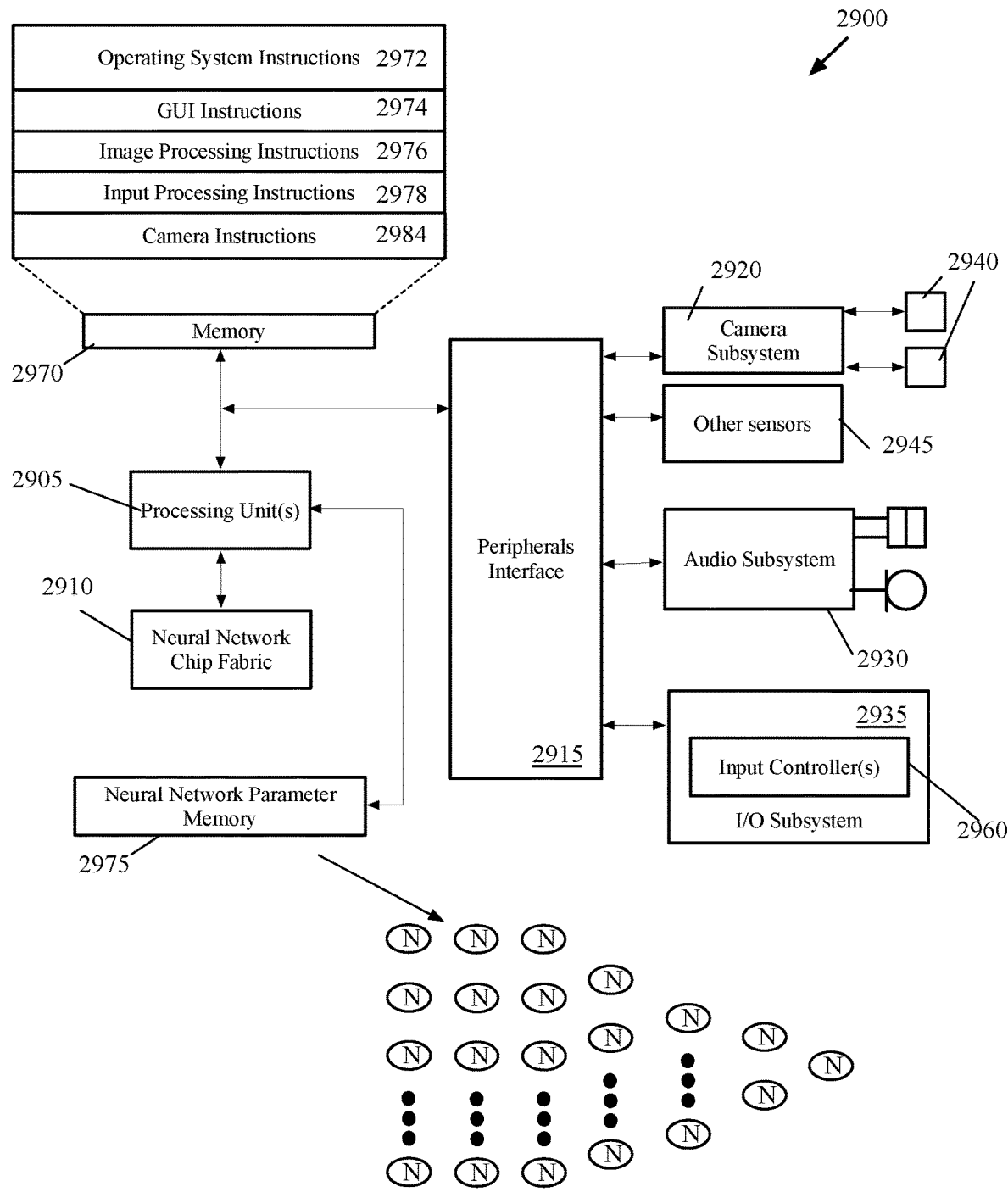
FIG. 29 is an example of an architecture of an electronic device that includes the neural network integrated circuit of some embodiments.

FIG. 29 is an example of an architecture 2900 of an electronic device that includes the neural network integrated circuit of some embodiments. The electronic device may be a mobile computing device such as a smartphone, tablet, laptop, etc., or may be another type of device (e.g., an IoT device, a personal home assistant). As shown, the device 2900 includes one or more general-purpose processing units 2905, a neural network chip fabric 2910, and a peripherals interface 2915.

The peripherals interface 2915 is coupled to various sensors and subsystems, including a camera subsystem 2920, an audio subsystem 2930, an I/O subsystem 2935, and other sensors 2945 (e.g., motion/acceleration sensors), etc. The peripherals interface 2915 enables communication between the processing units 2905 and various peripherals. For example, an orientation sensor (e.g., a gyroscope) and an acceleration sensor (e.g., an accelerometer) can be coupled to the peripherals interface 2915 to facilitate orientation and acceleration functions. The camera subsystem 2920 is coupled to one or more optical sensors 2940 (e.g., charged coupled device (CCD) optical sensors, complementary metal-oxide-semiconductor (CMOS) optical sensors, etc.). The camera subsystem 2920 and the optical sensors 2940 facilitate camera functions, such as image and/or video data capturing.

The audio subsystem 2930 couples with a speaker to output audio (e.g., to output voice navigation instructions). Additionally, the audio subsystem 2930 is coupled to a microphone to facilitate voice-enabled functions, such as voice recognition, digital recording, etc. The I/O subsystem 2935 involves the transfer between input/output peripheral devices, such as a display, a touch screen, etc., and the data bus of the processing units 2905 through the peripherals interface 2915. The I/O subsystem 2935 various input controllers 2960 to facilitate the transfer between input/output peripheral devices and the data bus of the processing units 2905. These input controllers 2960 couple to various input/control devices, such as one or more buttons, a touch-screen, etc.

In some embodiments, the device includes a wireless communication subsystem (not shown in FIG. 29) to establish wireless communication functions. In some embodiments, the wireless communication subsystem includes radio frequency receivers and transmitters and/or optical receivers and transmitters. These receivers and transmitters of some embodiments are implemented to operate over one or more communication networks such as a GSM network, a Wi-Fi network, a Bluetooth network, etc.

As illustrated in FIG. 29, a memory 2970 (or set of various physical storages) stores an operating system (OS) 2972. The OS 2972 includes instructions for handling basic system services and for performing hardware dependent tasks. The memory 2970 also stores various sets of instructions, including (1) graphical user interface instructions 2974 to facilitate graphic user interface processing; (2) image processing instructions 2976 to facilitate image-related processing and functions; (3) input processing instructions 2978 to facilitate input-related (e.g., touch input) processes and functions; and (4) camera instructions 2984 to facilitate camera-related processes and functions. The processing units 2910 execute the instructions stored in the memory 2970 in some embodiments.

The memory 2970 may represent multiple different storages available on the device 2900. In some embodiments, the memory 2970 includes volatile memory (e.g., high-speed random access memory), non-volatile memory (e.g., flash memory), a combination of volatile and non-volatile memory, and/or any other type of memory.

The instructions described above are merely exemplary and the memory 2970 includes additional and/or other instructions in some embodiments. For instance, the memory for a smartphone may include phone instructions to facilitate phone-related processes and functions. An IOT device, for instance, might have fewer types of stored instructions (and fewer subsystems), to perform its specific purpose and have the ability to receive a single type of input that is evaluated with its neural network.

The above-identified instructions need not be implemented as separate software programs or modules. Various other functions of the device can be implemented in hardware and/or in software, including in one or more signal processing and/or application specific integrated circuits.

In addition, a neural network parameter memory 2975 stores the weight values, bias parameters, etc. for implementing one or more machine-trained networks by the neural network chip fabric 2910. As mentioned above, different clusters of cores of the fabric 2910 can implement different machine-trained networks in parallel in some embodiments. In different embodiments, these neural network parameters are stored on-chip (i.e., in memory that is part of the neural network chip fabric 2910) or loaded onto the IC 2910 from the neural network parameter memory 2975 via the processing unit(s) 2905.

While the components illustrated in FIG. 29 are shown as separate components, one of ordinary skill in the art will recognize that two or more components may be integrated into one or more integrated circuits. In addition, two or more components may be coupled together by one or more communication buses or signal lines (e.g., a bus between the general-purpose processing units 2905 and the neural network IC 2910, which enables the processing units 2905 to provide inputs to the neural network IC 2910 and receive the outputs of the network from the IC 2910. Also, while many of the functions have been described as being performed by one component, one of ordinary skill in the art will realize that the functions described with respect to FIG. 29 may be split into two or more separate components.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 30:
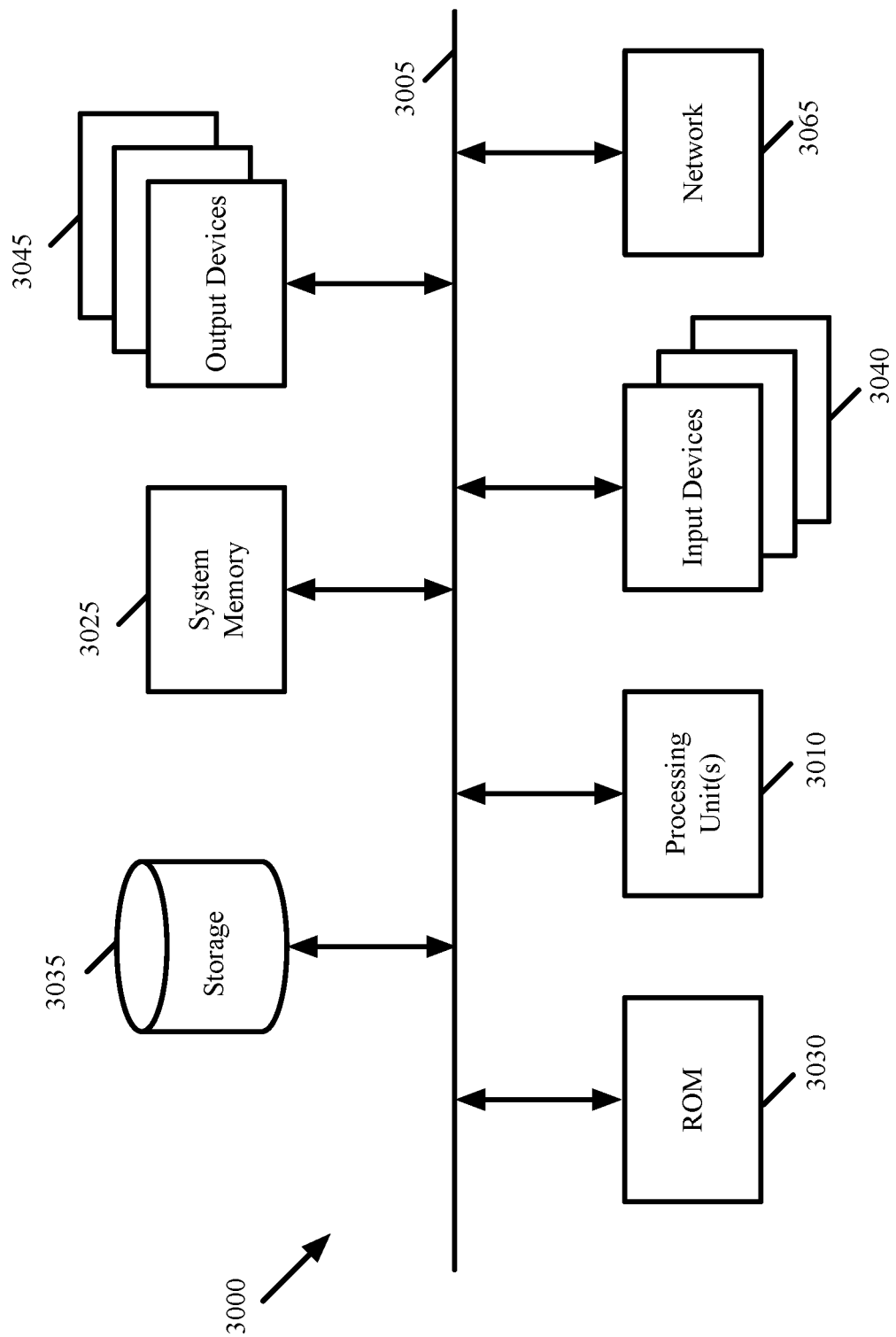
FIG. 30 conceptually illustrates an electronic system with which some embodiments of the invention are implemented.

FIG. 30 conceptually illustrates an electronic system 3000 with which some embodiments of the invention are implemented. The electronic system 3000 can be used to execute any of the control and/or compiler systems described above in some embodiments. The electronic system 3000 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 3000 includes a bus 3005, processing unit(s) 3010, a system memory 3025, a read-only memory 3030, a permanent storage device 3035, input devices 3040, and output devices 3045.

The bus 3005 collectively represents all system, peripheral, and chipset buses that communicatively connect the numerous internal devices of the electronic system 3000. For instance, the bus 3005 communicatively connects the processing unit(s) 3010 with the read-only memory 3030, the system memory 3025, and the permanent storage device 3035.

From these various memory units, the processing unit(s) 3010 retrieves instructions to execute and data to process in order to execute the processes of the invention. The processing unit(s) may be a single processor or a multi-core processor in different embodiments.

The read-only-memory (ROM) 3030 stores static data and instructions that are needed by the processing unit(s) 3010 and other modules of the electronic system. The permanent storage device 3035, on the other hand, is a read-and-write memory device. This device is a non-volatile memory unit that stores instructions and data even when the electronic system 3000 is off. Some embodiments of the invention use a mass-storage device (such as a magnetic or optical disk and its corresponding disk drive) as the permanent storage device 3035.

Other embodiments use a removable storage device (such as a floppy disk, flash drive, etc.) as the permanent storage device. Like the permanent storage device 3035, the system memory 3025 is a read-and-write memory device. However, unlike storage device 3035, the system memory is a volatile read-and-write memory, such a random-access memory. The system memory stores some of the instructions and data that the processor needs at runtime. In some embodiments, the invention's processes are stored in the system memory 3025, the permanent storage device 3035, and/or the read-only memory 3030. From these various memory units, the processing unit(s) 3010 retrieves instructions to execute and data to process in order to execute the processes of some embodiments.

The bus 3005 also connects to the input and output devices 3040 and 3045. The input devices enable the user to communicate information and select commands to the electronic system. The input devices 3040 include alphanumeric keyboards and pointing devices (also called "cursor control devices"). The output devices 3045 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 30, bus 3005 also couples electronic system 3000 to a network 3065 through a network adapter (not shown). In this manner, the computer can be a part of a network of computers (such as a local area network ("LAN"), a wide area network ("WAN"), or an Intranet, or a network of networks, such as the Internet. Any or all components of electronic system 3000 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra-density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, some of the figures (including FIGS. 10, 11, 19, 20, 22, and 25) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A method for generating neural network program instructions for a neural network inference circuit (NNIC) to execute a neural network, the NNIC comprising a plurality of clusters of circuits for performing neural network computations, the method comprising:
   receiving a specification of the neural network comprising a plurality of layers of computation nodes;
   based on the received neural network specification, generating a graph comprising one or more options for executing each layer of the neural network on the NNIC, each respective option for a respective layer representing the use of a respective set of the clusters of the NNIC to execute the respective layer, wherein the graph comprises at least two options for at least one layer of the neural network;
   identifying an optimized path through the graph that selects, for each layer of the neural network, one of the options to execute the layer of the neural network; and
   generating the program instructions for the NNIC to use to execute the neural network based on the identified optimized path.

2. The method of claim 1, wherein the at least two options for a particular layer of the neural network comprises a plurality of different options representing use of a same number of the clusters.

3. The method of claim 1, wherein the options for a particular layer comprises at least two options representing use of different numbers of the clusters.

4. The method of claim 1, wherein the graph is generated based on a set of rules for implementing neural networks using the NNIC and the options for a particular layer of the neural network excludes non-viable options for implementing the particular layer of the neural network using the NNIC.

5. The method of claim 4, wherein the options for the particular layer excludes at least one viable option for implementing the particular layer of the neural network using the NNIC.

6. The method of claim 5, wherein an excluded viable option for implementing the particular layer of the neural network represents the use of more clusters than are necessary to perform the processing for the particular layer of the neural network.

7. The method of claim 5, wherein an excluded viable option for implementing the particular layer of the neural network includes an option that represents the use of non-adjacent clusters of the NNIC.

8. The method of claim 1, wherein each cluster comprises one or more cores and each respective option for a respective layer further represents a respective number of cores of each cluster to use to execute the respective layer of the neural network.

9. The method of claim 8, wherein the number of cores of each cluster to use is the same for each cluster in each respective option for implementing the respective layer of the neural network.

10. The method of claim 9, wherein each core comprises corresponding pluralities of memory units for storing activations associated with layers of the neural network, wherein the program instructions include a specification of particular memory units to store input values associated with each layer of the neural network.

11. The method of claim 10, wherein, for each layer of the neural network, the program instructions specify a same set of memory units in each core to store the activations associated with each layer of the neural network.

12. The method of claim 1, wherein the optimized path through the graph is optimized for one of power, latency, memory use, and power at a particular latency.

13. The method of claim 1, wherein the optimized path through the graph is a first optimized path and the method further comprises identifying a set of at least one additional optimized path through the graph, wherein each optimized path corresponds to a particular set of aspects of the neural network execution that is being optimized.

14. The method of claim 13, wherein identifying an optimized path comprises generating and solving a mixed integer problem for optimizing a particular set of aspects of the neural network execution.

15. The method of claim 1, wherein each cluster comprises a set of cores for computing partial dot products associated with convolutional layers of the neural network.

16. The method of claim 15, wherein each core comprises a set of memory units storing (1) weight values for each layer implemented by the core and, while executing a particular layer of the neural network, (2) input values associated with the particular layer of the neural network.

17. The method of claim 16, wherein each core further comprises a set of partial dot product computation circuits (PDPCCs) that compute dot products between weight values and input values of each layer of the neural network that the core implements.

18. The method of claim 1, wherein different sets of clusters are identified to execute the adjacent layers of the neural network.

19. The method of claim 4, wherein an option representing the use of a particular set of clusters of the NNIC for implementing a particular layer of the neural network is non-viable when there are too many non-zero weights in at least one set of filter channels in the particular layer that are assigned to a partial dot product computation circuit (PDPCC) of a particular core in the particular set of clusters for processing.

20. The method of claim 4, wherein an option representing the use of a particular set of clusters of the NNIC for implementing a particular layer of the neural network is non-viable when there are too many dot-product terms in the particular layer to process using partial dot product computation circuits (PDPCCs) in the particular set of clusters.

* * * * *